(12) United States Patent
Kajigaya et al.

(10) Patent No.: US 8,638,630 B2
(45) Date of Patent: Jan. 28, 2014

(54) SEMICONDUCTOR DEVICE HAVING HIERARCHICAL BIT LINE STRUCTURE

(75) Inventors: Kazuhiko Kajigaya, Tokyo (JP); Yasutoshi Yamada, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 0 days.

(21) Appl. No.: 13/620,840

(22) Filed: Sep. 15, 2012

(65) Prior Publication Data

US 2013/0107650 A1    May 2, 2013

Related U.S. Application Data

(63) Continuation of application No. 13/299,285, filed on Nov. 17, 2011.

(30) Foreign Application Priority Data

Nov. 2, 2011 (JP) ................................. 2011-241729

(51) Int. Cl.
    *G11C 7/00* (2006.01)

(52) U.S. Cl.
    USPC .................. 365/222; 365/185.13; 365/185.21

(58) Field of Classification Search
    USPC ..................... 365/149, 203, 189.15, 205, 207
    See application file for complete search history.

(56) References Cited

U.S. PATENT DOCUMENTS

| | | | |
|---|---|---|---|
| 4,943,960 A | 7/1990 | Komatsu et al. | |
| 5,361,233 A | 11/1994 | Kotani | |
| 5,822,264 A | 10/1998 | Tomishima et al. | |
| 6,757,784 B2 | 6/2004 | Lu et al. | |
| 6,898,663 B2 | 5/2005 | Winograd et al. | |
| 7,136,317 B1 | 11/2006 | Hanson et al. | |
| 7,289,369 B2 | 10/2007 | Matick et al. | |
| 2004/0085835 A1* | 5/2004 | Ahn et al. | 365/200 |
| 2009/0103352 A1* | 4/2009 | Kim | 365/149 |
| 2009/0251948 A1* | 10/2009 | Kajigaya et al. | 365/149 |
| 2010/0054066 A1* | 3/2010 | Kajigaya et al. | 365/207 |
| 2010/0061170 A1 | 3/2010 | Kajigaya | |
| 2010/0232213 A1* | 9/2010 | Hwang et al. | 365/149 |
| 2011/0205820 A1* | 8/2011 | Takayama et al. | 365/200 |
| 2012/0275255 A1* | 11/2012 | Yoshida et al. | 365/203 |

FOREIGN PATENT DOCUMENTS

| | | |
|---|---|---|
| JP | 1-096895 A | 4/1989 |
| JP | 4-030385 A | 2/1992 |
| JP | 7-235180 A | 9/1995 |
| JP | 2010-055730 A | 3/2010 |

OTHER PUBLICATIONS

T. Mano, et al., "Circuit Technologies for 16Mb DRAMs," ISSCC Dig. Of Tech. Papers,. pp. 22-23, Feb. 1987.

* cited by examiner

*Primary Examiner* — Son Dinh
*Assistant Examiner* — Uyen B Tran
(74) *Attorney, Agent, or Firm* — McGinn IP Law Group, PLLC

(57) ABSTRACT

A device includes a plurality of restoring circuits each provided for an associated one of local bit lines, remaining one or ones of the restoring circuits other than the restoring circuit provided for the selected one of the local bit lines being configured to receive, through remaining one or ones of the local bit lines, data that is or are read out from a memory cell or cells connected to the remaining one or ones of the local bit lines, and restore, through the remaining one or ones of the local bit lines, the data into the memory cell or cells connected to the remaining one or ones of the local bit lines.

18 Claims, 50 Drawing Sheets

SEMICONDUCTOR DEVICE HAVING HIERARCHICAL BIT LINE STRUCTURE

The present application is a Continuation application of U.S. patent application Ser. No. 13/299,285, filed on Nov. 17, 2011, which is based on and claims priority from Japanese patent application No. 2011-241729, filed on Nov. 2, 2011, the entire contents of which is incorporated herein by reference.

BACKGROUND OF THE INVENTION

1. Field of the Invention

The present invention relates to a semiconductor device comprising a memory cell array having a hierarchical bit line structure.

2. Description of Related Art

In recent years, miniaturization of semiconductor memory devices such as DRAM has been achieved, and thus semiconductor devices comprising a memory cell array in which bit lines and sense amplifiers are hierarchized have been proposed (for example, see Patent References 1 to 4 and Non-Patent Reference 1). For example, FIG. 3 of Patent Reference 1 shows a DRAM including a local bit line LBL, a global bit line GBL, a local sense amplifier 10 and a global sense amplifier 11. In the configuration of Patent Reference 1, data stored in a 1T1C type memory cell MC is read out to the local bit line LBL and is transmitted from the local bit line LBL to a node Ns via a charge transfer gate Q1. In a read operation, a signal voltage of the node Ns is amplified by a transistor Q3 and thereafter is transmitted through the global bit line GBL and amplified by the global sense amplifier 11. In contrast, in a refresh operation of the DRAM, after the signal is transmitted along the same path, the signal latched in the global sense amplifier 11 is transmitted through the global bit line GBL and the local bit line LBL, and data is restored into the memory cell MC.

[Patent Reference 1] Japanese Patent Application Laid-open No. 2010-055730 (U.S. Pub. No. 2010/0061170 A1)

[Patent Reference 2] Japanese Patent Application Laid-open No. H1-96895

[Patent Reference 3] Japanese Patent Application Laid-open No. H4-30385 (U.S. Pat. No. 5,361,233)

[Patent Reference 4] Japanese Patent Application Laid-open No. H7-235180

[Non-Patent Reference 1] T. Mano, et al., "Circuit Technologies for 16 Mb DRAMs," ISSCC Dig. of Tech. Papers, PP. 22-23, February 1987.

In general, charge/discharge currents of bit lines and currents flowing in circuits in the memory cell array provide a large ratio of consumption current in the refresh operation. Then, in the conventional hierarchical memory cell array, the paths for restoring the data includes both the local bit line and the global bit line, as described above, and thus a non-negligible amount of current is required for the charge/discharge currents and for operations of sense amplifiers. With miniaturization in process and large capacity of the memory cell array in recent days, when it is required to shorten a refresh cycle in the refresh operation and to increase the number of word lines being simultaneously selected, particularly, there arises a serious problem of an increase in the consumption current in the refresh operation.

Further, the semiconductor device with the hierarchical bit line structure is normally configured so that the wiring pitch of the local bit lines is equal to that of the global bit lines. In this regard, conventionally a configuration has been known in which the wiring pitch of the global bit lines is broadened compared with that of the local bit lines. For example, Patent References 2, 3 and Non-Patent Reference 1 disclose techniques capable of restoring data stored in the memory cell through the local bit line in a state of not being connected to the global sense amplifier by providing a local sense amplifier having a restoring function. By applying such techniques, it is possible to broaden the wiring pitch of the global bit lines and to reduce the number of global sense amplifiers. However, according to the techniques, since the local sense amplifiers are configured using latch type differential amplifiers, an increase in chip area due to the area occupied by the local sense amplifiers is inevitable. As a measure against this problem, Patent Reference 4 discloses a technique employing a configuration in which a pair of local sense amplifiers composed of only NMOS transistors can be selectively connected to a plurality of local bit lines so that the occupied area and the number or the local sense amplifiers can be reduced. However, in this configuration, when the data stored in the memory cell is read out to the local bit line, the restoring operation is not performed for local bit lines that are not connected to the global sense amplifier via the local sense amplifiers, and there arises a problem that the data of the memory cell is destructed.

SUMMARY

A semiconductor device according to an embodiment of the disclosure comprises: a plurality of local bit lines, at least one word line, a plurality of memory cells each connected to an associated one of the local bit lines and the word line, at least one global bit line, a plurality of switch transistors, a selected one of the switch transistors being turned ON to form an electrical path between the global bit line and a selected one of the local bit lines, a global sense amplifier coupled to the global bit line, the global sense amplifier being configured to receive, through the global bit line, data that is read out from the memory cell connected to the selected one of the local bit lines, and restore, through the global bit line, the data into the memory cell connected to the selected one of the local bit lines, and a plurality of restoring circuits each provided for an associated one of the local bit lines, remaining one or ones of the restoring circuits other than the restoring circuit provided for the selected one of the local bit lines being configured to receive, through remaining one or ones of the local bit lines, data that is or are read out from the memory cell or cells connected to the remaining one or ones of the local bit lines, and restore, through the remaining one or ones of the local bit lines, the data into the memory cell or cells connected to the remaining one or ones of the local bit lines.

According to another embodiment of the disclosure, a device is provided comprising: a plurality of local bit lines, a plurality of local sense amplifiers each electrically coupled to an associated one of the local bit lines, a plurality of word lines, a plurality of memory cells each connected to a corresponding one of the word lines and a corresponding one of the local bit lines, at least one global bit line, a global sense amplifier electrically coupled to the global bit line, and an access circuit configured to activate one of the word lines to select the memory cells that are connected to an activated one of the word lines, selected memory cells thereby outputting data stored therein onto the local bit lines, respectively, the access circuit being further configured to assign one of the local sense amplifiers to a designated local sense amplifier, each of the local sense amplifiers being configured to sense the data outputted onto an associated one of the local bit lines from an associated one of the selected memory cells, the designated local sense amplifier being further configured to convey the data to the global sense amplifier through the global bit line, the global sense amplifier being configured in a data read mode to sense the data conveyed from the designated local sense amplifier and restore the data into one of the selected memory cells through the designated sense amplifier, and remaining one or ones of the local sense amplifiers other than the designated local sense amplifier being further configured to restore the data into remaining one or ones of the selected memory cells that are connected to the local bit line or lines belonging to the remaining one or ones of the local sense amplifiers while being electrically disconnected from the global bit line.

According to another embodiment, a device comprises: a plurality of local bit lines, a plurality of local sense amplifiers each electrically coupled to an associated one of the local bit lines, each of the local sense amplifier including a restoring circuit, a plurality of word lines, a plurality of memory cells each connected to a corresponding one of the word lines and a corresponding one of the local bit lines, at least one global bit line, and a global sense amplifier electrically coupled to the global bit line, and a control circuit configured to, in a data read mode, designate one of the local sense amplifier with deactivating the restoring circuit in the one of the local sense amplifiers and to allow the global sense amplifier to restore data into one of the memory cells belonging to the one of the local sense amplifiers, the control circuit being further configured to, in the data read mode, activate the restoring circuit in each of remaining ones of the local sense amplifiers so that ones of the memory cells belonging to each of the remaining ones of the local sense amplifiers is restored with data by the remaining ones of the local sense amplifiers.

BRIEF DESCRIPTION OF THE DRAWINGS

The above featured and advantages of the present invention will be more apparent from the following description of certain preferred embodiments taken in conjunction with the accompanying drawings, in which.

DETAILED DESCRIPTION OF THE PREFERRED EMBODIMENTS

It is apparent that the present invention is not limited to embodiments described below, but should be construed based on the disclosure of the claims.

Figure 1:
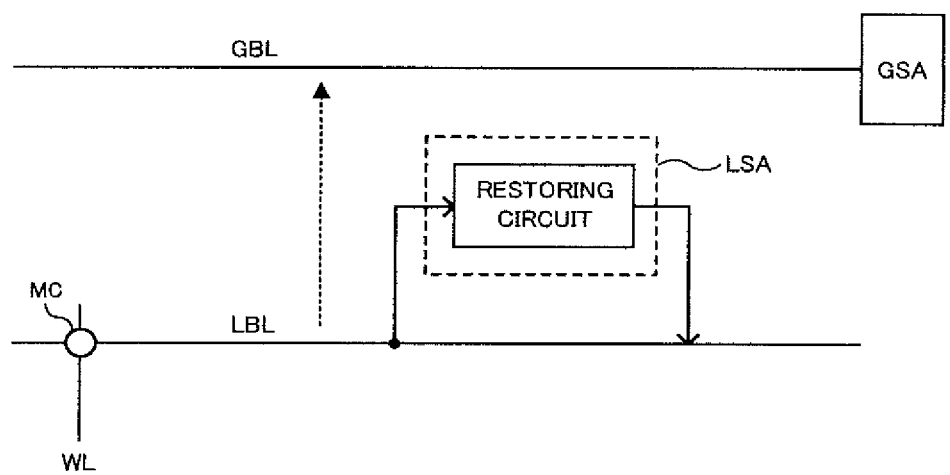
FIG. 1 is a diagram showing an embodiment of the invention.

FIG. 1 shows an embodiment indicative of a semiconductor device that comprises a memory cell array with a hierarchical bit line structure, in which there are provided a local bit line LBL connected to a memory cell MC of a destructive readout type, a global bit line GBL of an upper hierarchy corresponding to the local bit line LBL, a local bit line control circuit LSA coupled between the local bit line LBL and the global bit line GBL, and a global sense amplifier GSA connected to one end of the global bit line GBL. The bit line control circuit LSA includes a restoring circuit that is activated in an auto-refresh mode and/or a self-refresh mode responsive to an auto-refresh command and/or a self-refresh command to refresh the data of the memory cell. In the configuration of FIG. 1, when it is performed to restore data back to the memory cell MC in response to the auto-refresh mode and/or the self-refresh mode, the local bit line LBL is controlled to be in a state of not being connected to the global bit line GBL. In this state, further, the restoring circuit amplifies a signal voltage related data read out of the memory cell MC while being in electrical isolation from the global bit line, and the signal outputted from the restoring circuit is then transmitted to the local bit line LBL again, so that the restoring operation as a refresh operation for the memory cell MC is completed. Thereby, in the memory cell array with the hierarchical bit line structure, it is possible to perform the restoring operation for the memory cells MC without using the global bit lines GBL and the global sense amplifiers GSA, and it is possible to obtain a large effect of reducing the consumption current required in refresh operations. On the other hand, the bit line control circuit LSA makes a signal path between the local bit line LBL and the global bit line GBL in data read and write operation modes to transfer data read out from the memory cell MC to the global bit line GBL and the global sense amplifier GSA and to write data supplied from the global bit line GBL into the memory cell MC. It should be noted that the restoring operation of the data back into the memory cell MC, which is performed in response to the data read mode (data read command), is carried out by the global sense amplifier GSA through the global bit line GBL.

Although further embodiments will be described in the followings, if a kind of symbol representing a structural element or a signal is repeatedly used, the symbol may be post-fixed with a number for the distinction (for example, bit lines BL0, BL1), and if the distinction is not necessary, the post-fixed number may be omitted (for example, bit line BL).

Figure 2:
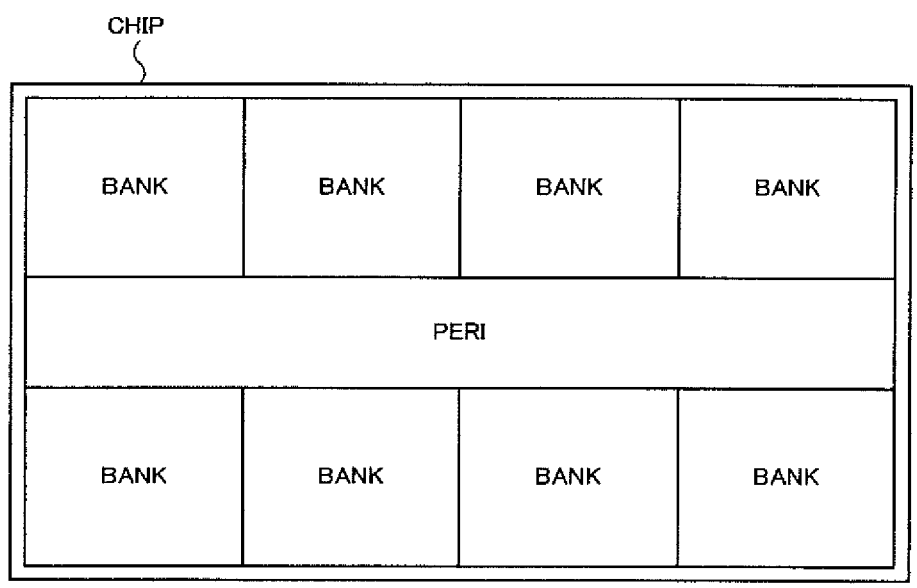
FIG. 2 is a diagram showing an entire configuration of a DRAM chip as a semiconductor device of an embodiment.

Referring to FIG. 2, an entire chip CHIP forming the semiconductor device according to an embodiment is partitioned into a plurality of memory banks BANK, and a peripheral circuit region PERI including a control circuit and an input/output circuit. Each memory bank BANK includes a large number of memory cells storing data, which will be described in detail later. The control circuit in the peripheral circuit region PERI performs various controls based on a clock, an address and control signals that are inputted from outside the chip CHIP, which includes determining an operation mode, predecoding the address, and the like. The input/output circuit in the peripheral circuit region PERI includes an input/output buffer storing write/read data inputted/outputted from/to outside the chip CHIP.

Figure 3:
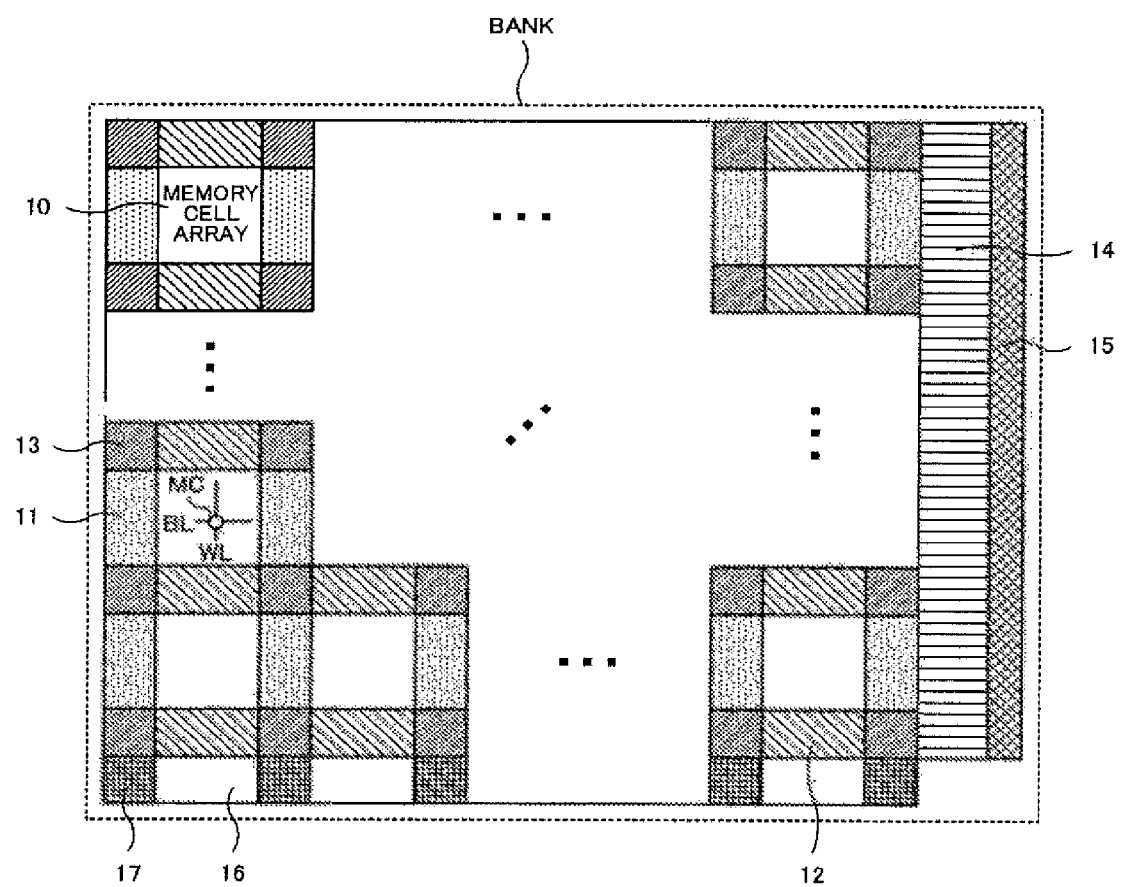
FIG. 3 is a block diagram showing a configuration of each memory bank BANK of FIG. 2.

FIG. 3 is a block diagram showing a configuration of each memory bank BANK of FIG. 2. A plurality of memory cell arrays 10 are arranged in a matrix form in the memory bank BANK shown in FIG. 3. Each memory cell array 10 includes a plurality of memory cells MC arranged at intersections of a plurality of bit lines BL and a plurality of word lines WL. As described later, the bit lines BL are hierarchized into global bit lines GBL of an upper hierarchy and local bit lines LBL of a lower hierarchy.

On the periphery of each memory cell array 10, a sense amplifier array 11 including a plurality of global sense amplifiers is arranged at an end in a bit line extending direction, and a sub-word driver array 12 including a plurality of sub-word drivers is arranged at an end in a word line extending direction. Further, a cross area 13 is arranged in a circuit area at which the sub-word driver array 12 and the sense amplifier array 11 intersect each other. Further, in an area near the circumference of the memory bank BANK, a Y decoder 14 and a main amplifier array 15 are arranged at an end in the bit line extending direction, and an X decoder 16 and an array control circuit 17 are arranged at an end in the word line extending direction.

Figure 4:
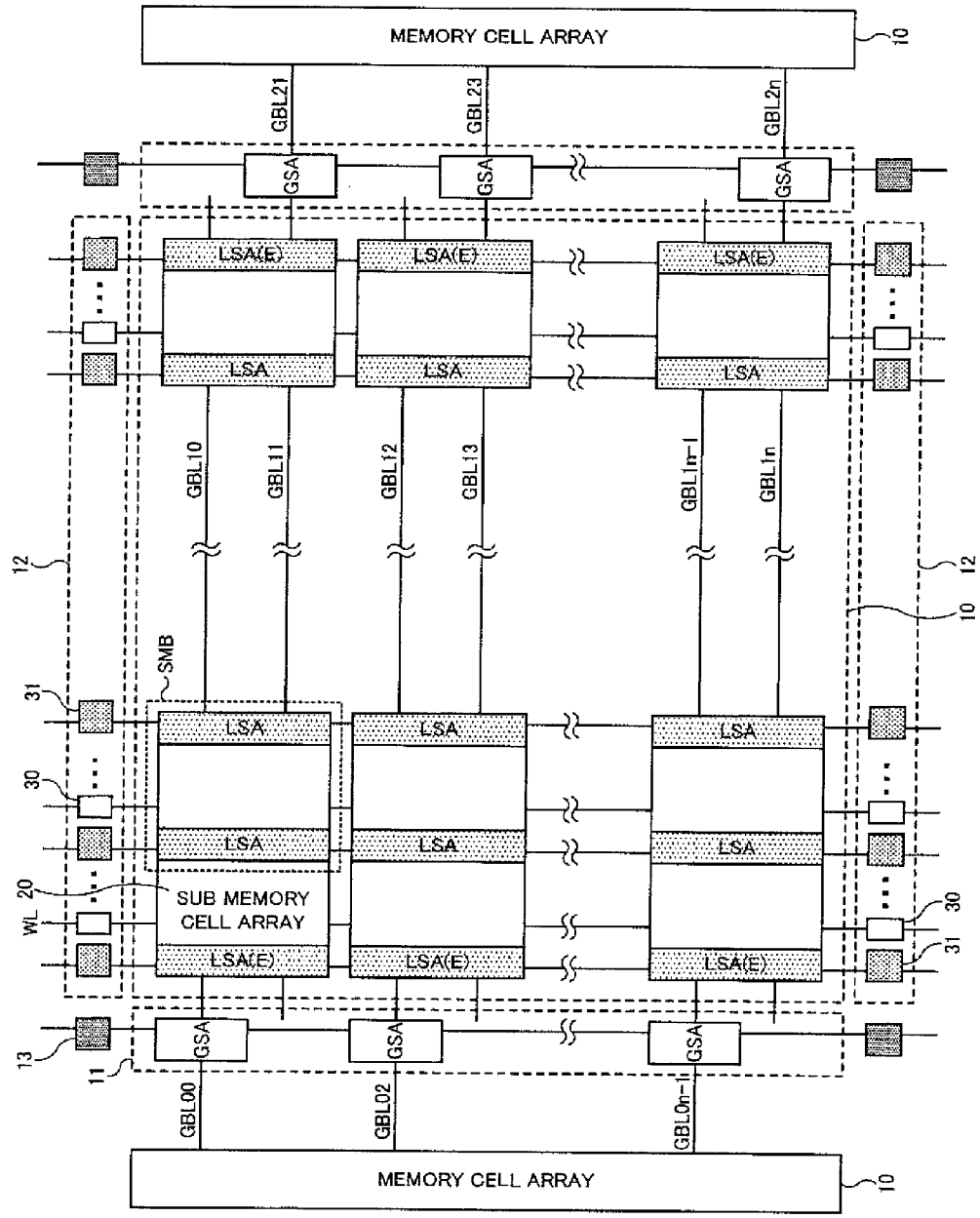
FIG. 4 is a diagram showing a configuration of the memory cell array 10 and its peripheral circuit in FIG. 3.

FIG. 4 shows a configuration of the memory cell array 10 and its peripheral circuit in FIG. 3. That is, as described in FIG. 3, FIG. 4 shows a configuration within a range of one memory cell array 10, two adjacent sense amplifier arrays 11 on left and right sides, and two adjacent sub-word driver arrays 12 on upper and lower sides. The memory cell array 10 including a plurality of global bit lines GBL is divided into a plurality of sub memory cell arrays 20 each as a unit area, and each sub memory cell array 20 includes a plurality of memory cells MC within a range partitioned by the two adjacent global bit lines GBL and a predetermined number of word lines WL. Bit line control circuits LSA are arranged on both sides of the sub memory cell array 20. Here, bit line control circuits LSA located at both ends of the memory cell array 10 are represented as "LSA (E)". As shown in FIG. 4, one sub memory cell array 20 and bit line control circuits LSA arranged on both sides thereof form a sub memory block SMB.

The sense amplifier array 11 is shared by two memory cell arrays 10 on the left and right. That is, two global bit lines GBL adjacent to each other are alternately connected to the global sense amplifier GSA in the memory cell array 10 on the left and the global sense amplifier GSA in the memory cell array 10 on the right. The sub-word driver array 12 is shared by two memory cell arrays 10 on the upper and lower. The sub-word driver array 12 includes a plurality of sub-word drivers 30 selectively driving a plurality of word lines WL, and a local sense amplifier control circuit 31 controlling operations of the local sense amplifier arrays 11.

Figure 5:
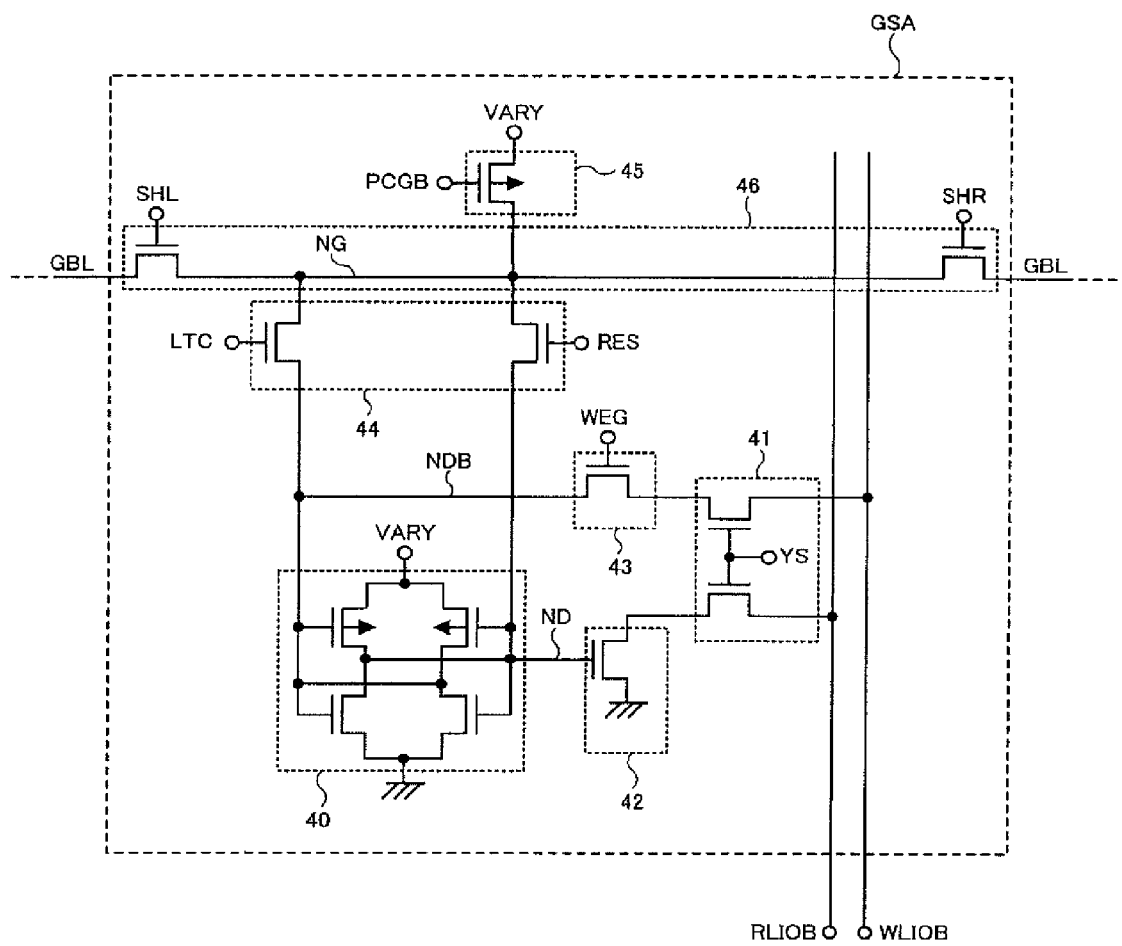
FIG. 5 is a diagram showing a circuit configuration example of a global sense amplifier GSA included in a sense amplifier array 11 of FIG. 5.

FIG. 5 shows a circuit configuration example of the global sense amplifier GSA included in the sense amplifier array 11. As shown in FIG. 5, the global sense amplifier GSA includes a cross-coupled amplifier 40, an I/O switch 41, an I/O pull-down circuit 42, a write switch 43, a data latch switch 44, a precharge circuit 45, and a GBL select circuit 46. Further, a pair of global bit lines GBL, a local I/O line RLIOB for reading, and a local I/O line WLIOB for writing are connected to the global sense amplifier GSA. In FIG. 5, the cross-coupled amplifier 40 is composed of two NMOS transistors having sources connected to a ground potential VSS and two PMOS transistors having sources connected to an array voltage VARY, and has a function of determining a binary value of a read signal transmitted to a node NDB through the global bit line GBL in a read operation so as to latch the signal.

The I/O switch 41 is composed of two NMOS transistors switched by a selection signal YS, the selection signal YS is set to HIGH in the read operation so that the NMOS transistors turn on, and thereby read data transmitted from the global bit line GBL is outputted to the local I/O line RLIOB. Meanwhile, the selection signal YS is set to HIGH in a write operation so that the NMOS transistors turn on, and write data is inputted from the local I/O line WLIOB to the global sense amplifier GSA. The I/O pull-down circuit 42 is composed of one NNOS transistor having a gate coupled to a node ND, the node ND changes to HIGH in reading high-level data, and extracts electric charge of the local I/O line RLIOB when the selection signal YS is at HIGH. Further, the node ND changes to LOW in reading low-level data so that the NMOS transistor of the I/O pull-down circuit 42 remains off, and therefore the electric charge of the local I/O line RLIOB is not extracted. The write switch 43 is composed of one NNOS transistor switched by a write enable signal WEG and the write enable signal WEG is set to HIGH in the write operation so that the write data is transmitted to the node NDB. Here, in operations other than the write operation, the NMOS transistor of the write switch 43 remains off since the write enable signal WEG is set to LOW.

The data latch switch 44 is composed of one NNOS transistor controlling a connection between a node NG and the node NDB in response to a latch signal LTC and one NNOS transistor controlling a connection between the nodes NG and ND in response to a restoration signal RES. In the read operation, the latch signal LTC is set to HIGH, and the signal transmitted through the global bit line GBL is further transmitted to the cross-coupled amplifier 40. At this point, the restoration signal RES is maintained at LOW, the nodes NG and ND are in a state of being disconnected from each other. In a restoring operation, the latch signal LTC is set to LOW and the nodes NG and NDB are in a state of being disconnected from each other, and in contrast the restoration signal RES is set to HIGH and the data latched in the cross-coupled amplifier 40 is transmitted from the node ND to the global bit line GBL so as to restore the data into the memory cell MC.

The precharge circuit 45 is composed of one PMOS transistor switched by a precharge signal PCGB In a standby state, the precharge signal PCGB is set to LOW, and the global bit line GBL is precharged to the array voltage VARY via the PMOS transistor. The GBL select circuit 46 is composed of one NNOS transistor controlling a connection between the global bit line GBL of one memory cell array 10 and the node NG in response to a GBL select signal SHL, and one NNOS transistor controlling a connection between the global bit line GBL of the other memory cell array 10 and the node NG in response to a GBL select signal SHR. By setting either of the GBL select signals SHL and SHR to LOW, it is possible to selectively connect the global bit line GBL and the global sense amplifier GSA so as to transmit the data.

Figure 6:
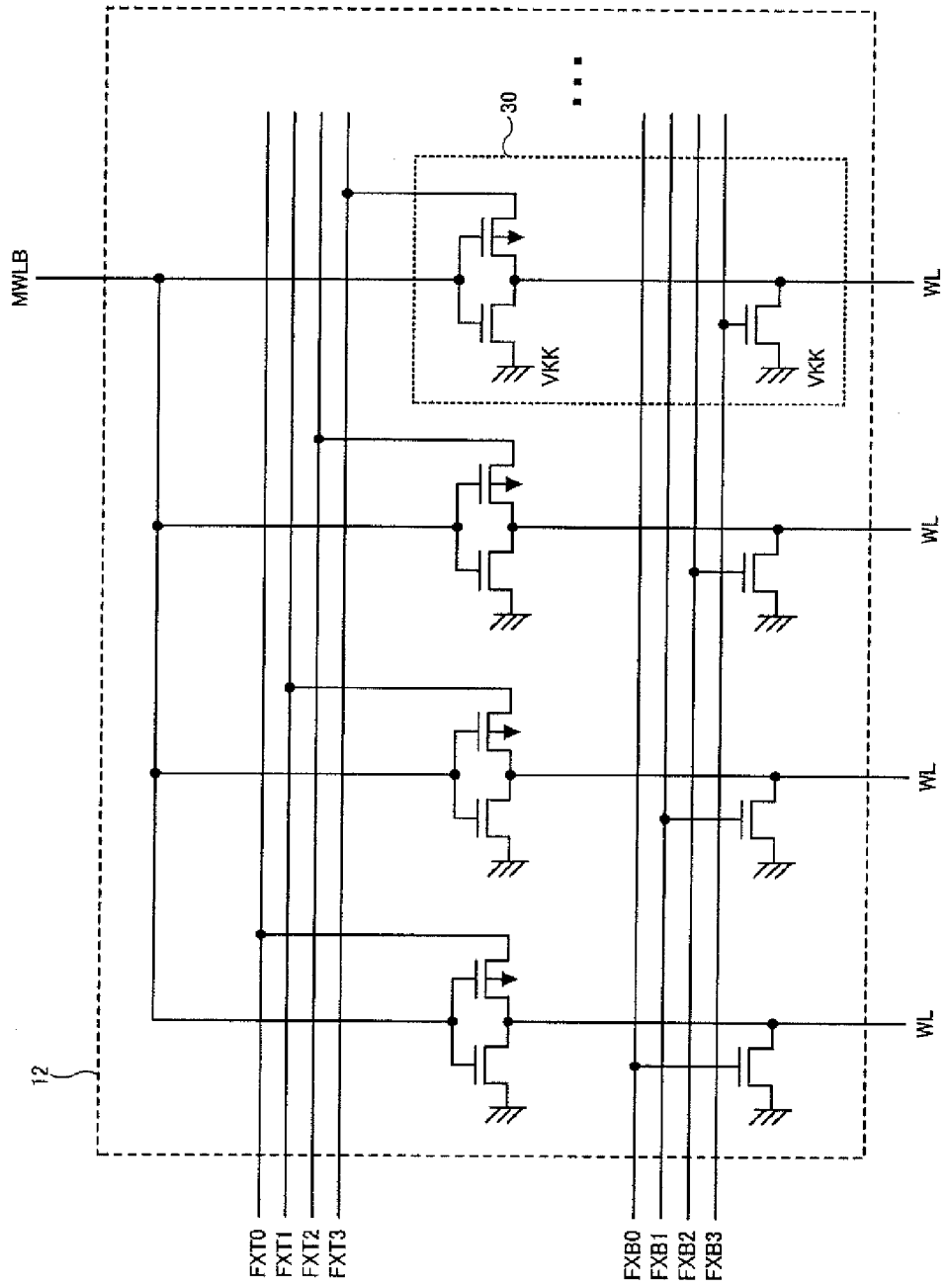
FIG. 6 is a diagram showing an example of a partial circuit configuration of a sub-word driver array 12 of FIG. 4.

FIG. 6 shows an example of a partial circuit configuration of the sub-word driver array 12. As described above, the sub-word driver array 12 includes a plurality of sub-word drivers 30 driving the word lines WL of an adjacent memory cell array 10. In this case, since the word lines WL of the memory cell array 10 are driven by sub-word drivers 30 included in one of two adjacent sub-word driver arrays 12 on upper and lower sides, the number of sub-word drivers 30 may be half the number of word lines WL included in the memory cell array 10.

As shown in FIG. 6, each sub-word driver 30 is composed of one PMOS transistor and two NMOS transistors. The sub-word driver 30' is activated by a combination of four sub-word select lines FXT0 to FXT3 and four inverted sub-word select lines FXB0 to FXB3 when an inverted main word line MWLB is activated, and drives one of a plurality of word lines WL.

Figure 7:
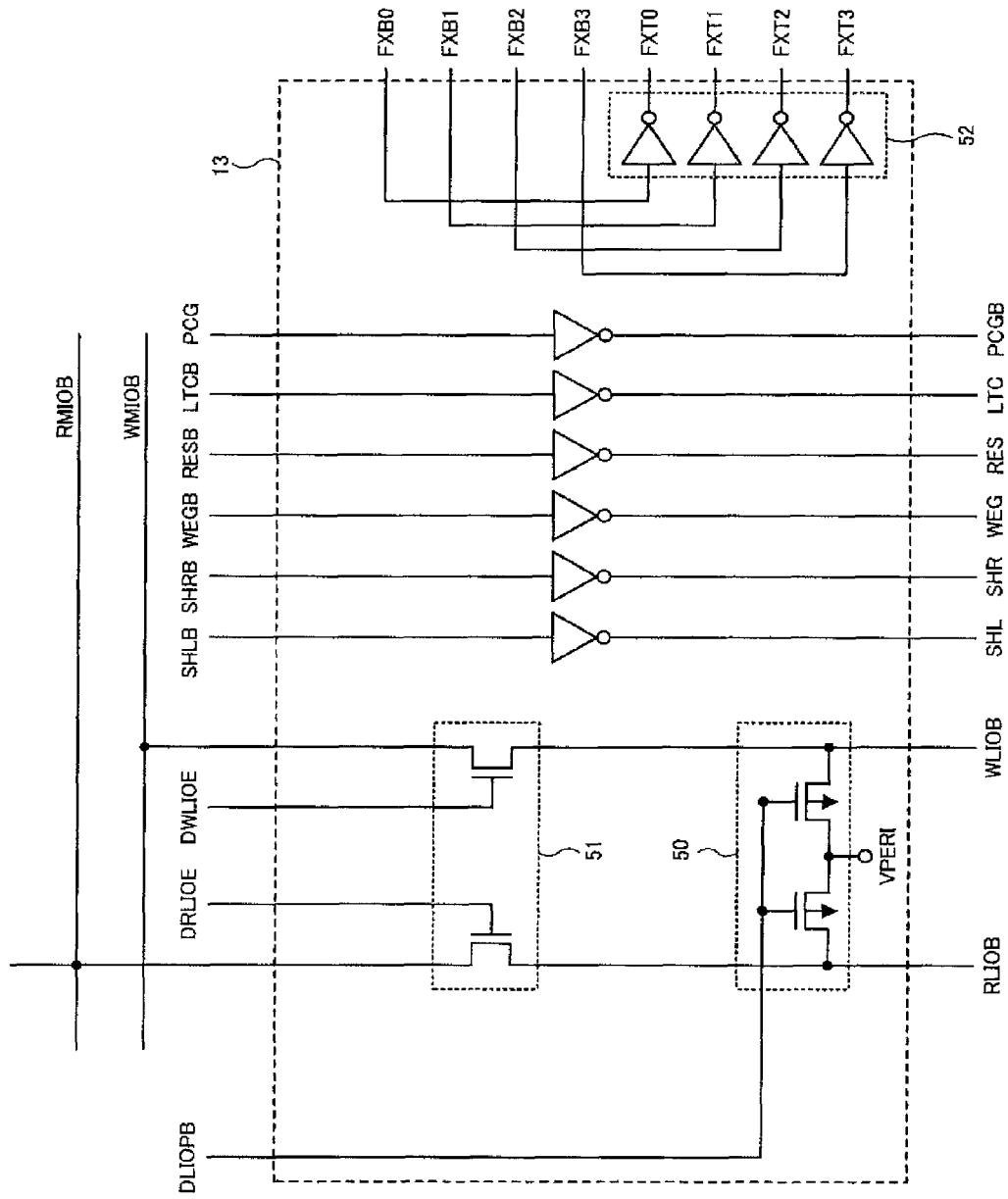
FIG. 7 is a diagram showing a circuit configuration example of a cross area 13 of FIG. 4.

FIG. 7 shows an example of a circuit configuration example of the cross area 13 of FIG. 4. As shown in FIG. 7, the cross area 13 includes a precharge circuit 50, an I/O connection circuit 51, a sub-word selecting driver 52, and other drivers. The precharge circuit 50 is composed of two PMOS transistors and precharges a pair of local I/O lines RLIOB and WLIOB (see FIG. 5). A control signal DLIOPB is set to LOW in the standby state, and the precharge circuit 50 precharges the pair of local I/O lines RLIOB and WLIOB to a voltage VPERI.

The I/O connection circuit 51 is composed of a pair of NMOS transistors controlling a connection between the pair of local I/O lines RLIOB, WLIOB and a pair of main I/O lines RMIOB, WMIOB in response to I/O line enable signals DRLIOE and DWLIOE. The I/O line enable signal DRLIOE is set to HIGH in the read operation so that the local I/O line RLIOB and the main I/O line RMIOB are connected to each other, and the I/O line enable signal DWLIOE is set to HIGH in the write operation so that the local I/O line WLIOB and the main I/O line WMIOB are connected to each other.

The sub-word selecting driver 52 is composed of four inverters inverting the inverted sub-word select lines FXB0 to FXB3 (see FIG. 6) to generate the sub-word select lines FXT0 to FXT3 (see FIG. 6). Further, other drivers include a plurality of inverters outputting the control signals (SHL, SHR, WEG, RES, LTC and PCGB) that are supplied to the global sense amplifier GSA (see FIG. 5), and the respective inverters receive inverted signals (postfixed with "B" except PCC) of the control signals.

In addition, the local sense amplifier control circuit 31 included in the sub-word driver array 12 of FIG. 4 is a circuit that generates control signals (PCL, WTL, RFL, CTL, RT, ST, CTR, RFR, WTR and PCR) being supplied to each bit line control circuits LSA. Further, the array control circuit 17 of FIG. 3 is a circuit that generates various signals required to control the global sense amplifiers GSA, the bit line control circuits LSA, and the respective I/O lines.

Figure 8:
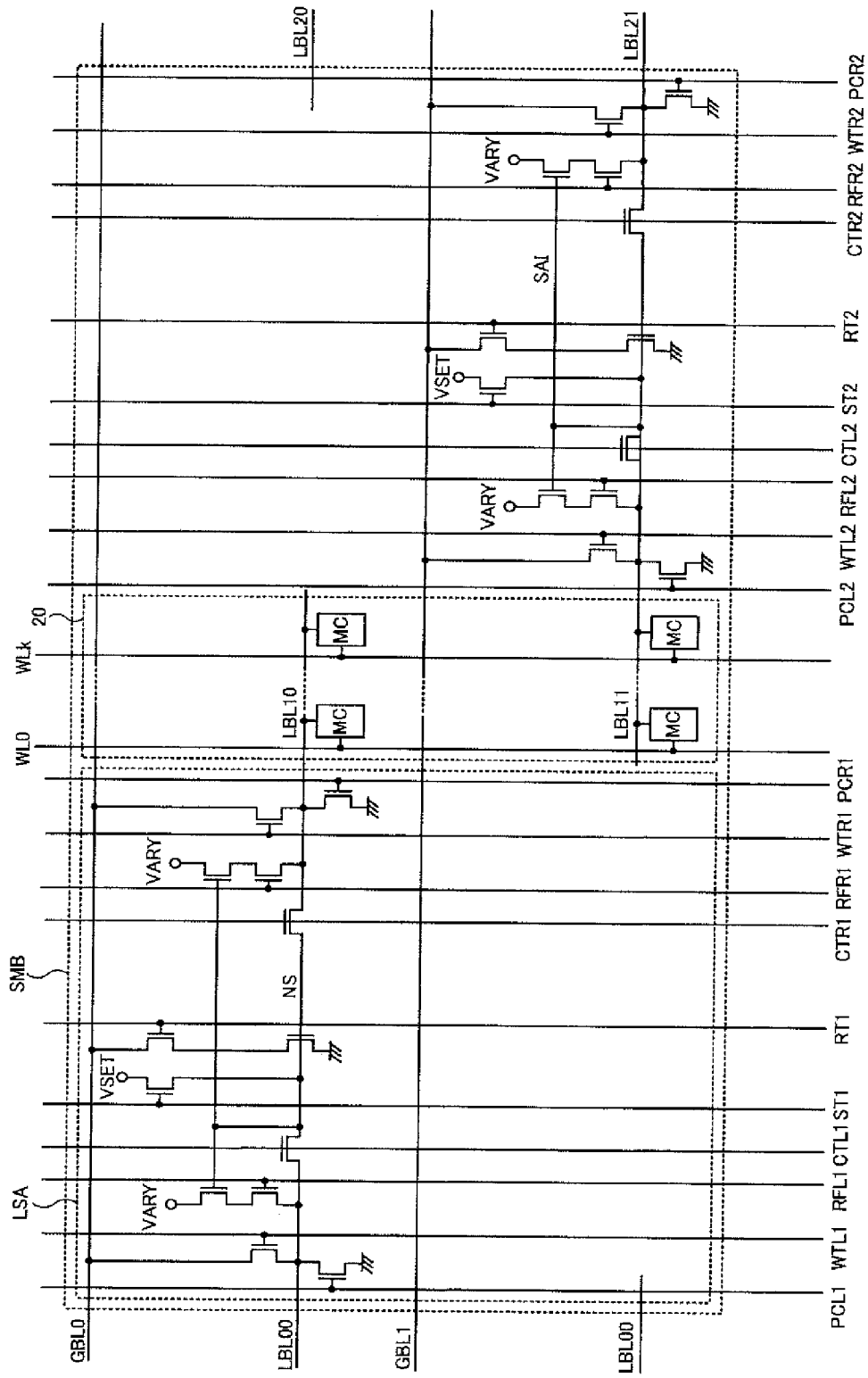
FIG. 8 is a diagram showing a circuit configuration of a range including one sub memory cell array 20 and two bit line control circuits LSA on both sides thereof in the configuration of FIG. 4.
Figure 9:
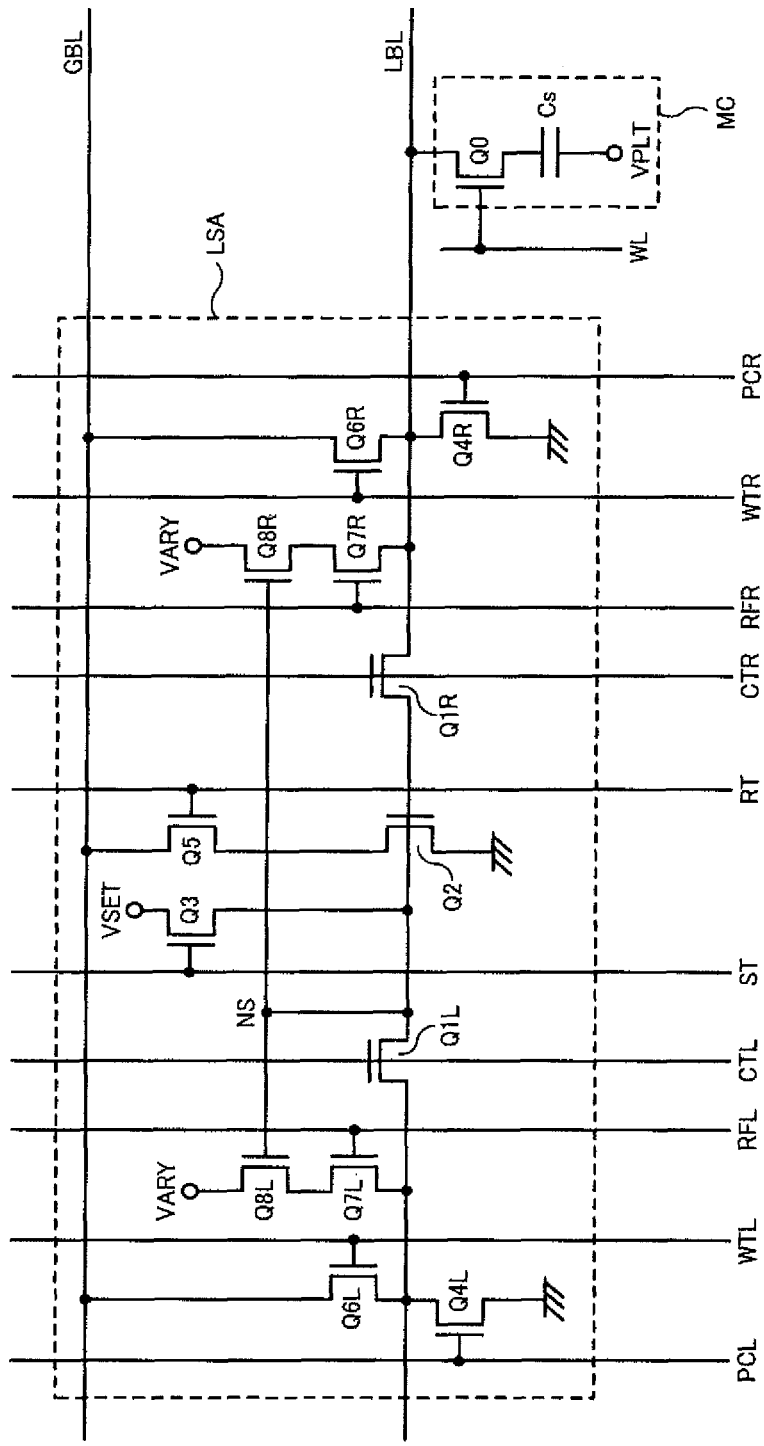
FIG. 9 is an enlarged diagram showing a circuit portion of one bit line control circuit LSA and one memory cell MC in the circuit configuration of FIG. 8.

Next, configuration and operation of the bit line control circuit LSA and the sub memory cell array 20 of FIG. 20 will be described with reference to FIGS. 8 to 13. FIG. 8 shows a circuit configuration of a range including one sub memory cell array 20 and two bit line control circuits LSA on both sides thereof in the configuration of FIG. 4. Further, FIG. 9 is an enlarged diagram showing a circuit portion of one bit line control circuit LSA and one memory cell MC in the circuit configuration of FIG. 8. The sub memory cell array 20 shown in FIG. 8 includes k+1 word lines WL0 to WLk, two local bit lines LBL, and a plurality of memory cells MC arranged at intersections thereof. One of the two local bit lines LBL in the sub memory cell array 20 is connected to the bit line control circuit LSA on the left, and the other thereof is connected to the bit line control circuit LSA on the right.

In FIG. 8, each symbol of signals (the lower side of FIG. 8) supplied to the local bit line control circuits LSA on the left and right is postfixed with a number such as "1", "2", etc for the distinction. Although, postfixed numbers of respective symbols are omitted in FIG. 9, the bit line control circuit LSA of FIG. 9 can be corresponded, for example, to the bit line control circuit LSA on the left in FIG. 8.

As shown in FIG. 9, the memory cell MC is a destructive readout type memory cell composed of a selection NMOS transistor Q0 and a capacitor Cs that stores data as electric charge. The selection NMOS transistor Q0 has a source connected to the local bit line LBL, and a gate connected to the word line WL. The capacitor Cs is connected between a drain of the selection NMOS transistor Q0 and a cell plate potential VPLT.

The bit line control circuit LSA includes thirteen NMOS transistors Q1L, Q1R, Q2, Q3, Q4L, Q4R, Q5, Q6L, Q6R, Q7L, Q7R, Q8L and Q8R. The NMOS transistor Q1R functioning as a charge transfer gate controls charge transfer between the local bit line LBL and a node NS in response to a transfer control signal CTR applied to its gate. The node NS is equivalent to a bit line inside the bit line control circuit LSA. The NMOS transistor Q2 as an amplifying element has a gate coupled to the node NS and a source supplied with the ground potential VSS, and senses and amplifies a signal voltage of the node NS to convert it to a drain current.

The NMOS transistor Q3 precharges the node NS to a potential VSET in response to a precharge signal ST. The NMOS transistor Q4R precharges the local bit line LBL to the ground potential VSS in response to a precharge signal PCR. The NMOS transistor Q5 controls an electrical connection between the global bit line GBL and a drain of the NMOS transistor Q2 in response to a read signal RT. The NMOS transistor Q6R controls an electrical connection between the local bit line LBL and the global bit line GBL in response to a write signal WTR.

The NMOS transistor Q7R controls an electrical connection between the local bit line LBL and a drain of the NMOS transistor Q8R in response to a refresh signal RFR. The NMOS transistor Q8R has a gate coupled to the node NS and a source supplied with the array voltage VARY, and a drain current corresponding to the potential of the node NS flows through the NMOS transistor Q8R when the NMOS transistor Q7R is on.

In addition, connection relations of the NMOS transistors Q1L, Q4L, Q6L, Q7L and Q8L in the bit line control circuit LSA are symmetrical to those of the NMOS transistors Q1R, Q4R, Q6R, Q7R and Q8R, and both operations are the same. In this case, the signals CTR, PCR, WTR and RFR applied to the NMOS transistors may be assumed to be replaced with corresponding signals CTL, PCL, WTL and RFL.

In this manner, since the bit line control circuit LSA is configured using NMOS transistors of the same conductive type as the selection NMOS transistor Q0 of the memory cell MC, an isolation region is not required thereby reducing a chip area.

Figure 10:
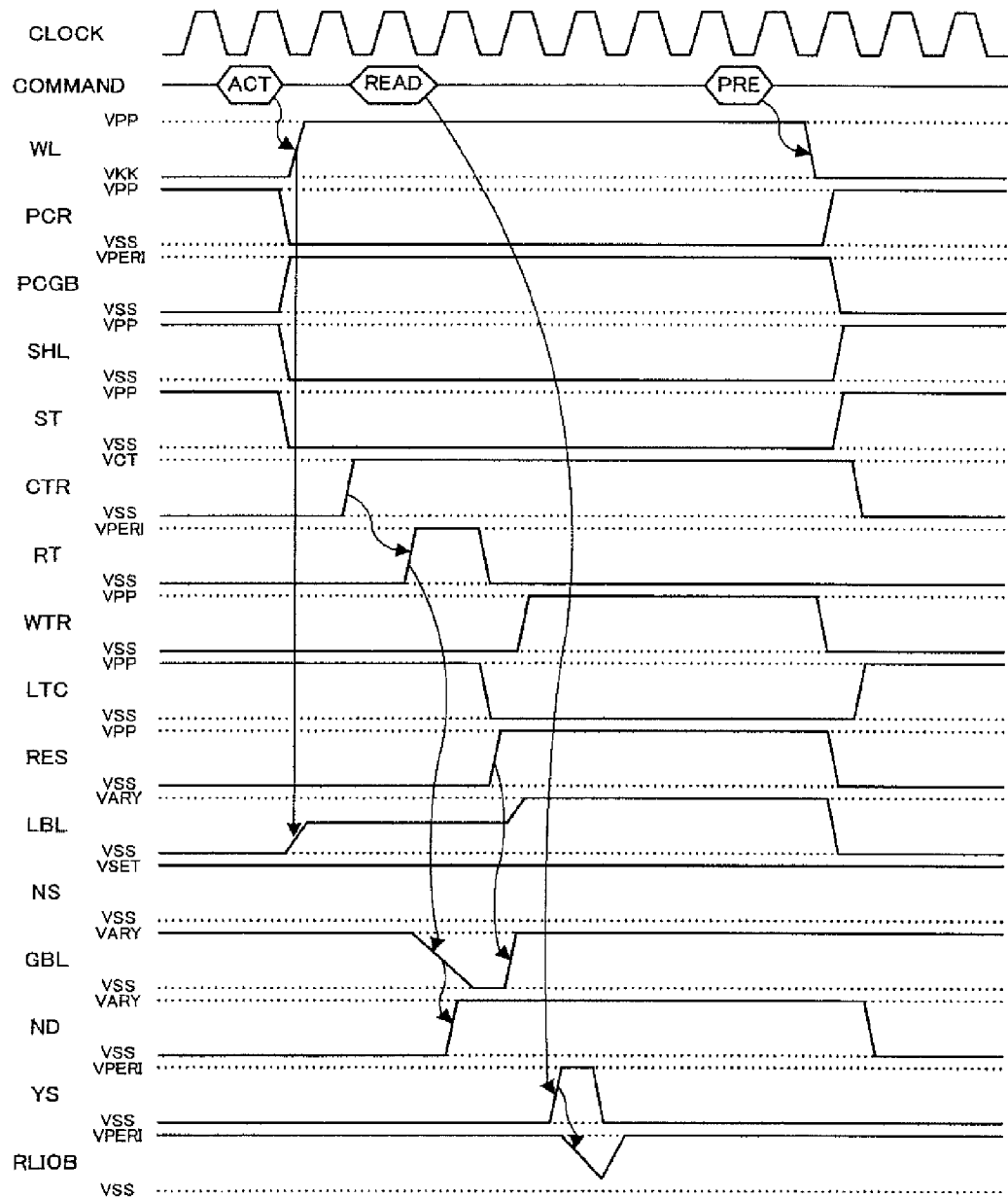
FIG. 10 is a diagram showing operation waveforms of the bit line control circuit LSA of FIG. 9 when reading high-level data stored in the memory cell MC.

FIG. 10 shows operation waveforms of the bit line control circuit LSA of FIG. 9 when reading high-level data stored in the memory cell MC. In the operation waveforms of FIG. 10, the standby state is set in early times. In the standby state, the local bit line LBL is precharged to the ground potential VSS, the global bit line GBL is precharged to the array voltage VARY, and the node NS is precharged to the potential VSET, respectively. At this point, the precharge signals PCR, the GBL select signal SHL, the precharge signal ST and the latch signal LTC are maintained at a voltage VPP, respectively. The precharge signal PCGB, the transfer control signal CTR, the read signal RT, the write signal WTR and the restoration signal RES are maintained at the ground potential VSS, respectively. The word line WL is maintained at a voltage VKK. These voltages satisfy a relation as follows:

$$VPP > VSET > VPERI > VARY > VCT > VSS > VKK$$

In addition, the ground potential VSS is 0V, and the voltage VKK is a negative potential lower than the ground potential VSS.

As shown in FIG. 10, when receiving an ACT command, the precharge signals PCR, PCGB and ST are respectively inverted to an inactive state, the local bit line LBL and the node NS that have been precharged to the above voltages become floating, and the global bit line GBL is maintained at the array voltage VARY by the cross-coupled amplifier 40. Subsequently, the word line WL is driven from the voltage VKK to the voltage VPP, and the high-level data is read out from the memory cell MC. As a result, the local bit line LBL rises to a predetermined potential from the ground potential VSS.

Subsequently, the transfer control signal CTR is driven to a voltage VCT. Here, regarding the charge transfer operation of the NMOS transistor Q1R, a potential Vx1 is defined by a following formula (1).

$$Vx1 = VCT - Vt1 \quad (1)$$

(Vt1 is a threshold voltage of the NMOS transistor Q1R)

At this point, since the potential of the local bit line LBL is higher than the potential Vx1 of the formula (1), the NMOS transistor Q1R continues to be in an OFF state. Therefore, the node NS continues to be maintained at the potential VSET.

Subsequently, the read signal RT is driven to the voltage VPERI for a certain period of time. The potential of the node NS in this period is higher than a threshold voltage Vt2 of the NMOS transistor Q2, and thereby the NMOS transistor Q2 turns on. As a result, the electric charge being charged to the global bit line GBL is extracted through the NMOS transistors Q5 and Q2, and the potential of the global bit line GBL drops to the ground potential VSS. As a result, in the global sense amplifier GSA, the potential of the node NDB of FIG. 5 becomes the ground potential VSS, which is inverted by the cross-coupled amplifier 40, and the potential of the node ND becomes the array voltage VARY. Thereafter, the latch signal LTC is set to the ground potential VSS, and the data read out from the memory cell MC is latched in the global sense amplifier GSA.

Thereafter, the restoration signal RES and the write signal WTR are both set to the voltage VPP, the node ND and the global bit line GBL are connected to each other, and the global bit line GBL and the local bit line LBL are connected to each other, thereby restoring the high-level data into the memory cell MC.

Meanwhile, when receiving a READ command subsequent to the ACT command, the selection signal YS is activated to the voltage VPERI. Since the potential of the node ND has become the array voltage VARY at this point, the MOS transistor in the I/O pull-down circuit 42 turns on so that the electric charge of the local I/O line RLIOB is extracted. Thereby, the global sense amplifier GSA outputs the high-level data.

Thereafter, when a precharge operation is started in response to a received PRE command, the word line WL returns to the voltage VKK, the precharge signals PCR and ST, the GBL select signal SHL and the latch signal LTC are respectively set to the voltage VPP, and the precharge signal PCGB, the transfer control signal CTR, the write signal WTR and the restoration signal RES are respectively set to the ground potential VSS. As a result, the local bit line LBL is precharged to the ground potential VSS, the global bit line GBL is precharged to the array voltage VARY, and the node NS is precharged to the potential VSET, so as to return to the standby state. Thereby, the read operation of FIG. 10 is completed.

Figure 11:
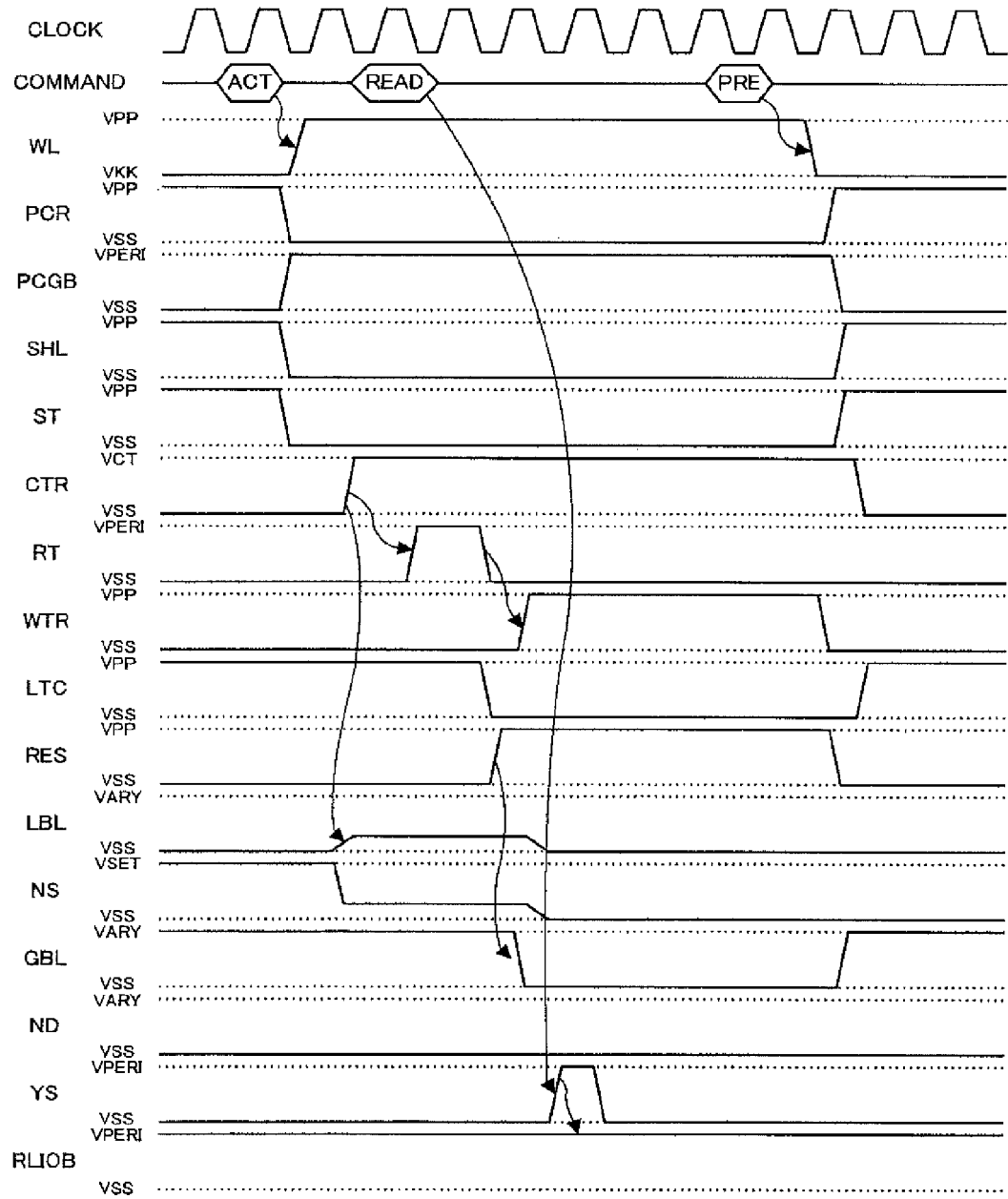
FIG. 11 is a diagram showing operation waveforms of the bit line control circuit LSA of FIG. 9 when reading low-level data stored in the memory cell MC.

Next, FIG. 11 shows operation waveforms of the bit line control circuit LSA of FIG. 9 when reading low-level data stored in the memory cell MC. The operation waveforms from the standby state to the driving of the word line WL are the same as those in FIG. 10. Meanwhile, when the word line WL is driven to the voltage VPP, the low-level data is read out from the memory cell MC, and the potential of the local bit line LBL at this point is maintained at the ground potential VSS.

Subsequently, when the transfer control signal CTR is driven to the voltage VCT, the potential of the local bit line LBL becomes lower than the potential Vx1 of the formula (1), as different from FIG. 10, and thus the NMOS transistor Q1R turns on. That is, the NMOS transistor Q1R allows the node NS and the local bit line LBL to be connected to each other. Since the capacitance of the node NS is extremely lower than a sum of the capacitance of the local bit line LBL and the capacitance of the capacitor Cs, the potential of the node NS drops to near the ground potential VSS, and the potential of the local bit line LBL rises to a potential slightly higher than the ground potential VSS due to the electric charge flowing from the node NS.

Subsequently, when the read signal RT is driven to the voltage VPERI for a certain period of time, since the potential of the node NS is lower than the threshold voltage Vt2 of the NMOS transistor Q2, contrary to FIG. 10, the NMOS transistor Q2 remains in an OFF state. Thus, the electric charge being charged to the global bit line GBL is not extracted. Therefore, the global bit line GBL continues to be maintained at the array voltage VARY, and thus the nodes NDB and ND in the global sense amplifier GSA are maintained at the array voltage VARY and the ground potential VSS, respectively. Thereafter, the latch signal LTC is set to the ground potential VSS, the data read out from the memory cell MC is latched in the global sense amplifier GSA. Subsequently, the low-level data is restored into the memory cell MC in the same manner as in FIG. 10.

Subsequently, the same control as in FIG. 10 is performed in response to the received READ command, the node ND being at the ground potential VSS allows the MOS transistor of the I/O pull-down circuit 42 to be in an OFF state, and thus the electric charge of the local I/O line RLIOB is not extracted. Thereby, the global sense amplifier GSA outputs the low-level data. The subsequent precharge operation is performed in the same manner as in FIG. 10.

Figure 12:
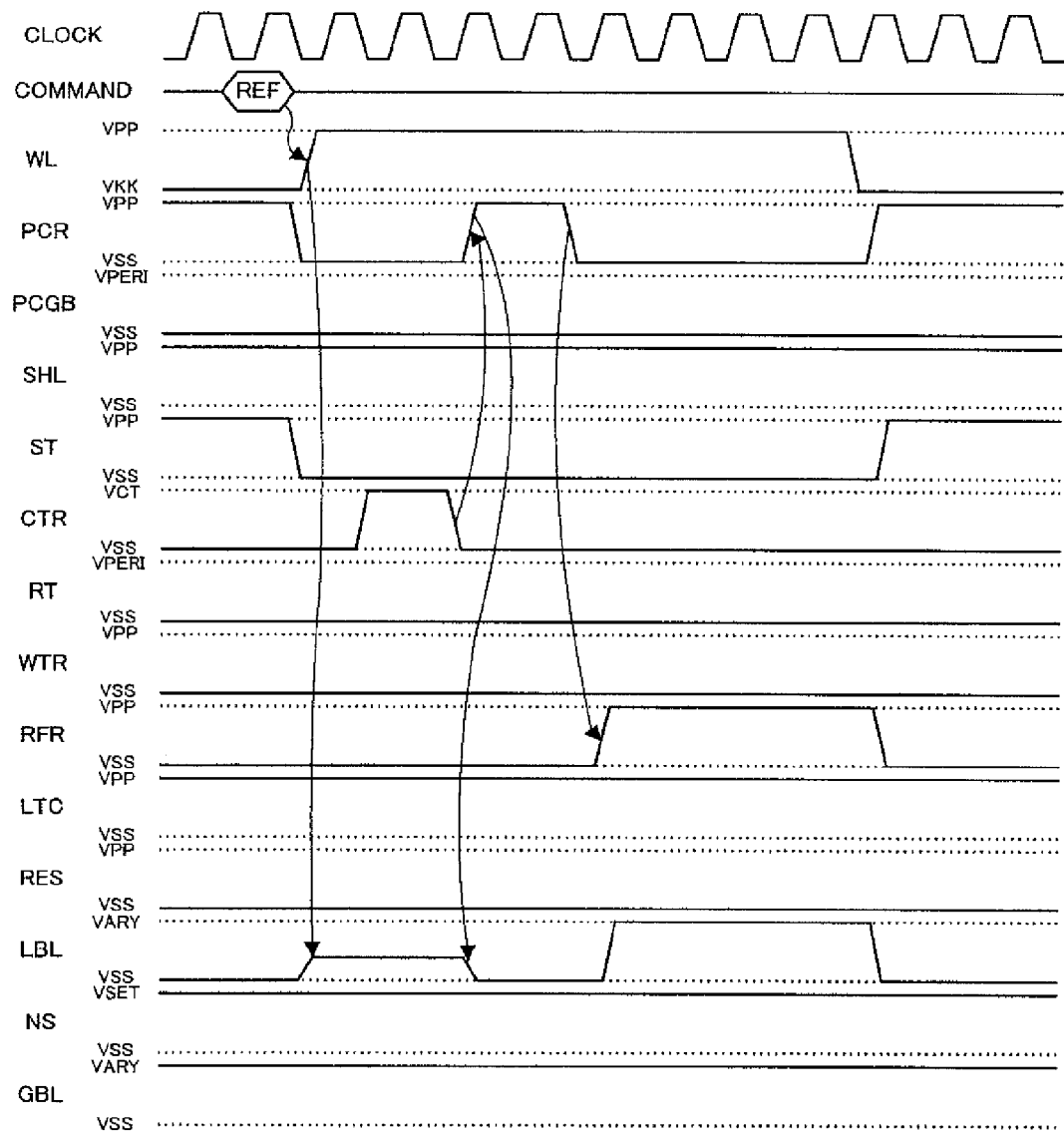
FIG. 12 is a diagram showing operation waveforms of the bit line control circuit LSA of FIG. 9 when refreshing high-level data stored in the memory cell MC.

Next, FIG. 12 shows operation waveforms of the bit line control circuit LSA of FIG. 9 when refreshing high-level data stored in the memory cell MC. The operation waveforms in the standby state are the same as those in FIG. 10. Meanwhile, when receiving an REF command, both the precharge signals PCR and ST are set to the ground potential VSS as an inactive state, and the local bit line LBL that has been precharged to the ground potential VSS and the node NS that has been precharged to the potential VSET become floating, respectively. Further, since the precharge signal PCGB has been activated to the ground potential VSS, the global bit line GBL continues to be precharged to the array voltage VARY. Subsequently, the word line WL is driven from the voltage VKK to the voltage VPP, the high-level data is read out from the memory cell MC, and the potential of the local bit line LBL rises from the ground potential VSS to a predetermined potential.

Subsequently, the transfer control signal CTR is driven to the voltage VCT for a certain period of time. Since the potential of the local bit line LBL is higher than the potential Vx1 of the formula (1), the NMOS transistor Q1R remains in an OFF state. Therefore, the node NS continues to be maintained at the potential VSET. After the transfer control signal CTR returns to the ground potential VSS, the precharge signal PCR is driven to the voltage VPP for a certain period of time. Thereby, the local bit line LBL is precharged to the ground potential VSS by the NMOS transistor Q4R. Here, the low-level data is restored into a memory cell MC connected to the word line WL. At this point, the MOS a transistor Q1R is in an OFF state in response to the transfer control signal CTR maintained at the ground potential VSS, and thus the node NS that is maintained at the potential VSET has become floating.

Subsequently, after the precharge signal PCR returns to the ground potential VSS as an inactive state, the refresh signal RFR is activated to the voltage VPP. At this point, the potential VSET of the node NS is higher than a threshold voltage Vt8 of the NMOS transistor Q8R, and thus the NMOS transistor Q8R turns on. As a result, the local bit line LBL is charged to the array voltage VARY through the NMOS transistors Q8R and Q7R, and the high-level data is restored into the memory cell MC. Here, it is desirable to set a relation of potentials in which the potential of the node NS is higher than a voltage VARY+Vt8.

Thereafter, the precharge operation is automatically started based on an internal timer function implemented in a control circuit in the peripheral circuit region PERI. In the precharge operation, the word line WL returns to the voltage VKK, both the precharge signals PCR and ST are set to the voltage VPP, and the refresh signal RFR is set to the ground potential VSS. As a result, the local bit line LBL is precharged to the ground potential VSS and the node NS is precharged to the potential VSET, so as to return to the standby state. Thereby, the refresh operation of FIG. 12 is completed.

Figure 13:
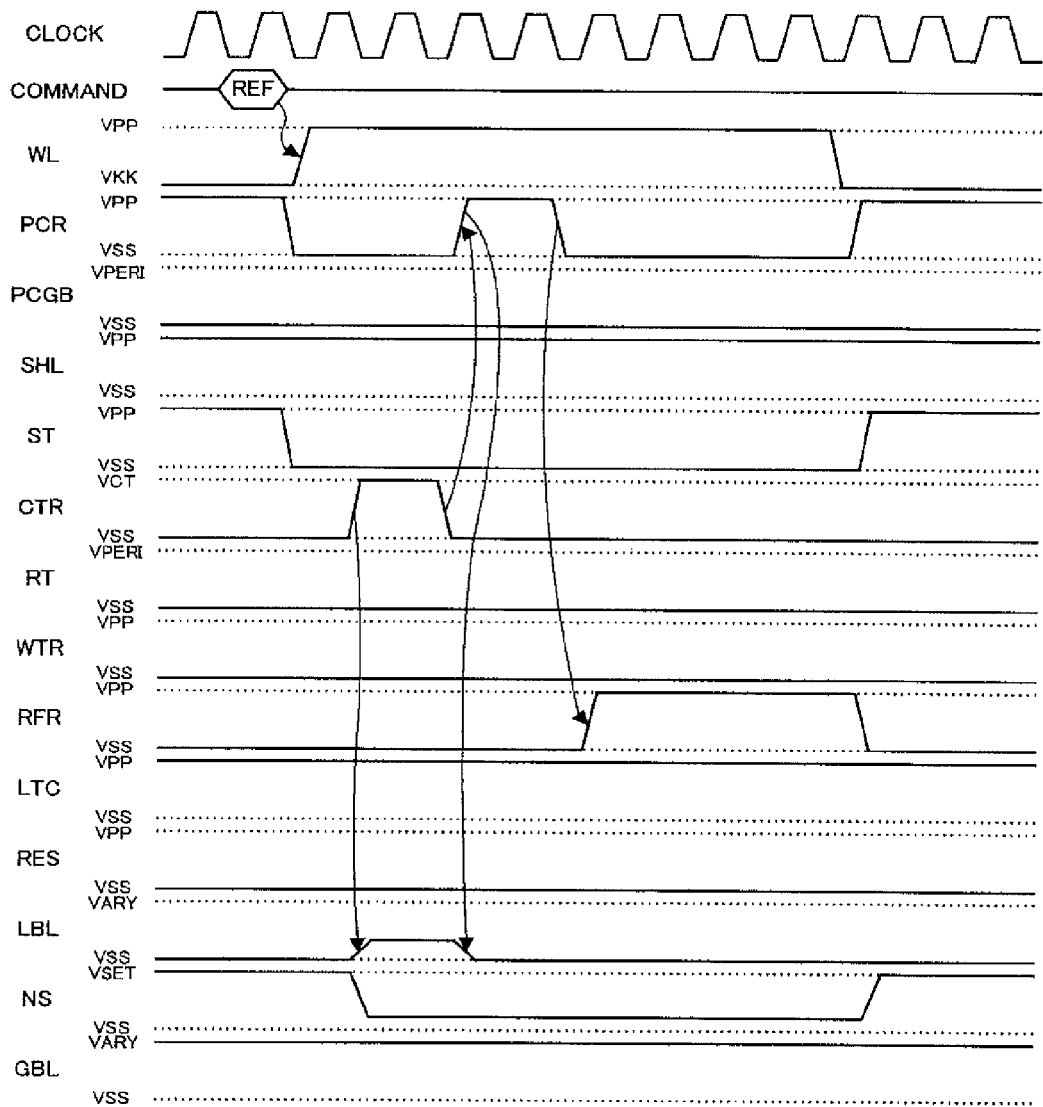
FIG. 13 is a diagram showing operation waveforms of the bit line control circuit LSA of FIG. 9 when refreshing low-level data stored in the memory cell MC.

Next, FIG. 13 shows operation waveforms of the bit line control circuit LSA of FIG. 9 when refreshing low-level data stored in the memory cell MC. The operation waveforms from the standby state to the driving of the word line WL are the same as those in FIG. 12. Meanwhile, when the word line WL is driven to the voltage VPP, the low-level data is read out from the memory cell MC, and the potential of the local bit line LBL at this point is maintained at the ground potential VSS.

Subsequently, when the transfer control signal CTR is driven to the voltage VCT for a certain period of time, the potential of the local bit line LBL becomes lower than the potential Vx1 of the formula (1), as different from FIG. 12, and thus the NMOS transistor Q1R turns on. That is, the NMOS transistor Q1R allows the node NS and the local bit line LBL to be connected to each other. As described by referring to FIG. 11, since the capacitance of the node NS is extremely lower than the sum of the capacitances of the local bit line LBL and the capacitor Cs, the potential of the node NS drops to near the ground potential VSS, and the potential of the local bit line LBL rises to the potential slightly higher than the ground potential VSS.

From this point forward, operations for driving the precharge signal PCR are performed in the same manner as in FIG. 12, and the low-level data is written into all the memory cells MC connected to the word line WL. Thereafter, when the refresh signal RFR is activated to the voltage VPP, since the potential of the node NS is lower than the threshold voltage Vt8 of the NMOS transistor Q8R, contrary to FIG. 12, the NMOS transistor Q8 goes into an OFF state. As a result, the potential of the local bit line LBL continues to be maintained at the ground potential VSS so as to maintain a state where the low-level data is restored into the memory cell MC. At this point, both the local bit line LBL and the node NS are in a floating state. The subsequent precharge operation is the same as the description in FIG. 12.

As described above, in the configuration of FIGS. 1 to 9, the refresh operation including the restoring operation of the memory cell MC can be completed using only the local bit line LBL and the bit line control circuit LSA without using the global bit line GBL and the global sense amplifier GSA. Further, according to the configuration of the bit line control circuit LSA of FIG. 9, the high-level data of the memory cell MC is refreshed through the NMOS transistor Q8 while the low-level data of the memory cell MC is refreshed by using the precharge operation of the NMOS transistor Q4. Thus, the refresh operation can be performed in a state where the global bit line GBL and the global sense amplifier GSA are in the standby state, and charge/discharge current of the global bit line GB and operating current required to control the global sense amplifier GSA do not flow, thereby reducing the consumption current in the refresh operation. In addition, the bit line control circuit LSA is configured using only NMOS transistors, and therefore well isolation is not required, thereby obtaining an effect of suppressing an increase in area of the chip CHIP.

Figure 14:
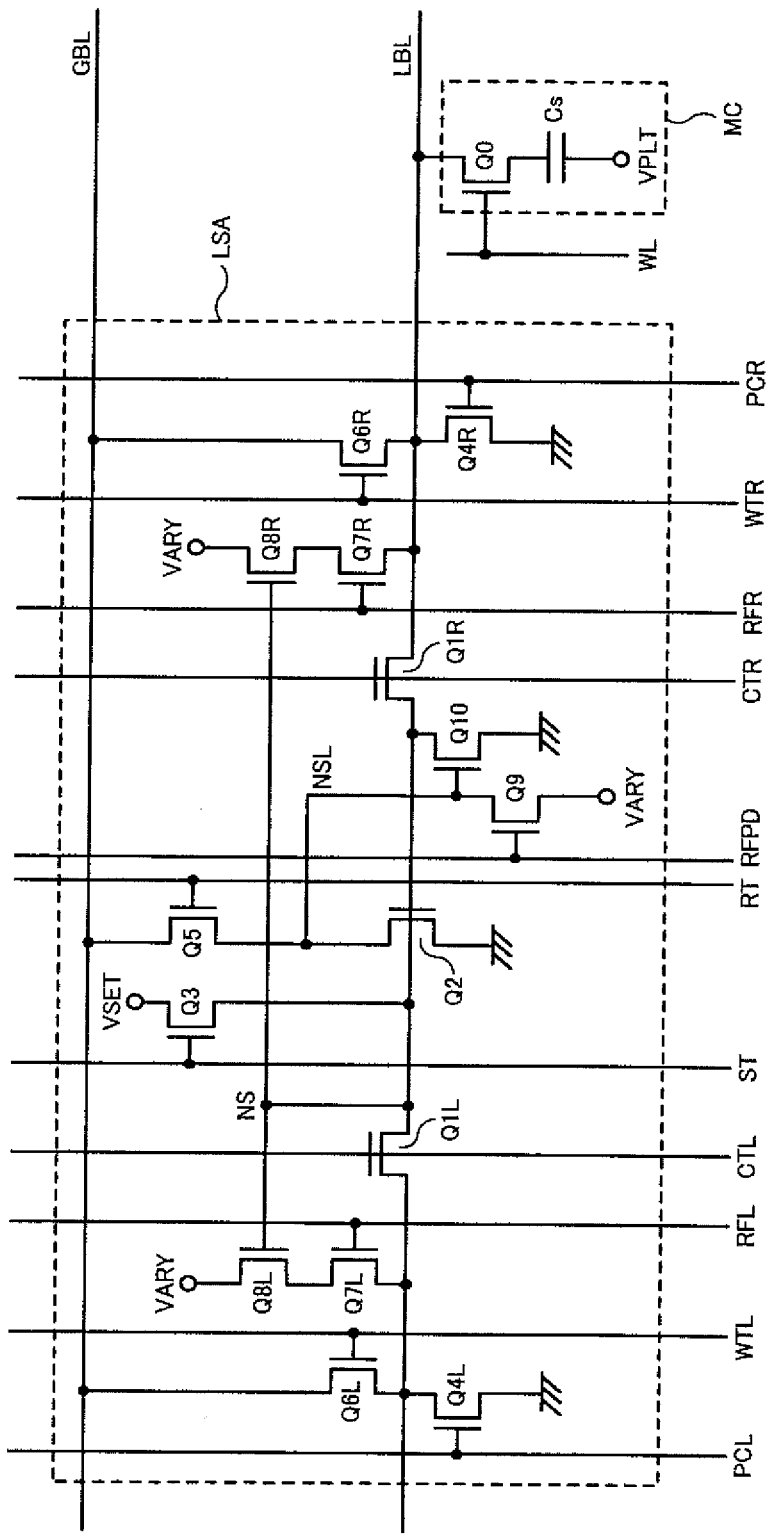
FIG. 14 is a diagram showing a circuit portion of one bit line control circuit LSA and one memory cell MC in a circuit configuration of an embodiment.

A semiconductor device of an embodiment will be described below. FIGS. 2 to 7 described above are common to this embodiment, so description thereof will be omitted. FIG. 14 shows a circuit portion of one bit line control circuit LSA and one memory cell MC in a configuration example. Although most of parts in FIG. 14 are common to those in FIG. 9, it is modified in that a refresh circuit for low-level data is added to the bit line control circuit LSA in FIG. 14. In FIG. 14, descriptions of the parts being common to those in FIG. 9 will be omitted.

In the bit line control circuit LSA of FIG. 14, the added refresh circuit for low-level data is a portion including two NMOS transistors Q9 and Q10. The NMOS transistor Q9 has a gate to which a refresh signal RFPD for low-level data is applied, and controls an electrical connection between a node NSL and the array voltage VARY. The node NSL is a node between the series connected transistors Q2 and Q5. The NMOS transistor Q10 has a gate coupled to the node NSL, and controls an electrical connection between the node NS and the ground potential VSS.

Figure 15:
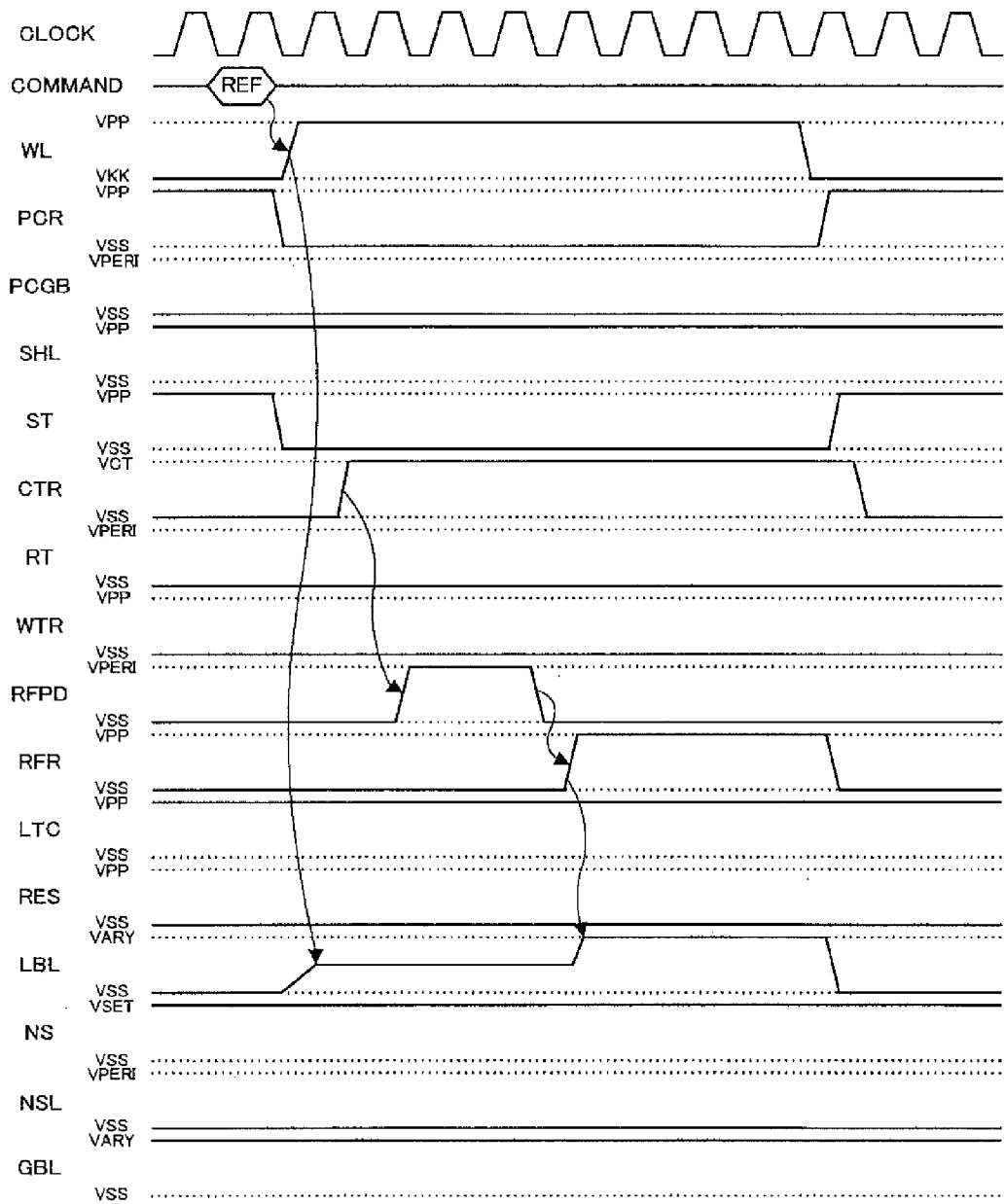
FIG. 15 is a diagram showing operation waveforms of the bit line control circuit LSA of FIG. 14 when refreshing high-level data stored in the memory cell MC.

Next, a refresh operation of the configuration of FIG. 14 will be described with reference to FIGS. 15 and 16. A read operation described below is the same as the read operation shown in FIGS. 10 and 11, so description thereof will be omitted. FIG. 15 shows operation waveforms of the bit line control circuit LSA of FIG. 14 when refreshing high-level data stored in the memory cell MC. In FIG. 15, operation waveforms before the transfer control signal CTR is driven to the voltage VCT are the same as those in FIG. 12. Up until this point, the refresh signal RFPD is maintained at the ground potential VSS.

After the transfer control signal CTR is set to the voltage VCT, the refresh signal RFPD is activated to the voltage VPERI for a certain period of time, and the NMOS transistor Q9 turns on. At this point, the NMOS transistor Q2 is in an ON state. Since the potential VSET of the node NS is higher than the voltage VPERI, a large drain current flows through the NMOS transistor Q2, and thus the node NSL that is the drain of the NMOS transistor Q2 is maintained at the ground potential VS. Therefore, the NMOS transistor Q10 whose gate is coupled to the node NSL remains in an OFF state, and the local bit line LBL is in state of maintaining a predetermined potential corresponding to the high-level data of the memory cell MC. However, a through current flows within a period for activating the refresh signal RFPD to the voltage VPERI.

After the refresh signal RFPD returns to the ground potential VSS, the refresh signal RFR is activated to the voltage VPP. At this point, the operation described using FIG. 12 is performed due to the potential VSET of the node NS, and the high-level data is restored into the memory cell MC. From this point forward, the precharge operation is performed in the same manner as in FIG. 12, and the refresh operation of FIG. 15 is completed.

Figure 16:
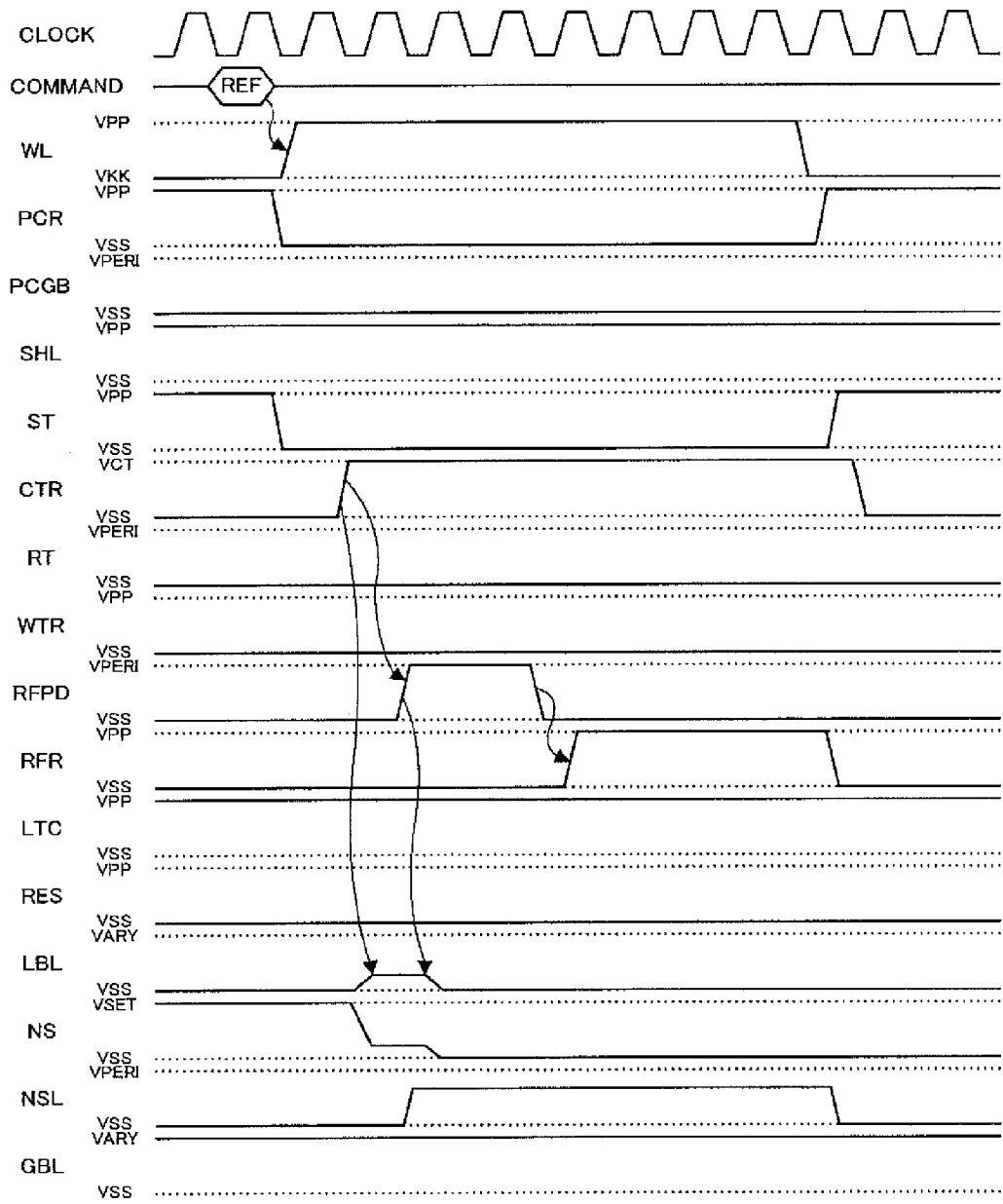
FIG. 16 is a diagram showing operation waveforms of the bit line control circuit LSA of FIG. 14 when refreshing low-level data stored in the memory cell MC.

Next, FIG. 16 shows operation waveforms of the bit line control circuit LSA of FIG. 14 when refreshing low-level data stored in the memory cell MC. The operation waveforms before the transfer control signal CTR is set to the voltage VCT and the potential of the node NS drops to near the ground potential VSS are the same as those of FIG. 13. Up until this point, the refresh signal RFPD is maintained at the ground potential VSS.

Subsequently, the refresh signal RFPD is activated to the voltage VPERI for a certain period of time, and the NMOS transistor Q9 of FIG. 14 turns on. Since the NMOS transistor Q2 is in an OFF state at this point, the potential of the node NSL that has been maintained at the ground potential VSS rises to a potential lower than the voltage VPERI by a threshold voltage Vt9 of the transistor Q9. As a result, the NMOS transistor Q10 whose gate is coupled to the node NSL turns on, both the potentials of the node NS and the local bit line LBL drop to the ground potential VSS, and the low-level data is restored into the memory cell MC. From this point forward, the precharge operation is performed in the same manner as in FIG. 15 so as to return to the standby state, and the refresh operation of FIG. 16 is completed.

As described above, in the configuration of FIG. 14, when restoring the low-level data of the memory cell MC, it is possible to maintain a state in which the potential of the local bit line LBL is fixed to the ground potential VSS. That is, the local bit line LBL whose potential is maintained at the ground potential VSS goes into a floating state in the configuration of FIG. 9, and in contrast the floating state of the local bit line LBL can be avoided in the restoring operation of the low-level data in the configuration of FIG. 14. Therefore, by employing the configuration of FIG. 14, it is possible to prevent the potential of the local bit line LBL from floating due to power supply noise or other noise, and thus the low-level data can be reliably refreshed.

Figure 17:
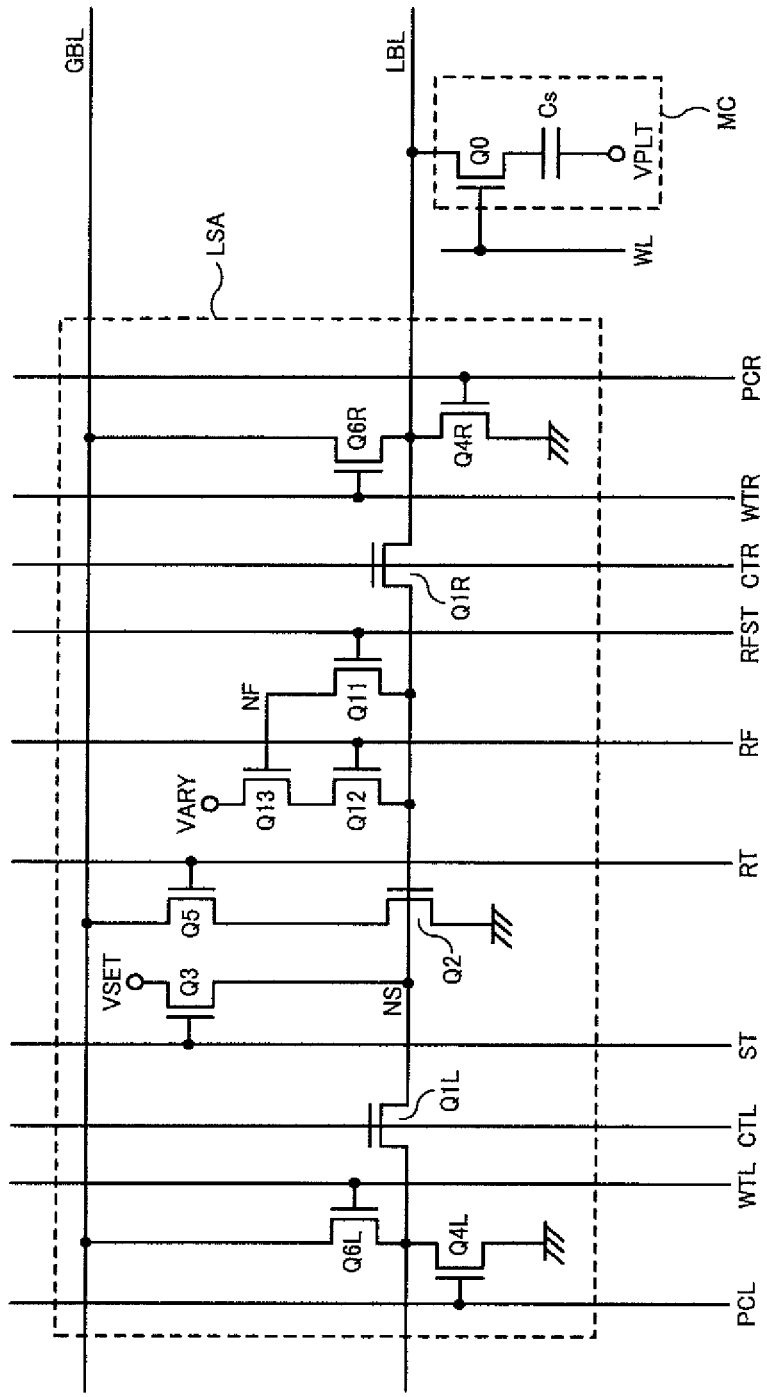
FIG. 17 is a diagram showing a circuit portion of one bit line control circuit LSA and one memory cell MC in a circuit configuration of an embodiment.

A semiconductor device of an embodiment will be described below. FIGS. 2 to 7 described in the configuration of FIG. 9 are common to this embodiment, so description thereof will be omitted. FIG. 17 shows a circuit portion of one bit line control circuit LSA and one memory cell MC in a configuration example. Although most of parts in FIG. 17 are common to those in FIG. 9, it is modified in that the circuit portion of the four MMOS transistors Q7R, Q8R, Q7L and Q8L in FIG. 9 is replaced with a circuit portion of three NMOS transistors Q11, Q12 and Q13. In FIG. 17, descriptions of the parts being common to those in FIG. 9 will be omitted.

The NMOS transistors Q11, Q12 and Q13 in the bit line control circuit LSA of FIG. 17 function as a refresh circuit for high-level data, which are commonly provided for the local bit lines LBL on the left and right. The NMOS transistor Q11 controls an electrical connection between the node NS and a node NF (the gate of the NMOS transistor Q13) in response to a refresh setting signal RFST. The NMOS transistor Q12 controls an electrical connection between the node NS and a drain of the NMOS transistor Q13 in response to a refresh signal RF. The NMOS transistor Q13 has a gate coupled to the node NF (the drain NMOS of the transistor Q11) and a source supplied with the array voltage VARY, and a drain current corresponding to the potential of the node NF flows when the NMOS transistor Q12 is on.

As shown in FIG. 17, the number of NMOS transistors required in the refresh circuit is four in the configuration of FIG. 9, and in contrast only three NMOS transistors are required in the configuration of FIG. 17, thereby correspondingly reducing an area. Further, the refresh circuit of FIG. 17 is coupled to the node NS instead of being directly connected to the local bit line LBL. Therefore, the parasitic capacitance of the local bit line LBL is reduced so that a signal amount in the read operation increases, thereby improving operating margin of the bit line control circuit LSA.

Figure 18:
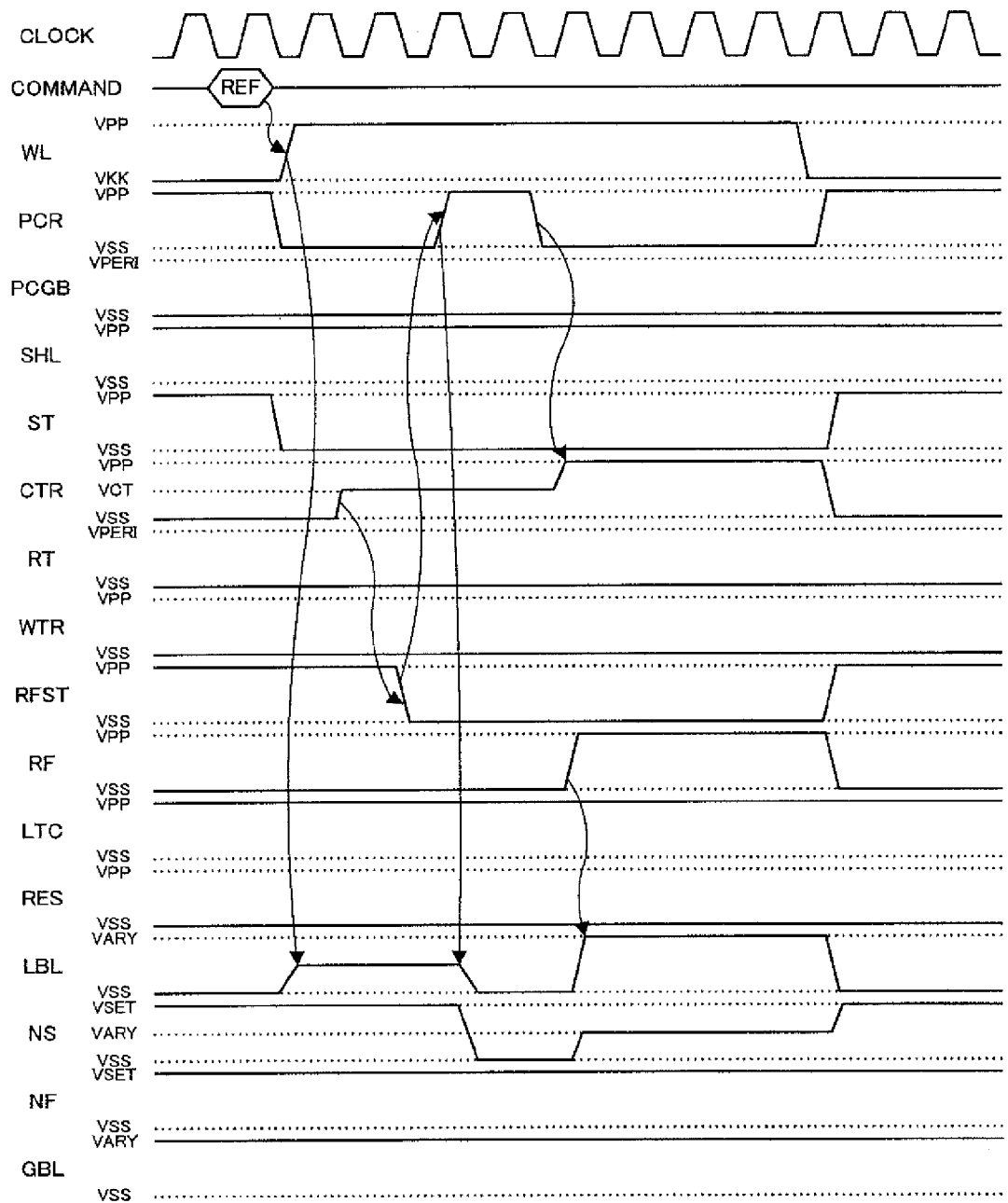
FIG. 18 is a diagram showing operation waveforms of the bit line control circuit LSA of FIG. 17 when refreshing high-level data stored in the memory cell MC.

Next, a refresh operation of the configuration of FIG. 17 will be described with reference to FIGS. 18 and 19. A read operation described below is the same as the read operation shown in FIGS. 10 and 11, so description thereof will be omitted. Here, the refresh setting signal RFST of FIG. 17 is controlled almost in the same manner as the precharge signal PCR of FIG. 9. FIG. 18 shows operation waveforms of the bit line control circuit LSA of FIG. 17 when refreshing high-level data stored in the memory cell MC. In FIG. 18, operation waveforms before the transfer control signal CTR is driven to the voltage VCT are the same as those in FIG. 12. In addition, since the refresh setting signal RFST is maintained at the voltage VPP until this point, the node NF is also maintained at the potential VSET similarly as the node NS.

Subsequently, when the refresh setting signal RFST is set to the ground potential VSS, the NMOS transistor Q11 turns off so that the node NS and the node NF are disconnected from each other. Then, the precharge signal PCR is activated to the voltage VPP for a certain period of time, and both the local bit line LBL and the node NS are precharged to the ground potential VSS. As a result, the low-level data is written into the memory cell MC. In addition, the node NF continues to be maintained at the potential VSET.

After the precharge signal PCR returns to the ground potential VSS, both the refresh signal RF and the transfer control signal CTR are changed to the voltage VPP, and the NMOS transistor Q12 turns on. At this point, since the potential of the node NF is maintained at the potential VSET, the NMOS transistor Q13 turns on and the NMOS transistor Q11R turns on, and therefore the high-level data is restored into the memory cell MC through the node NS and the local bit line LBL. From this point forward, the precharge operation is performed in the same manner as in FIG. 12, and the refresh operation of FIG. 18 is completed. In addition, the refresh setting signal RFST returns to the voltage VPP at this point.

Figure 19:
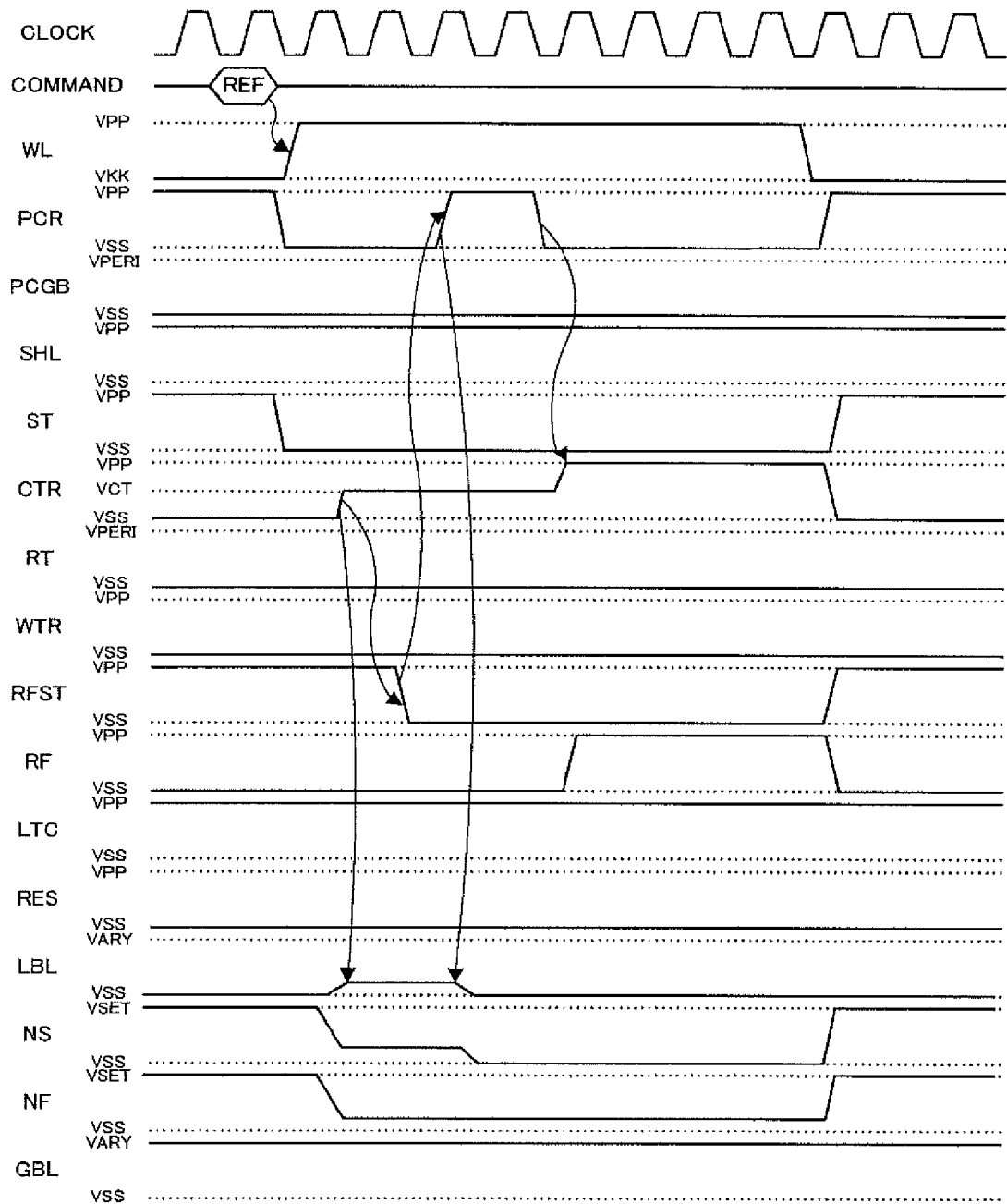
FIG. 19 is a diagram showing operation waveforms of the bit line control circuit LSA of FIG. 17 when refreshing low-level data stored in the memory cell MC.

Next, FIG. 19 shows operation waveforms of the bit line control circuit LSA of FIG. 17 when refreshing low-level data stored in the memory cell MC. The operation waveforms before the transfer control signal CTR is set to the voltage VCT and the potential of the node NS drops to near the ground potential VSS are the same as those of FIG. 13. Here, since the refresh signal RFPD is maintained at the voltage VPP until this point, the potential of the node NF also drops to near the ground potential VSS.

Subsequently, when the refresh setting signal RFST is set to the ground potential VSS, the NMOS transistor Q11 turns off so that the node NS and the node NF are disconnected from each other. Then, the precharge signal PCR is activated to the voltage VPP for a certain period of time, and both the local bit line LBL and the node NS are precharged to the ground potential VSS. After the precharge signal PCR returns to the ground potential VSS, both the refresh signal RF and the transfer control signal CTR are changed to the voltage VPP, and the NMOS transistors Q12 and Q11 turn on. Since the potential of the node NF is maintained at a low potential near the ground potential VSS so that the NMOS transistor Q13 turns off, both the local bit line LBL and the node NS are maintained at the ground potential VSS. As a result, the low-level data is written into the memory cell MC. From this point forward, the precharge operation is performed in the same manner as in FIG. 13, and the refresh operation of FIG. 19 is completed. In addition, the refresh setting signal RFST returns to the voltage VPP at this point.

A semiconductor device of an embodiment will be described below. In this embodiment, the configuration and operation shown in FIGS. 17 to 19 are slightly modified. Thus, in this embodiment, points common to FIGS. 17 to 19 will be omitted, and different points will be mainly described. FIG. 20 shows a circuit portion of one bit line control circuit LSA and one memory cell MC in a configuration example. In FIG. 20, a connection relation of a NMOS transistor Q13*a* corresponding to the NMOS transistor Q13 in FIG. 17 is modified. That is, the source of the NMOS transistor Q13*a* is connected to a common source line CSR instead of the array voltage VARY. A voltage value of the common source line CSR can be set between the ground potential VSS and the array voltage VARY.

Next, a refresh operation of the configuration of FIG. 20 will be described with reference to FIGS. 21 and 22. A read operation described below is the same as the read operation shown in FIGS. 10 and 11, so description thereof will be omitted. The refresh setting signal RFST of FIG. 20 controlled almost in the same manner as the precharge signal PCR of FIG. 9. The common source line CSR of FIG. 20 is controlled almost in the same manner as the refresh signal RFR of FIG. 9. FIG. 21 shows operation waveforms of the bit line control circuit LSA of FIG. 20 when refreshing high-level data stored in the memory cell MC. In FIG. 21, operation waveforms after the word line WL is driven and before the precharge signal PCR that has been set to the voltage VPP for a certain period of time returns to the ground potential VSS are the same as those in FIG. 18.

Thereafter, when both the refresh signal RF and the transfer control signal CTR are changed to the voltage VPP, the potential of the common source line CSR is changed from the ground potential VSS to the array voltage VARY. Since a line of the node NF is short, its capacitance is assumed to be extremely small, and ON capacitance of the gate of the NMOS transistor Q13*a* is dominant. Therefore, when the potential of the common source line CSR is changed to the array voltage VARY, the potential of the node NF rises to VSET+$\alpha$ due to coupling. The value of $\alpha$ varies depending on a ratio occupied by the ON capacitance of the gate of the NMOS transistor Q13*a* (a ratio occupied by inter-channel capacitance) relative to total capacitance of the node NF. For example, $\alpha$ is equal to 0.8V when the array voltage VARY is 1.0V and the ratio occupied by the ON capacitance of the gate of the NMOS transistor Q13*a* relative to the total capacitance of the node NF is 80% (the potential of the node NF rises by 0.8V).

When the potential of the node NF rises to VSET+$\alpha$, a considerably large drain current flows through the NMOS transistor Q13*a*, and thus the high-level data is restored into the memory cell MC through the node NS and the local bit line LBL. From this point forward, the precharge operation is performed in the same manner as in FIG. 12, and the refresh operation of FIG. 21 is completed. In addition, the potential of the common source line CSR returns to the ground potential VSS.

Figure 20:
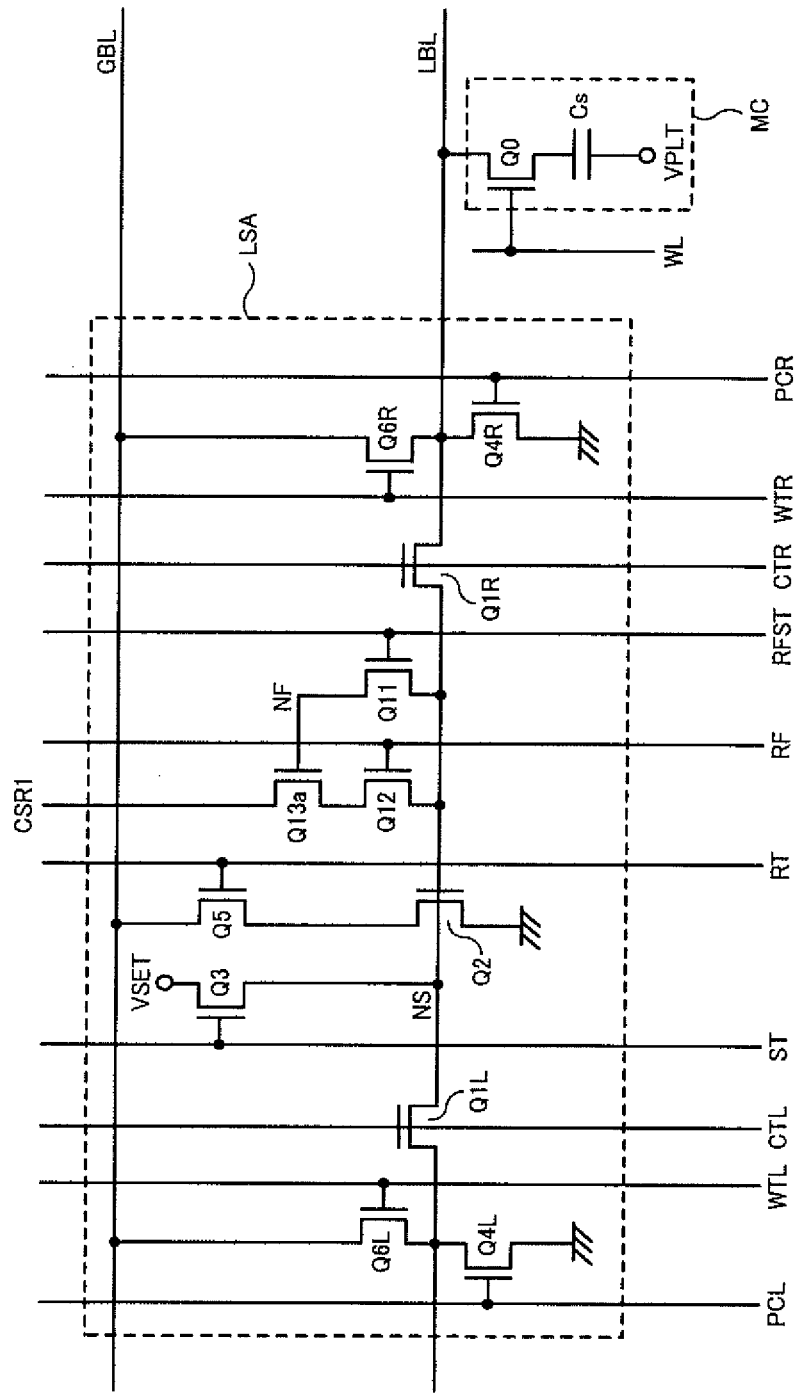
FIG. 20 is a diagram showing a circuit portion of one bit line control circuit LSA and one memory cell MC in a circuit configuration of an embodiment.
Figure 21:
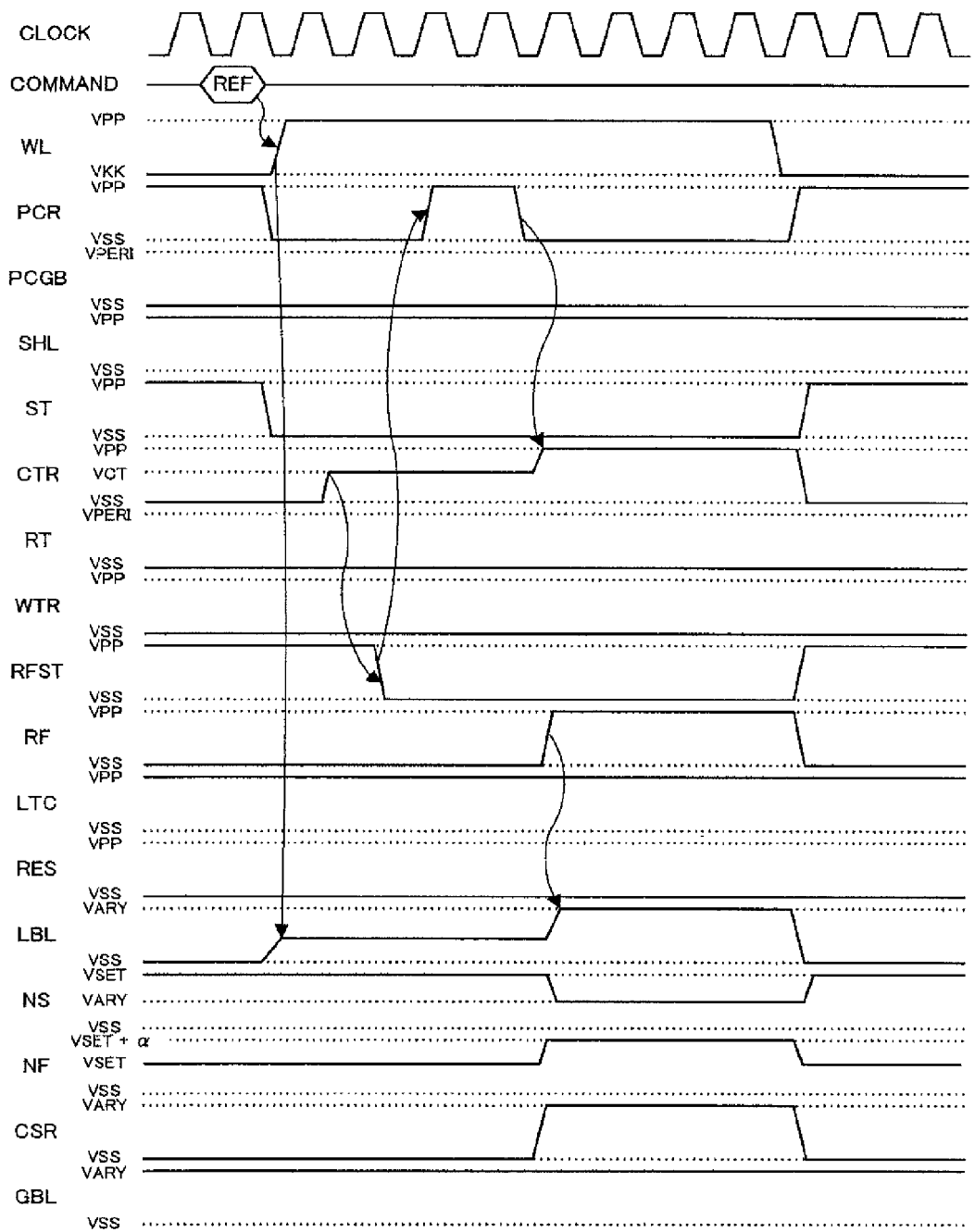
FIG. 21 is a diagram showing operation waveforms of the bit line control circuit LSA of FIG. 20 when refreshing high-level data stored in the memory cell MC.
Figure 22:
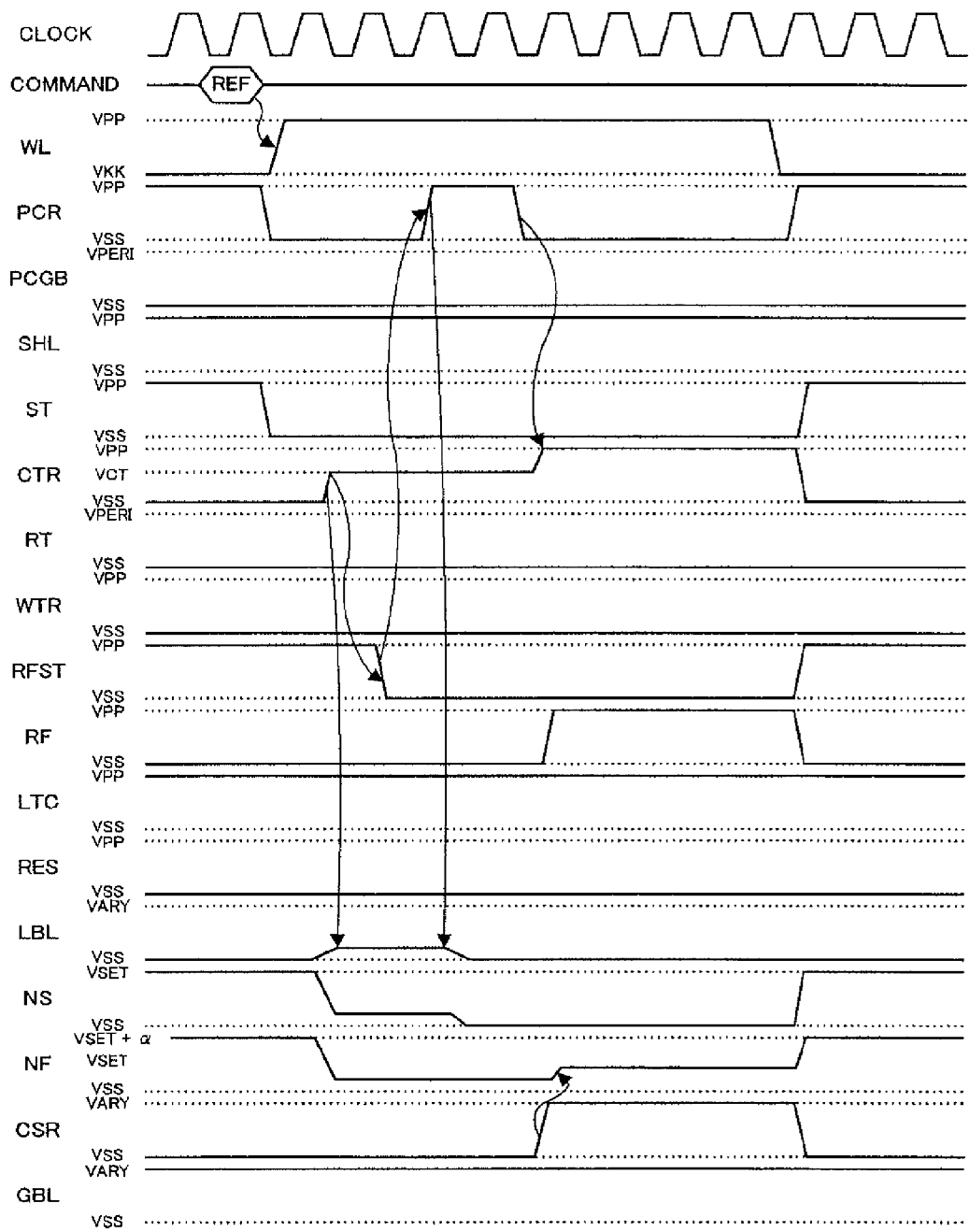
FIG. 22 is a diagram showing operation waveforms of the bit line control circuit LSA of FIG. 20 when refreshing low-level data stored in the memory cell MC.

Next, FIG. 22 shows operation waveforms of the bit line control circuit LSA of FIG. 20 when refreshing low-level data stored in the memory cell MC. The operation waveforms after the word line WL is driven and before the precharge signal PCR that has been set to the voltage VPP for a certain period of time returns to the ground potential VSS are the same as those in FIG. 19.

Thereafter, when both the refresh signal RF and the transfer control signal CTR are changed to the voltage VPP, the common source line CSR is changed from the ground potential VSS to the array voltage VARY. At this point, the above-mentioned inter-channel capacitance is not obvious due to the NMOS transistor Q13*a* being turned off. Therefore, even if the potential of the common source line CSR rises to the array voltage VARY, the potential of the node NF does not largely rise due to the coupling, and merely the potential of the node NF slightly rises due to gate overlap capacitance of the NMOS transistor Q13*a*. As a result, the NMOS transistor Q13*a* whose gate is coupled to a low voltage of the node NF remains in an OFF state, and the local bit line LBL continues to be maintained at the ground potential VSS, thereby restoring the low-level data into the memory cell MC. From this point forward, the precharge operation is performed in the same manner as in FIG. 13, and the refresh operation of FIG. 22 is completed. In addition, the potential of the common source line CSR returns to the ground potential VSS.

As described above, in the configuration of FIG. 20, the common source line CSR being controlled to the array voltage VARY allows the potential of the node NF to rise due to the coupling when refreshing the high-level data, and a gate-source voltage Vgs of the NMOS transistor Q13*a* can be increased. Therefore, within a period required for the refresh operation (tRAS), the potential of the node NF maintaining a floating state rises to a potential slightly higher than the potential VSET, and even if the potential of the node NF decreases a little due to leak current, the high-level data can be written into the memory cell MC. Thereby, it is possible to improve the operating margin of the bit line control circuit LSA in the refresh operation.

Figure 23:
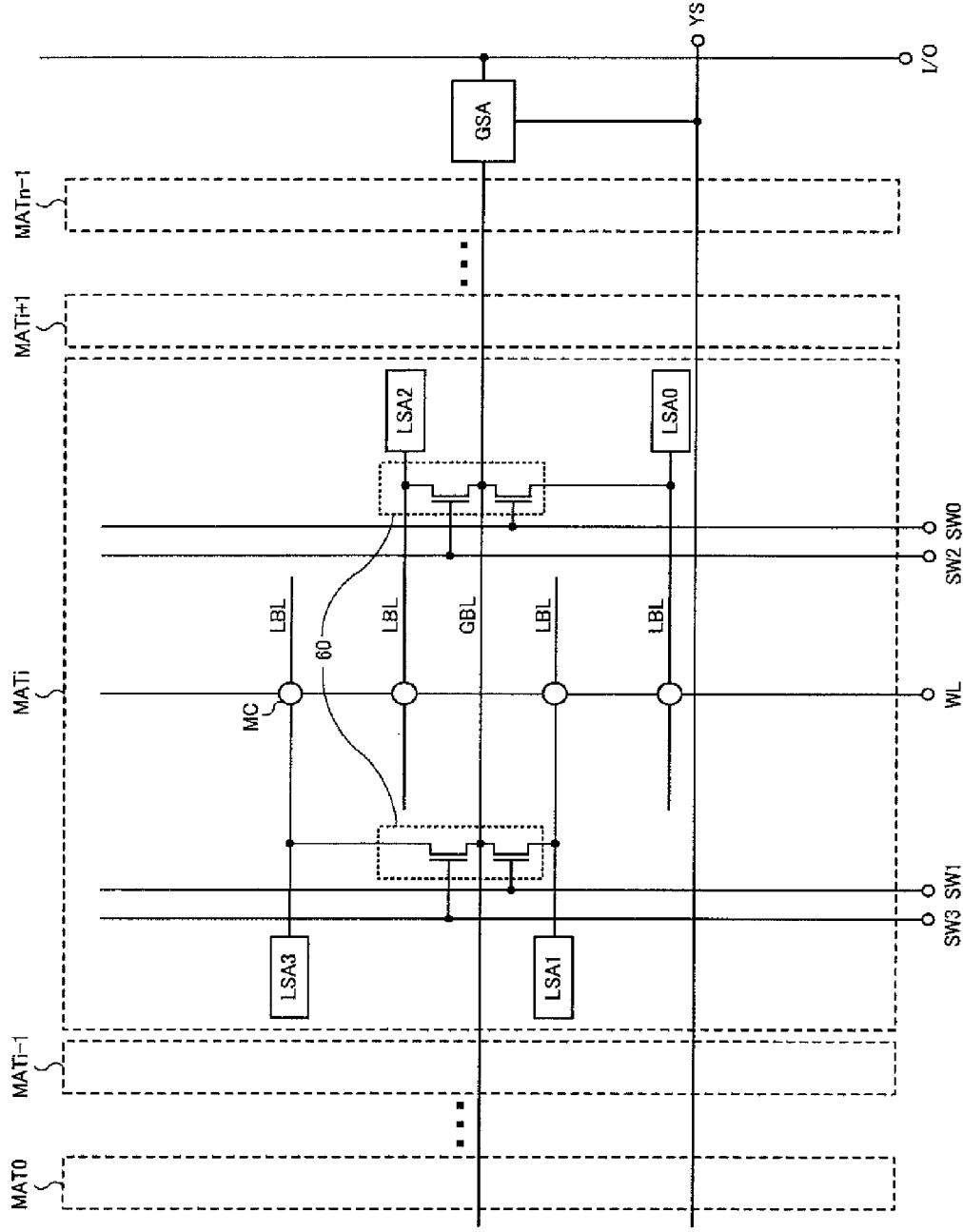
FIG. 23 is a diagram showing a configuration of the memory cell array 10 of an embodiment.

A semiconductor device of an embodiment will be described below. This embodiment describes a semiconductor device comprising a hierarchical memory cell array different from that of the above-described embodiments. FIGS. 2 and 3 described above are common to this embodiment, so description thereof will be omitted. FIG. 23 shows a configuration of the memory cell array 10 of this embodiment. The memory cell array 10 of this embodiment is divided into a plurality of memory mats MAT each as a unit area. In the example of FIG. 23, n (n: integer greater than 1) memory mats MAT0 to MATn−1 are aligned in a bit line extending direction.

Each memory mat MAT includes a plurality of memory cells MC arranged at intersections of a plurality of bit lines BL and a plurality of word lines WL. Further, one global bit line GBL is arranged corresponding to four local bit lines LBL. One end of each local bit line LBL is connected to one of bit line control circuits LSA. The bit line control circuits LSA are arranged alternately at both ends of the memory mat MAT. Further, a connection circuit 60 composed of four NMOS transistors is arranged between the four local bit lines LBL and the one global bit line GBL. The connection circuit 60 selectively connects one of the four local bit lines LBL to the global bit line GBL in response to four connection control signals SW0 to SW3.

The global bit line GBL extend over the plurality of memory mats MAT, and is connected to the global sense amplifier GSA at one end. Thus, the global bit line GBL is shared by the n memory mats, and is selectively connected to a selected one of n local bit lines LBL in the n memory mats MAT. Here, data of the memory cell MC on a selected word line WL is read out to the local bit line LBL, and a signal transmitted to the global bit line GBL through the connection circuit 60 is amplified and latched by the global sense amplifier GSA, which is restored into the memory cell MC. Data corresponding to the local bit lines LBL being not connected to the global bit line GBL is restored by using a restoring circuit for driving the local bit lines LBL that is included in the bit line control circuit LSA.

Although FIG. 23 shows only one global bit line GBL, a plurality of global bit lines GBL are arranged and the same number of global sense amplifiers GSA are arranged, in the memory cell array 10. Then, one global sense amplifier GSA selected by the selection signal YS is selectively connected to a data input/output line I/O, thereby inputting/outputting data from/to an external circuit (not shown) through the data input/output line I/O.

Figure 24:
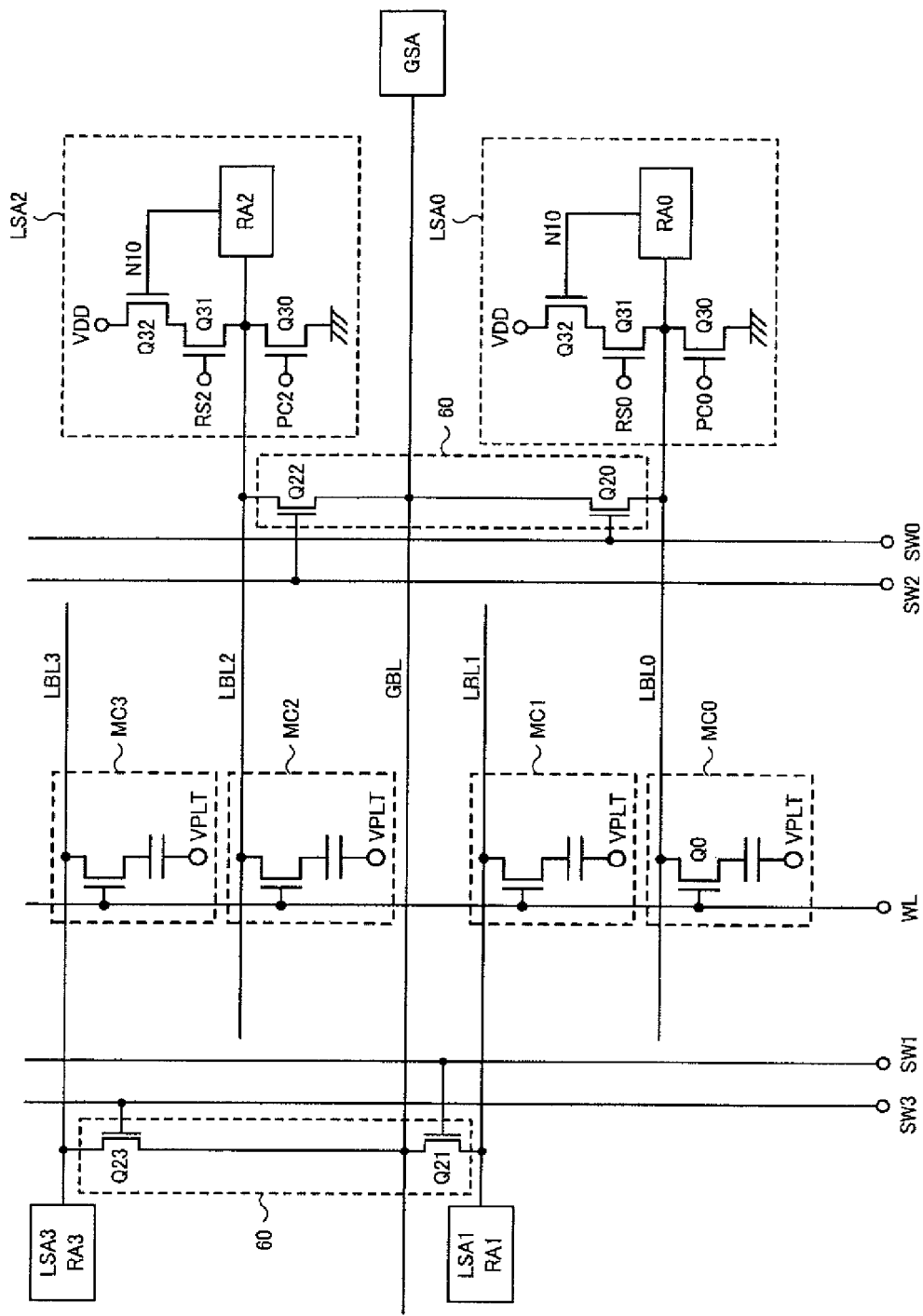
FIG. 24 is an enlarged diagram showing a partial configuration of one memory mat MAT in the configuration of FIG. 23.

FIG. 24 is an enlarged diagram showing a partial configuration of one memory mat MAT in the configuration of FIG. 23. FIG. 24 shows a range including one word line WL, four memory cells MC (MC0 to MC3), four local bit lines LBL (LBL0 to LBL3) and corresponding four bit line control circuits LSA (LSA0 to LSA3), one global bit line GBL, and one global sense amplifier GSA. The memory cells MC are arranged at intersections of the word line WL and the local bit lines LBL. Each memory cell MC has the same configuration as in FIG. 9. An NMOS transistor Q20 of the connection circuit 60 controls an electrical connection between the local bit line LBL and the global bit line GBL in response to the connection control signal SW0. Similarly, NMOS transistors Q21, Q22 and Q23 of the connection circuit 60 control electrical connections between the local bit line LBL 1, LBL2, LBL3 and the global bit line GBL in response to the connection control signals SW1, SW2 and SW3, respectively, in this order.

Each bit line control circuit LSA includes three NMOS transistors Q30, Q31 and Q32, and one restoring amplifier RA (RA0, RA1, RA2 or RA3). The NMOS transistor Q30 precharges the local bit line LBL to the ground potential VSS in response to a precharge signal PC. The NMOS transistor Q31 controls an electrical connection between the local bit line LBL and a drain of the NMOS transistor Q32 in response to a restoration control signal RS. The NMOS transistor Q32 has a gate coupled to a node N10 and a source supplied with a power supply voltage VDD, and a drain current corresponding to the potential of the node N10 flows through the NMOS transistor Q32 when the NMOS transistor Q31 is ON. The four bit line control circuits LSA0 to LSA3 corresponding to the four local bit lines LBL0 to LBL3 have the same circuit configuration.

Figure 25:
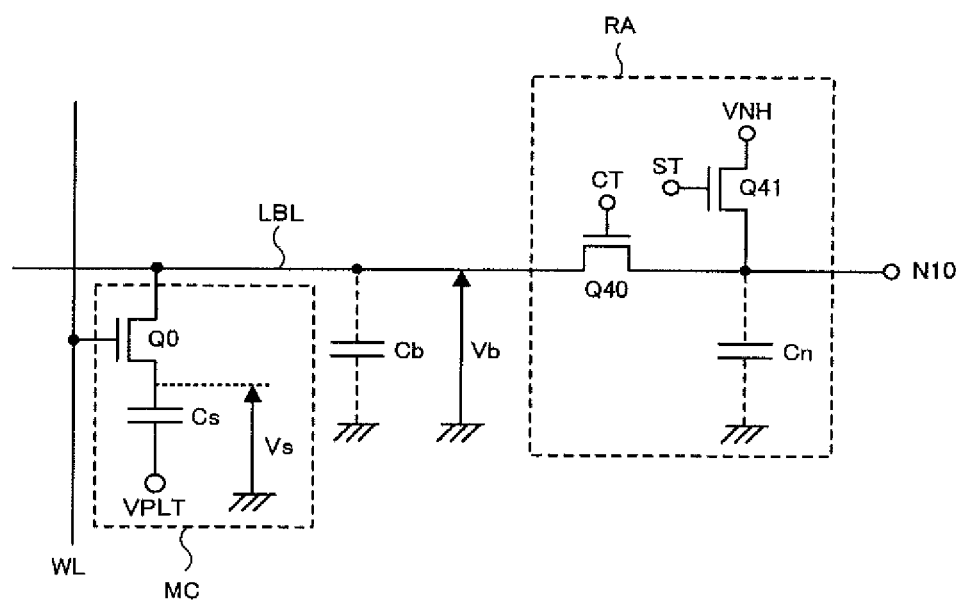
FIG. 25 is a diagram showing a circuit configuration example of a restoring amplifier RA of FIG. 24.

FIG. 25 shows a circuit configuration example of the restoring amplifier RA of FIG. 24. As shown in FIG. 25, the restoring amplifier RA is composed of two NMOS transistors Q40 and Q41. The NMOS transistor Q40 functioning as a charge transfer gate controls charge transfer between the local bit line LBL and the node N10 in response to a transfer control signal CT applied to its gate. The node N10 is coupled to the gate of the NMOS transistor Q32 (FIG. 24), as described above. The NMOS transistor Q41 for setting an initial potential precharges the node N10 to a voltage VNH in response to an initial setting signal ST applied to its gate. In a precharge operation, the NMOS transistor Q40 is turned off, and the local bit line LBL is precharged to the ground potential VSS while the node N10 is precharged to the voltage VNH, respectively. In an active state, before driving the word line WL, the NMOS transistor Q30 (FIG. 24) turns off so that the local bit line LBL becomes floating in a state of having the ground potential VSS, and the NMOS transistor Q41 turns off so that the node N10 becomes floating in a state of having the voltage VNH.

As shown in FIG. 25, a parasitic capacitance Cb exists at the local bit line LBL, and a parasitic capacitance Cn exists at the node N10. Here, when the word line WL driven to HIGH in an OFF state of the NMOS transistor Q40, a potential Vb appears on the local bit line LBL. The potential Vb at this point is determined by charge sharing between the parasitic capacitance Cb and the capacitor Cs (capacitance Cs) and is represented by a following formula (2), in which a potential Vs is a potential at an intermediate node between the capacitor Cs and the selection NMOS transistor Q0 in the memory cell MC (corresponds to a write voltage for the memory cell MC).

$$Vb = (Cs/(Cs+Cb))Vs \tag{2}$$

In addition, as to a charge transfer operation of the NMOS transistor Q40, from the same standpoint as the formula (1), a potential Vx2 is defined by a following formula (3), which includes a voltage value Vg40 of the transfer control signal CT in the charge transfer operation, and a threshold voltage Vt40 of the NMOS transistor Q40.

$$Vx2 = Vg40 - Vt40 \tag{3}$$

Further, a voltage Vc that is a voltage difference between the local bit line LBL and the node N10 after the charge transfer therebetween is performed can be represented by a following formula (4).

$$Vc = (CsVs + Cb \cdot VSS + Cn \cdot VNH)/(Cs+Cb+Cn) \tag{4}$$

(Here, VSS=0V)

Figure 26:
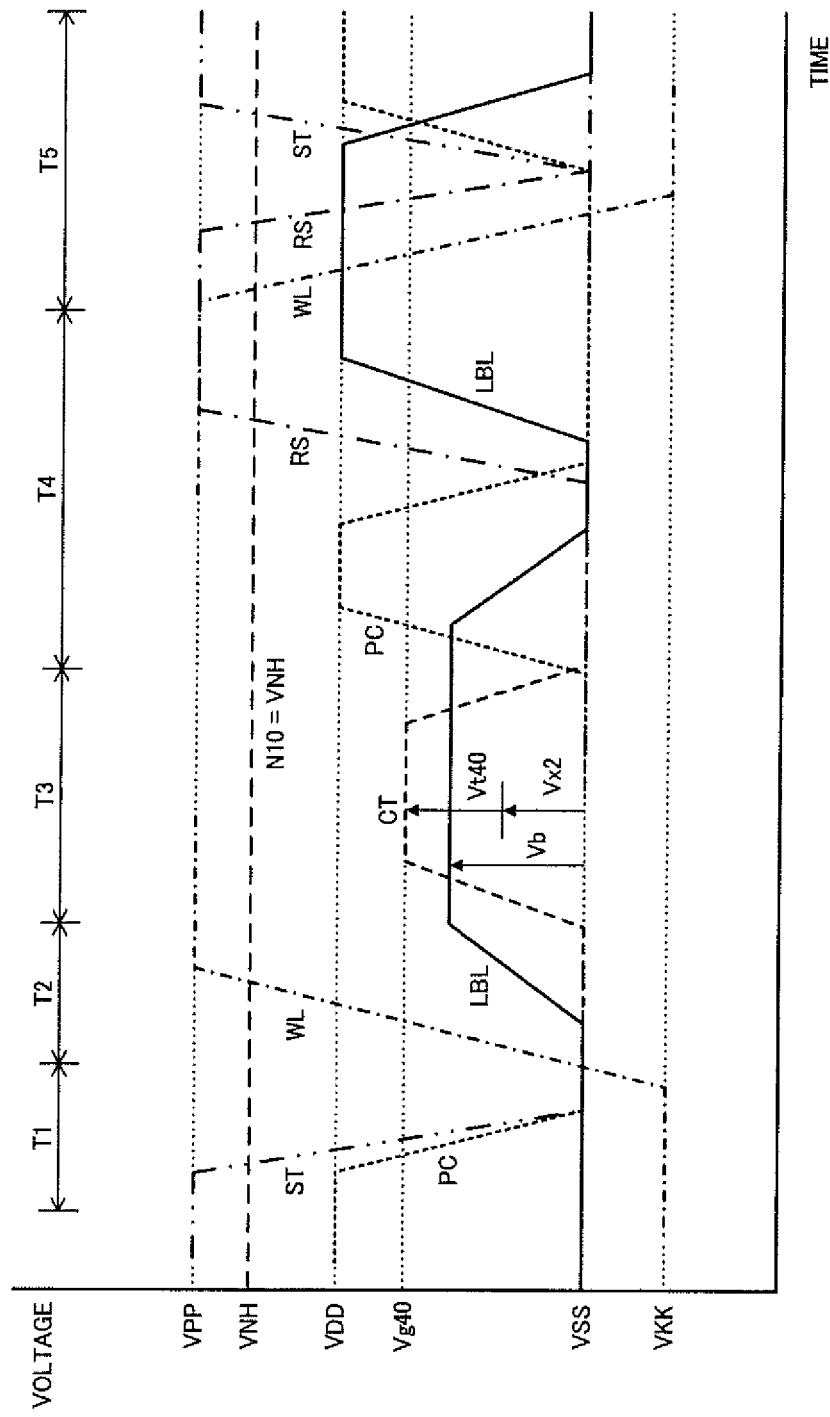
FIG. 26 is a diagram showing operation waveforms when reading high-level data stored in the memory cell MC and restoring the data in FIG. 23.

FIG. 26 shows operation waveforms when reading high-level data stored in the memory cell MC and restoring the data in the configuration of FIGS. 24 and 25. In the operation waveforms of FIG. 26, in an initial period before a precharge cancellation period T1, both the precharge signal PC and the initial setting signal ST are set to HIGH (PC=VDD, ST=VPP), the local bit line LBL is precharged to the ground potential VSS and the node N10 is precharged to the voltage VNH. Subsequently, during the precharge cancellation period T1, both the precharge signal PC and the initial setting signal ST are set to LOW (PC=ST=VSS), and the node N10 and the ground potential VSS become floating, respectively, in a precharged state.

During a cell selection period T2, the word line WL is driven from the voltage VKK as a negative potential to the voltage VPP, and the high-level data of the memory cell MC is read out to the local bit line LBL. At this point, if the potential Vs of the memory cell MC is, for example, Vs=VDD, the potential of the local bit line LBL rises to the potential Vb given by the formula (2). Subsequently, during a restoring amplifier operating period T3, the transfer control signal CT is set to the voltage value Vg40 for a certain period of time. At this point, since the potential Vx2 of the formula (3) is lower than the voltage value Vb, the NMOS transistor Q40 remains in an OFF state and the potential of the node N10 continues to be maintained at the voltage VNH.

During a restoration period T4, the precharge signal PC is set to HIGH (PC=VDD) for a certain period of time, and the local bit line LBL is discharged from the potential Vb to the ground potential VSS. Subsequently, when the restoration control signal RS is changed to HIGH (RS=VPP), the NMOS transistor Q31 turns on. At this point, since the node N10 is remained at the voltage VNH, the NMOS transistor Q32 is in an ON state. Therefore, the potential of the local bit line LBL rises to the power supply voltages VDD, and the high-level data is restored into the memory cell MC. Thereafter, during a precharge period T5, the precharge signal PC and the initial setting signal ST are set to HIGH (PC=VDD, ST=VPP), the local bit line LBL is precharged to the ground potential VSS and the node N10 is precharged to the voltage VNH, respectively, and thus the operation of FIG. 26 is completed.

Figure 27:
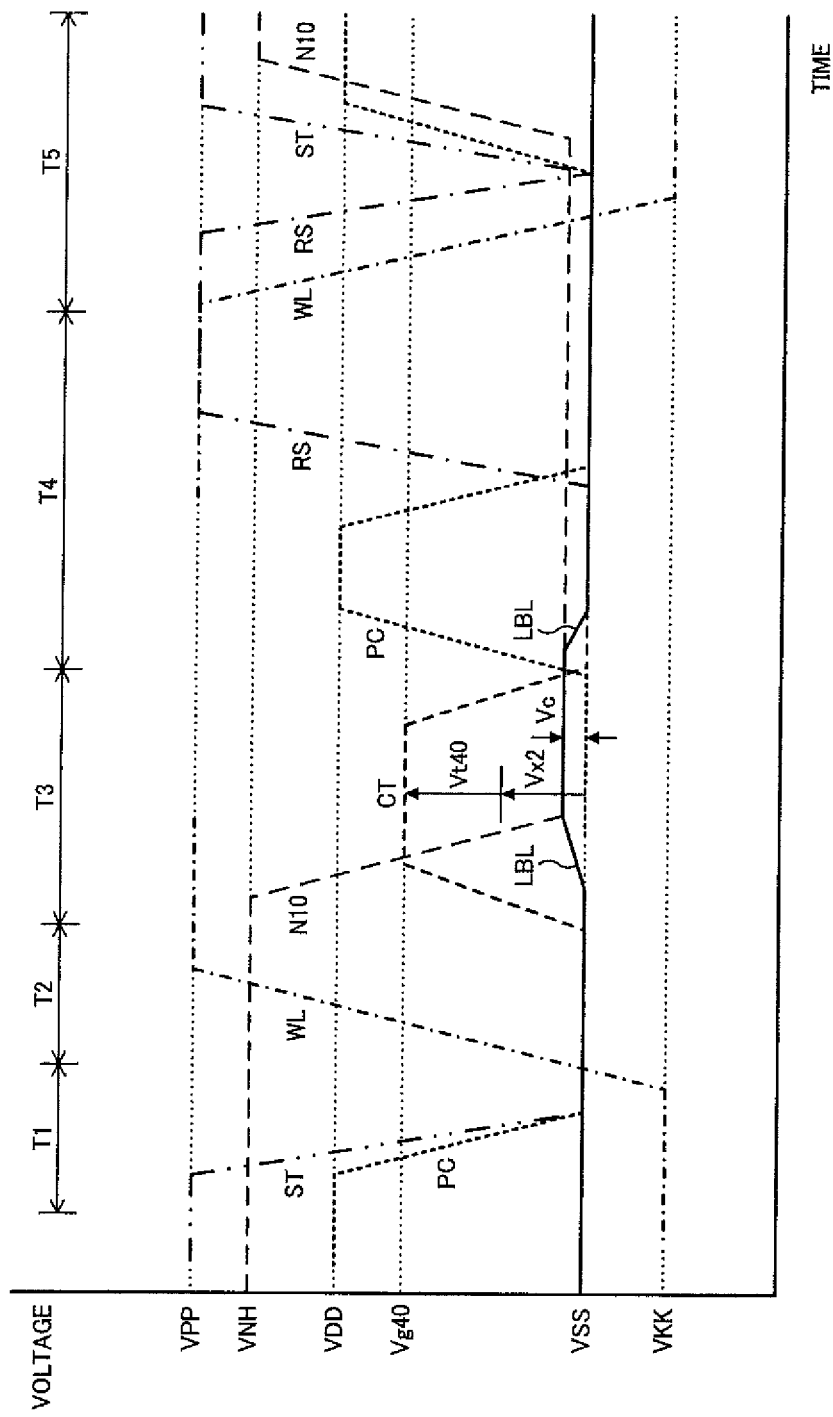
FIG. 27 is a diagram showing operation waveforms when reading low-level data stored in the memory cell MC and restoring the data in FIG. 23.

Next, FIG. 27 shows operation waveforms when reading low-level data stored in the memory cell MC and restoring the data in the configuration of FIGS. 24 and 25. In FIG. 27, operation waveforms from the initial period to the precharge cancellation period T1 are the same as those in FIG. 26. Meanwhile, when the word line WL is driven to the voltage VPP so that the low-level data is read out from the memory cell MC to the local bit line LBL during the cell selection period T2, assuming that the potential Vs of the memory cell MC is equal to the grand potential VSS, for example, the potential of the local bit line LBL is maintained at the ground potential VSS in accordance with the formula (2). Subsequently, during the restoring amplifier operating period T3, the transfer control signal CT is set to the voltage value Vg40 for a certain period of time so that the NMOS transistor Q40 turns on, and the electric charge is transferred from the node N10 to the local bit line LBL. At this point, since the potential Vx2 of the formula (3) is higher than the voltage Vc of the formula (4), the transistor Q40 remains on until the charge sharing between the node N10 and the local bit line LBL is completed. As a result, the potential of the local bit line LBL rises to the voltage Vc, and the potential of the node N10 drops to the voltage Vc.

During the restoration period T4, the precharge signal PC is set to HIGH (PC=VDD) for a certain period of time, and the local bit line LBL is discharged from the voltage Vc to the ground potential VSS. Subsequently, when the restoration control signal RS is set to HIGH (RS=VPP) so that the NMOS transistor Q31 turns on, the NMOS transistor Q32 is in an OFF state since the node N10 is maintained at the voltage Vc. Therefore, the potential of the local bit line LBL becomes floating in a state of having the ground potential VSS, and the low-level data is restored into the memory cell MC. Thereafter, during the precharge period T5, the precharge operation is performed in the same manner as in FIG. 26, and the refresh operation of FIG. 27 is completed.

In addition, the bit line control circuit LSA and the connection circuit 60 in FIG. 23 can be replaced with either of the bit line control circuits LSA (FIGS. 9, 14, 17 and 20) in the embodiments. In this case, four lines may be provided for each of the signals RT and WT for selectively connecting the bit line control circuits LSA to the global bit line GBL, in the same manner as in the configuration of FIGS. 23 and 24 in which there are provided the four connection control signals SW0 to SW3 corresponding to the four bit line control circuits LSA.

Next, a case of applying the configuration and operation shown in FIGS. 23 to 27 to a page access mode of DRAM will be described. In the page access mode of DRAM, generally a state in which a word line WL is selected and a sense amplifier is activated is maintained for a long time (Hereinafter, referred to as "active period"), and in this state, a consecutive read or write operation of data is performed for the sense amplifier. In a semiconductor device having the configuration of FIG. 23, local bit lines LBL that are not connected to the global bit line GBL during the active period continue a state in which performing the restoring operation using the bit line control circuits LSA. In this state, when restoring the low-level data, the local bit lines LBL maintain the low-level data in a floating state, as described above. Therefore, when leak current flows into each local bit line LBL, the potential of the local bit line LBL floats (rises). Measures for preventing such floating of the potential of the local bit line LBL will be described below.

Figure 28:
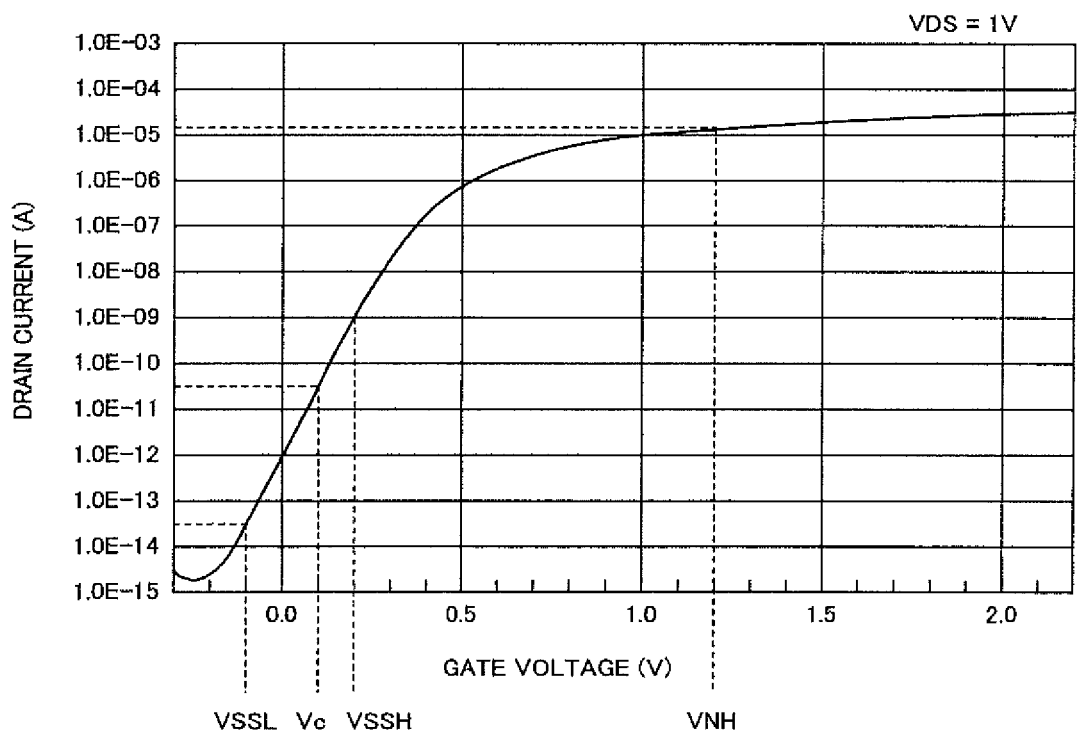
FIG. 28 is a diagram showing an example of voltage-current characteristics of an NMOS transistor FIG. 23.

FIG. 28 shows an example of voltage-current characteristics of an NMOS transistor (for example, NMOS transistors Q20, Q30 and Q32 of FIG. 24), which indicates a change in drain current (vertical axis) relative to a gate voltage (horizontal axis) when a drain-source voltage VDS is 1V. When the local bit line LBL maintains the low-level data in a floating state in the restoring operation, the gate of the NMOS transistor Q20 and the gate and source of the NMOS transistor Q30 are all at the ground potential VSS. Further, the respective drains of the NMOS transistors Q20 and Q32 are, for example, at the power supply voltages VDD. Further, the gate of the NMOS transistor Q32 is at the voltage Vc. Here, assuming that VSS=0V, VDD=0.8V, VNH=1.2V, Vc=0.1V, and the potential of the local bit line LBL is 0V, for example, leak currents flowing from the power supply voltages VDD to the local bit line LBL include a leak current of about $1\times10^{-12}$ A flowing through the NMOS transistor Q20 and a leak current of about $3\times10^{-11}$ A flowing through the NMOS transistor Q32 and the NMOS transistor Q31 in the ON state.

The measures for preventing the floating of the potential of the local bit line LBL will be described below. A first measure is to control the gate voltage of the NMOS transistor Q30 of the bit line control circuit LSA to a voltage (voltage VSSH) slightly higher than 0V. For example, as shown in FIG. 28, assuming a setting of VSSH=0.2V, it is possible to flow a current of about $1\times10^{-9}$ A through the NMOS transistor Q30 into the ground potential VSS, thereby preventing the potential of the local bit line LBL from being floating from 0V. At this point, when the local bit line LBL maintains the high-level data to be restored, the node N10 is maintained at the voltage VNH. However, since the voltage VNH is set to 1.2V, as shown in FIG. 28, an ON current of the NMOS transistor Q32 whose gate is coupled to the node N10 is about $2\times10^{-5}$ A. This value of the ON current is larger than the current flowing through the NMOS transistor Q30 into the ground potential VSS (about $1\times10^{-9}$ A) by at least about quadruple digits, and therefore the local bit line LBL maintaining the high-level data is not affected.

A second measure is to control the gate voltage of the NMOS transistor Q20 of the connection circuit 60 to a voltage (voltage VSSL) slightly lower than 0V ant to set a threshold voltage Vt32 of the NMOS transistor Q32 to be higher than its present value. For example, as shown in FIG. 28, assuming a setting of VSSL=−0.1V, the leak current flowing into the local bit line LBL through the NMOS transistor Q20 is reduced from about $1\times10^{-12}$ A to $3\times10^{-14}$ A. Then, if the threshold voltage Vt32 of the NMOS transistor Q32 is set higher than the present value by 0.2V, the graph shown in FIG. 28 is shifted rightward by 0.2V, and therefore the leak current flowing into the local bit line LBL through the NMOS transistors Q31 and the NMOS transistors Q32 that is in the ON state is reduced from about $3\times10^{-11}$ A to $3\times10^{-14}$ A. Thereby, it is possible to delay the time at which the potential of the local bit line LBL becomes floating by at least a single digit. Further, by combining the second measure with the first measure, it is possible to reduce the total amount of leak currents flowing from the power supply voltages VDD to the ground potential VSS through the NMOS transistor Q30 during the active period, thereby reducing the consumption current.

Figure 29:
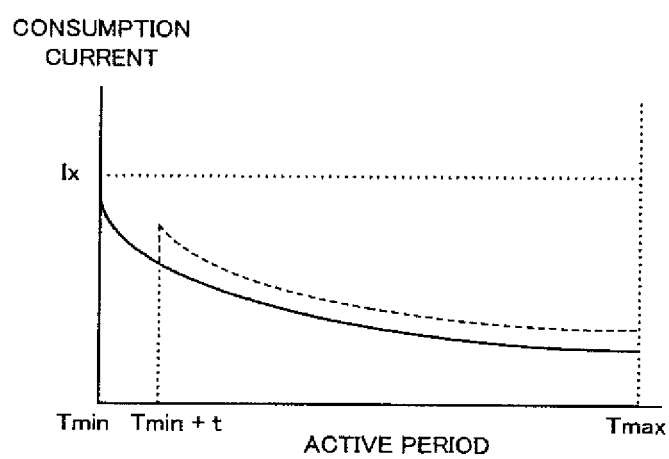
FIG. 29 is a diagram showing a change in consumption current during an active period when applying a control of FIG. 23.

Since the first and second measures are measures for preventing the floating of the potential of the local bit line LBL due to the leak current during the active period, the measures are effective when the active period is long. However, despite that the above effectiveness decreases when the active period is short, there arises a problem that the consumption current increases. In general, specifications for the DRAM define a minimum time Tmin and a maximum time Tmax for the active period. The first and second measures may be applied after passage of a time Tmin+T (T is a predetermined time after the minimum time Tmin) from the start of the active period. When controlling in such a manner, FIG. 29 shows a change in consumption current during the active period. As shown in FIG. 29, relative to a case of not applying the measures for preventing the floating of the potential of the local bit line LBL (solid line), a case of applying the measures after the passage of the time Tmin+t (solid line) makes it possible to prevent a decrease in margin for a specified value Ix of the increased consumption current corresponding to the minimum time Tmin in the active period. Further, even when implementing a later-mentioned floating prevention control circuit, it is not required to prolong the active period longer than necessary in an operation mode such as auto refresh mode or self refresh mode in which only the restoring operation is performed, and thus it is possible to suppress the increase in consumption current without applying the measures for preventing the floating of potential of the local bit line LBL.

Figure 30:
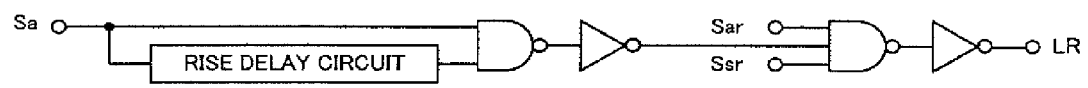
FIG. 30 is a diagram showing a first circuit configuration example of a floating prevention control circuit.
Figure 30:
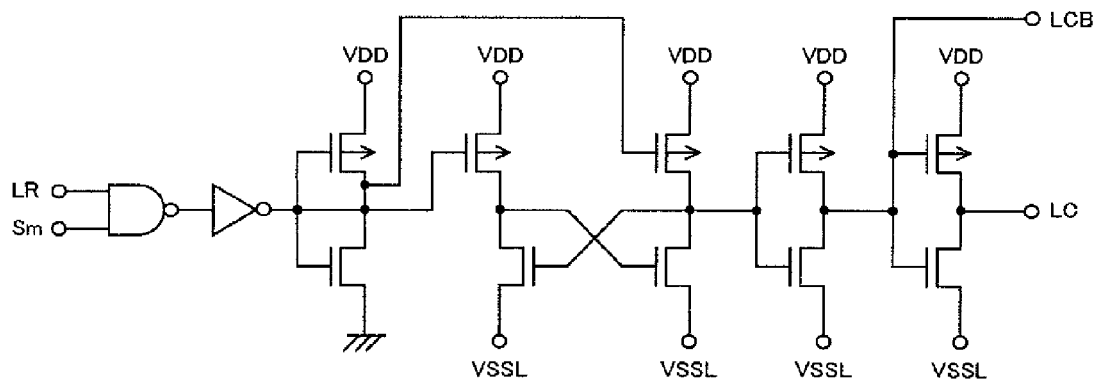
Figure 31:
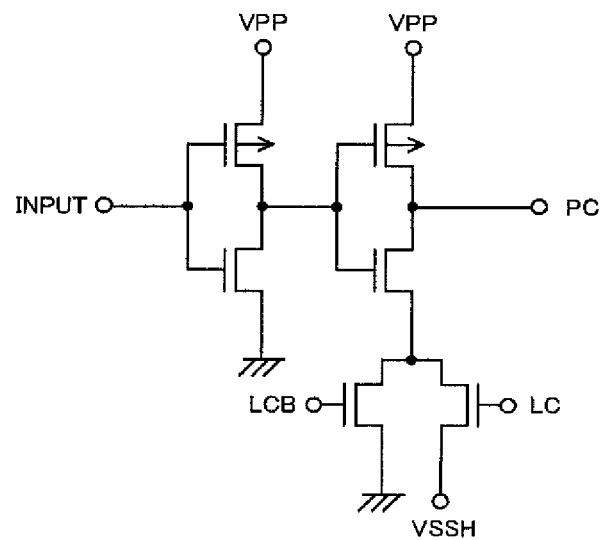
FIG. 31 is a diagram showing a second circuit configuration example of the floating prevention control circuit.
Figure 31:
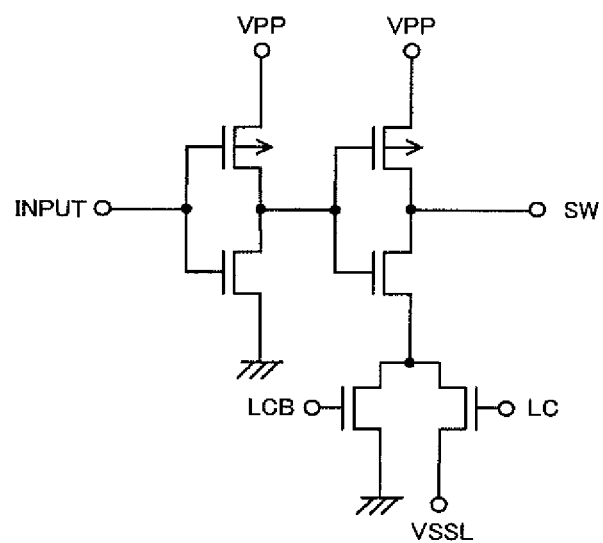
Figure 32:
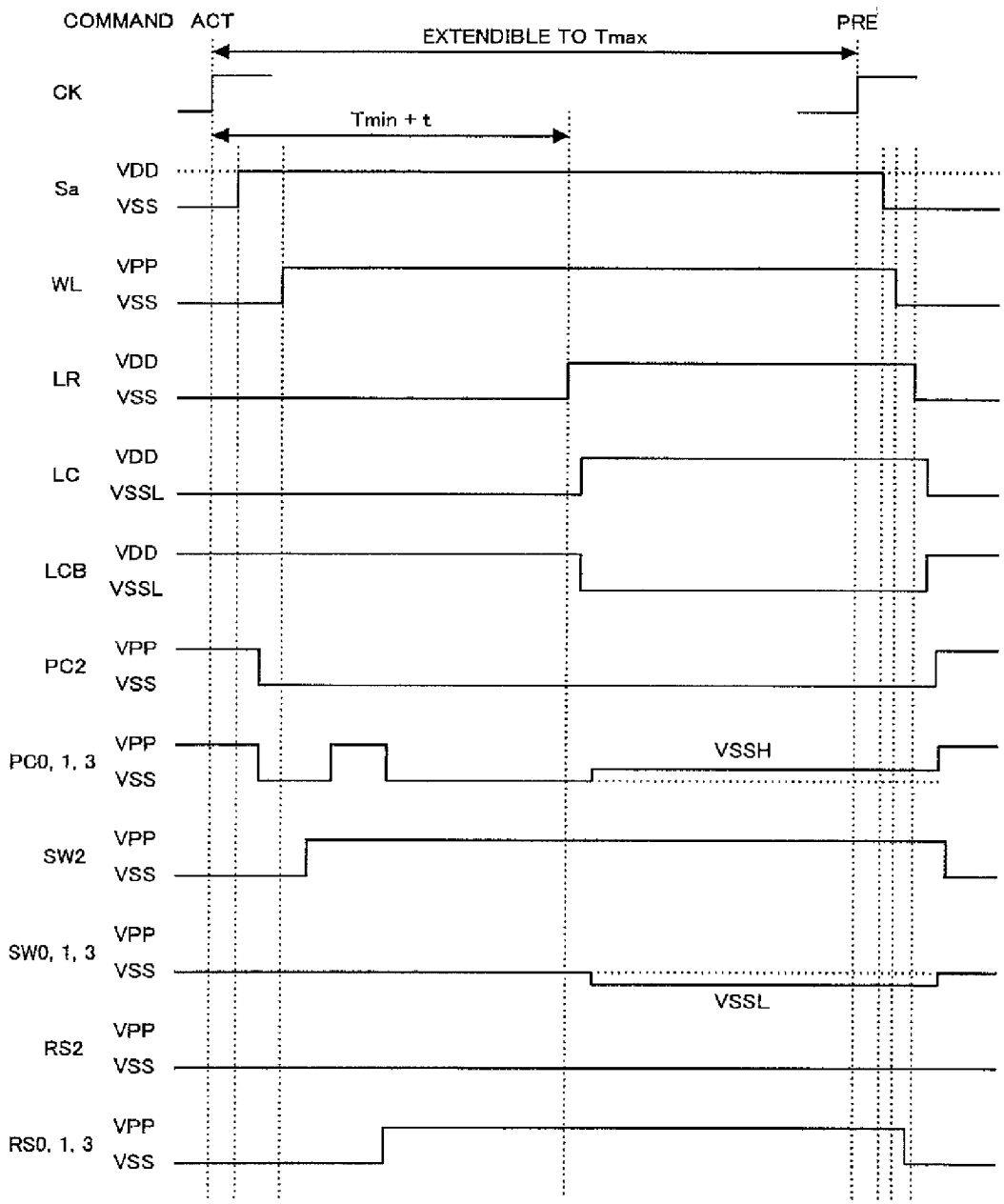
FIG. 32 is a diagram showing operation waveforms when controlling using the floating prevention control circuit of FIG. 30 or 31.

Next, specific circuit configuration and operation of the floating prevention control circuit for preventing the floating of the potential of the local bit line LBL will be described. FIG. 30 shows a first circuit configuration example of the floating prevention control circuit. FIG. 31 shows a second circuit configuration example of the floating prevention control circuit. FIG. 32 shows operation waveforms when controlling using the floating prevention control circuit of FIG. 30 or 31. The first circuit configuration example of FIG. 30 includes logic circuits and ten MOS transistors, while the second circuit configuration example of FIG. 31 includes only twelve MOS transistors.

In FIG. 32, when the ACT command being received in an initial period is acquired by a clock CK so that the active period is stared, a control signal Sa is set to HIGH, and rising thereof is delayed by a rise delay circuit of FIG. 30. A delay time thereof is equal to the time Tmin+t (see FIG. 29). The control signal Sa delayed in this manner is transmitted through a first NAND gate and inputted to a second NAND gate, as shown in FIG. 30, and a control signal LR is generated via an inverter. The second NAND gate receives control signals Sar and Ssr used for the refresh operation, the control signal Sar is set to LOW in the auto refresh mode, and the control signal Ssr is set to LOW in the self refresh mode. As shown in FIG. 32, the control signal LR rises at a timing at which the Tmin+t elapsed from the receiving timing of the ACT command. The word line WL is selected during a period until the control signal LR rises, one local bit line LBL2 of four adjacent local bit lines LBL0 to LBL3 is connected to the global bit line GBL, and other local bit lines LBL0, LBL1 and LBL3 are used in the restoring operation for data thereof. Data of the memory cell MC that is read out to the local bit line LBL 2 is transmitted to the global sense amplifier GSA through the NMOS transistor Q22 (FIG. 24) and the global bit line GBL, and is restored by the global sense amplifier GSA. Therefore, the bit line control circuit LSA2 is not used in this restoring operation.

As shown in the lower side of FIG. 30, the control signal LR is used in an AND operation with a MAT selection signal Sm for selecting a memory mat MAT to which the word line WL to be activated and the bit line control circuit LSA belong. Then, when the control signal LR is set to HIGH, a control signal LCB is changed to LOW and a control signal LC is changed to HIGH, corresponding to a selected memory mat MAT. In addition, the low level of the control signals LCB and LC is at the voltage VSSL via a level convert circuit. Further, as shown in the upper side of FIG. 31, assuming that an input from a control circuit (not shown) is LOW, the control signal LCB is LOW and the control signal LC is HIGH, the low level of respective precharge signals PC0, PC1 and PC3 are changed from the ground potential VSS to the voltage VSSH. Meanwhile, as shown in the lower side of FIG. 31, assuming that the input from the control circuit (not shown) is LOW, the control signal LCB is LOW and the control signal LC is HIGH, the low level of respective connection control signals SW0, SW 1 and SW3 are changed from the ground potential VSS to the voltage VSSL.

In FIG. 32, the active period ends when the PRE command being received in the precharge operation is acquired by the clock CK, the control signal Sa is set to LOW, and subsequently the word line WL returns to LOW. Thereafter, the control signal LR is set to LOW, the control signal LCB is set to HIGH, and the control signal LC is set to LOW. Finally, the precharge signal PC is set to HIGH, the connection control signal SW is set to LOW, the restoration control signal RS is set to LOW, and the active period ends.

As described above, in the configuration of FIG. 23, four local bit lines LBL are selectively connected to one global bit line GBL by the connection circuits 60, and data of the memory cell MC is restored by the bit line control circuit LSA as the restoring circuit provided for each local bit line LBL. Thereby, it is possible to obtain an effect of broadening the wiring pitch of global bit lines GBL relative to the wiring pitch of local bit lines LBL. Then, this effect enables a reduction in the number of global sense amplifiers GSA connected to one ends of the global bit lines GBL, thereby reducing the circuit scale. Thus, it is possible to reduce an area of the chip CHIP in which the memory cell array 10 with the hierarchical bit line structure is provided. Further, by providing the floating prevention control circuit for preventing the floating of the potential of the local bit line LBL in addition to the above configuration, it is possible to prevent a decrease in efficiency of the restoring operation of the low-level data by preventing the floating of the potential of the local bit line LBL without an increase in area of the restoring circuit.

In the above description, the operation in which data is restored through the bit line control circuit LSA has been mainly described. However, in the configuration of FIG. 23, it is effective to appropriately control the restoring operation through the bit line control circuit LSA and the restoring operation through the global sense amplifier GSA. A relation between operation modes in the semiconductor device having the configuration of FIG. 23 and each of the restoring operations of the bit line control circuit LSA and the global sense amplifier GSA will be additionally described below.

Figure 33:
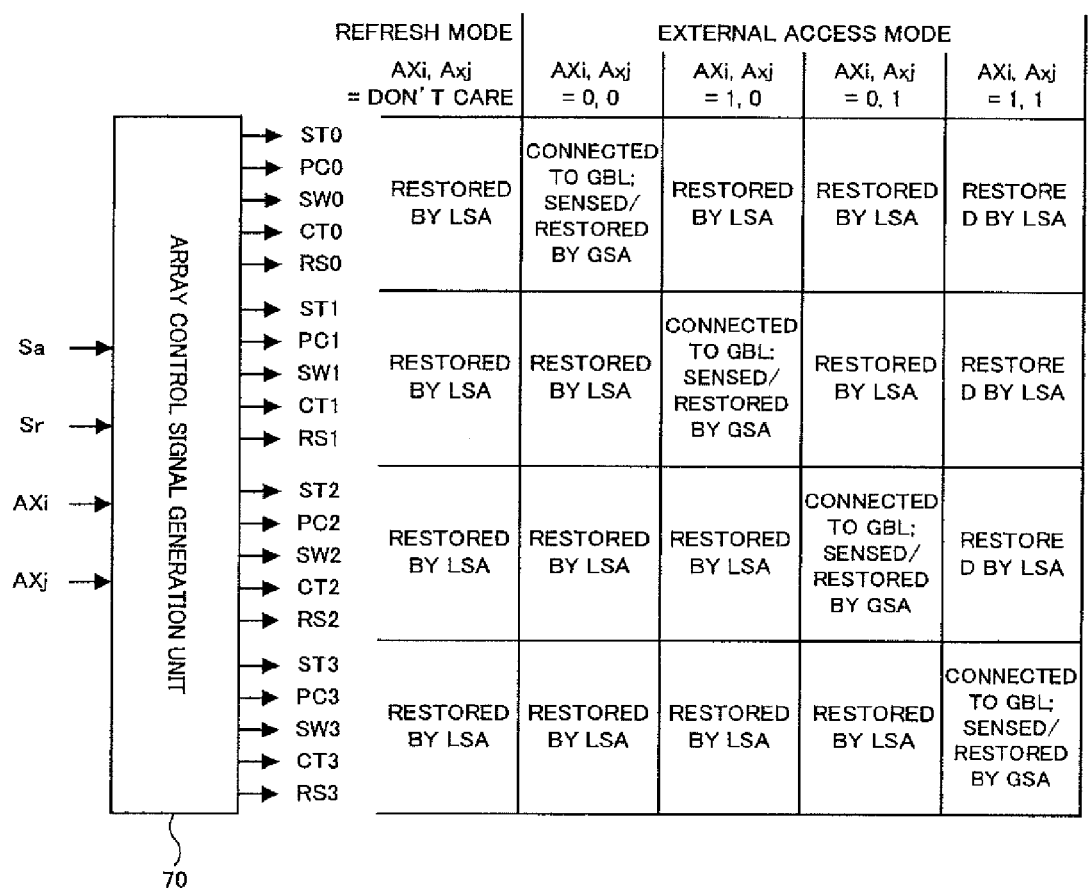
FIG. 33 is a diagram explaining a relation between operation modes and control signals in association with four local bit lines LBL0 to LBL3 of FIG. 24.

FIG. 33 is a diagram explaining the relation between the operation modes and control signals in association with the four local bit lines LBL0 to LBL3 of FIG. 24. FIG. 33 shows control signals generated by an array control signal generation unit 70, including the initial setting signal ST, the precharge signal PC, the connection control signal SW, the transfer control signal CT and the restoration control signal RS, in which the signals are postfixed with numbers 0 to 3 respectively in order to indicate corresponding relations with the bit line control circuits LSA0 to LSA3. The array control signal generation unit 70 receives control signals Sa and Sr, and addresses AXi and AXj of 2 bits, and an operation mode is set in accordance with them. Here, the control signal Sr corresponds to the control signal Sar or Ssr associated with the refresh operation in FIG. 30.

Figure 34:
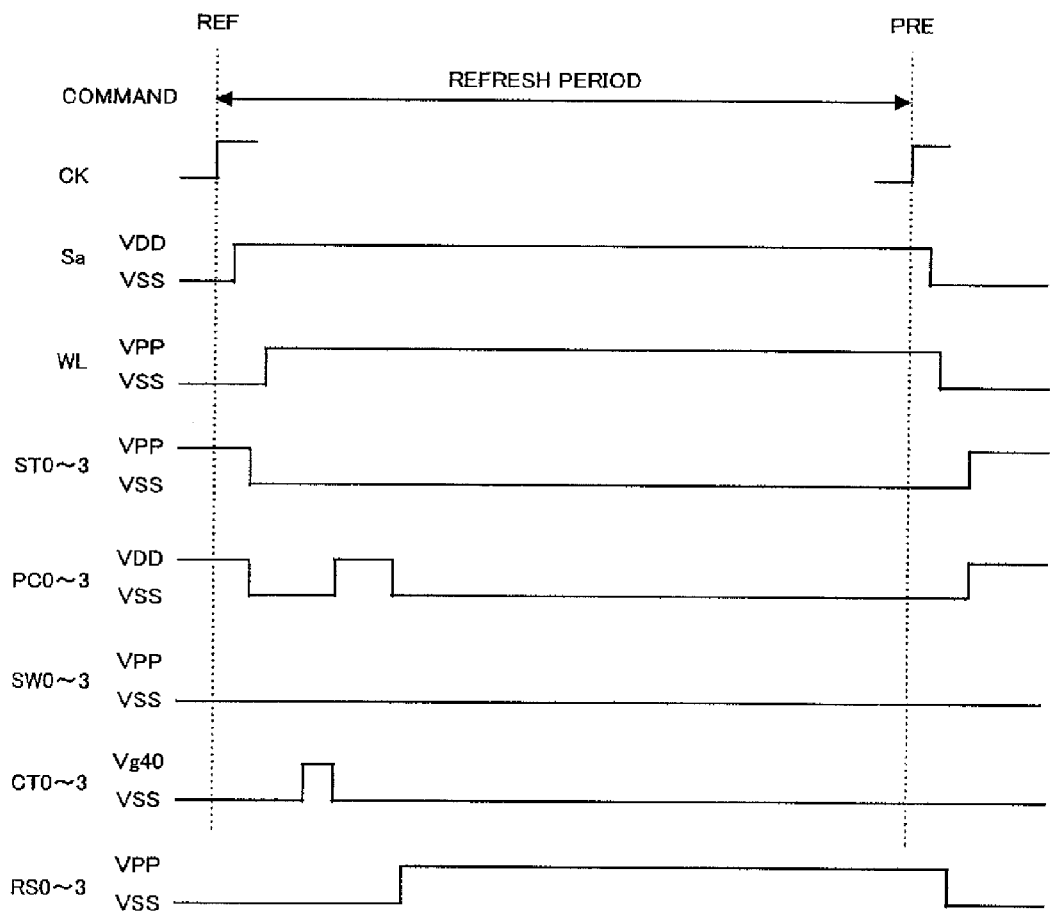
FIG. 34 is a diagram showing an example of control signal waveforms when a refresh mode is set in FIG. 33.

As shown in FIG. 33, the operation modes includes a refresh mode and an external access mode that are settable in accordance with a pattern of the addresses AXi and AXj, and the external access mode is further divided into four control patterns. When the refresh mode is set, the restoring operation is performed using the bit line control circuit LSA for all the four local bit lines LBL. On the other hand, when the external access mode is set, the restoring operation is performed using the global sense amplifier GSA for one of the four local bit lines LBL corresponding to the pattern of the addresses AXi and AXj, and the restoring operation is performed using the corresponding bit line control circuits LSA for other three local bit lines LBL. Here, the one of the four local bit lines LBL for which the restoring operation is performed using the global sense amplifier GSA is connected to the global bit line GBL by setting the connection control signal SW to go into a conductive state, FIG. 34 shows an example of control signal waveforms when the refresh mode is set in FIG. 33. In FIG. 34, a refresh period is started by receiving the REF command so that the control signal Sa rises, the precharge signal PC and the initial setting signal ST are changed from HIGH to LOW, and the precharged state of the local bit line LBL and the node N10 is cancelled. Subsequently, after the word line WL is driven to the voltage VPP, the transfer control signal CT is set to the voltage value Vg40 for a certain period of time, and subsequently a series of restoring operations are performed. Thereafter, the refresh period ends when receiving the PRE command, and the local bit line LBL and the node N10 are returned to the precharged state.

Figure 35:
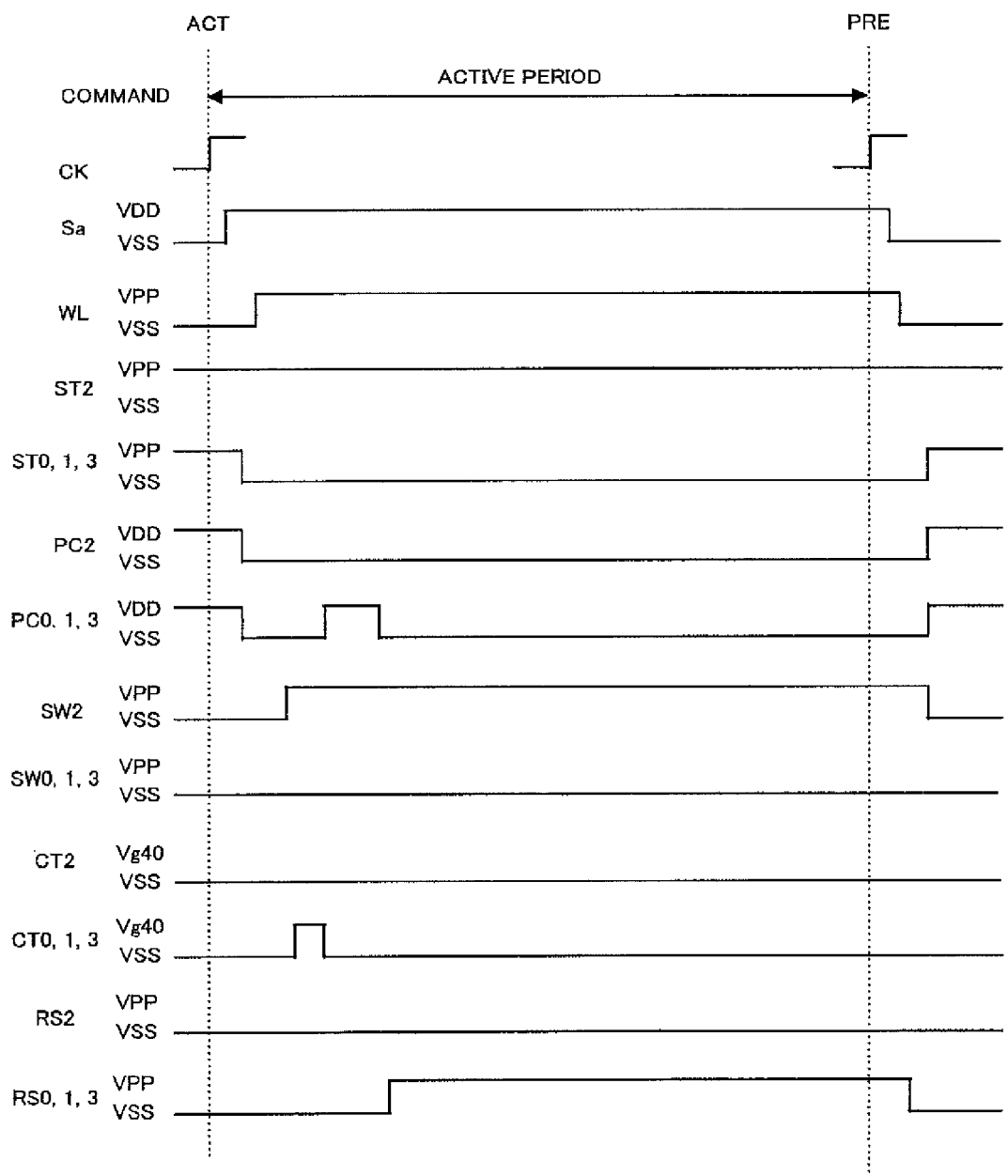
FIG. 35 is a diagram showing an example of control signal waveforms when an external access mode corresponding to a pattern of (AXi, AXj)=(0, 1) is set in FIG. 33.

Meanwhile, FIG. 35 shows an example of control signal waveforms when the external access mode corresponding to a pattern of (AXi, AXj)=(0, 1) is set in FIG. 33. In FIG. 35, the active period is started by receiving the ACT command so that the control signal Sa rises, a series of restoring operations for the three local bit lines LBL0, LBL1 and LBL3 are performed using the respective bit line control circuits LSA in the same manner as in FIG. 34. On the other hand, as to the one local bit line LBL2, the connection control signal SW2 is set to HIGH after driving the word line WL, and the local bit line LBL2 is connected to the global bit line GBL via the NMOS transistor Q22. Thereafter, the sensing/amplifying operation and the restoring operation are performed by the global sense amplifier GSA through the global bit line GBL.

Figure 36:
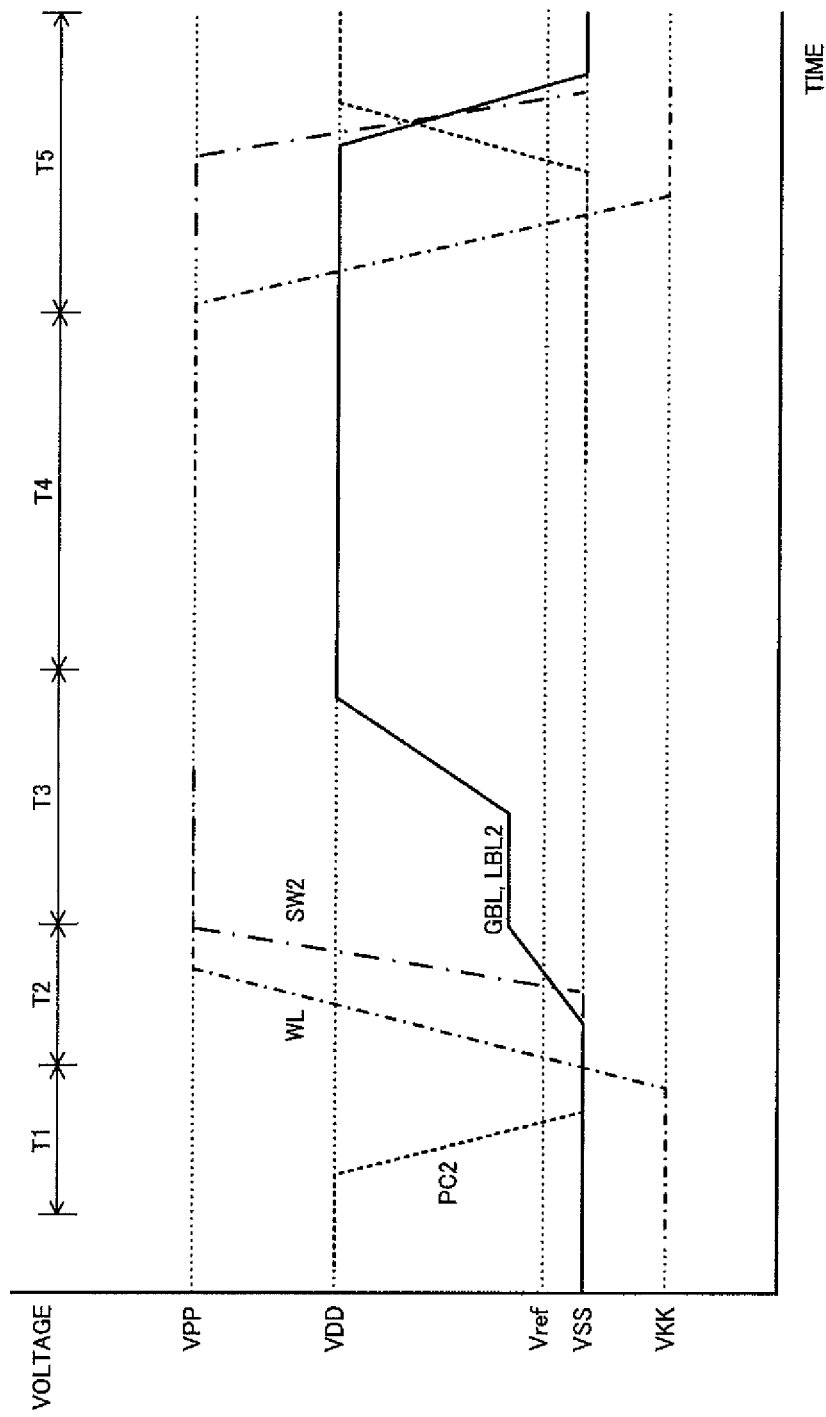
FIG. 36 is a diagram showing operation waveforms when reading high-level data stored in the memory cell MC connected to the local bit line LBL2 and restoring the data in a control state of FIG. 35.

FIG. 36 shows operation waveforms when reading high-level data stored in the memory cell MC connected to the local bit line LBL2 and restoring the data in a control state of FIG. 35. As to the operation waveforms of FIG. 36, points common to those in FIG. 26 will be omitted. In FIG. 36, since the connection control signal SW2 is set to HIGH after the word line WL is driven during the cell selection period T2, the high-level data of the memory cell MC is read out to the local bit line LBL2, and further a signal of the local bit line LBL2 is transmitted to the global bit line GBL. The global sense amplifier GSA is configured using a general differential latch type sense amplifier, in which the potential of the global bit line GBL is compared with a reference voltage Vref and is amplified (latched) to the power supply voltages VDD since the potential of the global bit line GBL is higher than the reference voltage Vref. Thereafter, when the global sense amplifier GSA is selected, the latched read data is outputted to outside (not shown). Further, the read data latched in the global sense amplifier GSA is restored into the memory cell MC through the global bit line GBL and the local bit line LBL2.

Figure 37:
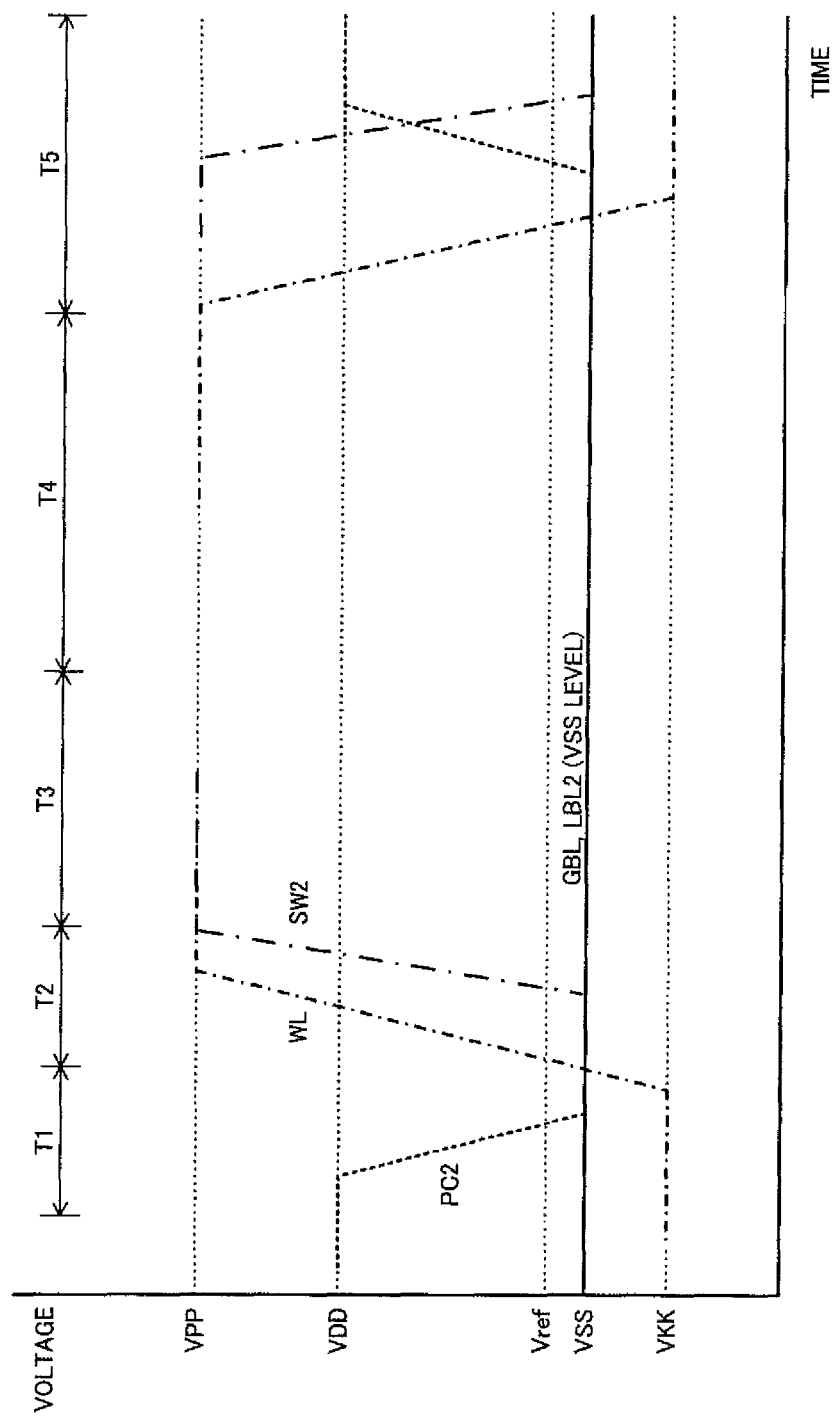
FIG. 37 is a diagram showing operation waveforms when reading low-level data stored in the memory cell MC connected to the local bit line LBL2 and restoring the data in the control state of FIG. 35.

FIG. 37 shows operation waveforms when reading low-level data stored in the memory cell MC connected to the local bit line LBL2 and restoring the data in the control state of FIG. 35. Operation waveforms other than those for the local bit line LBL2 and the global bit line GBL are common to those of FIG. 36, so description thereof will be omitted. In FIG. 37, since the low-level data of the memory cell MC is read out to the local bit line LBL2 during the cell selection period T2, the potentials of the local bit line LBL2 and the global bit line GBL are maintained at the ground potential VSS. Thus, the potential of the global bit line GBL is lower than the reference voltage in the global sense amplifier GSA, and therefore is amplified (latched) to the ground potential VSS. Thereafter, the latched read data is outputted to outside and restored (not shown) by the global sense amplifier GSA in the same manner as in FIG. 36.

Figure 38:
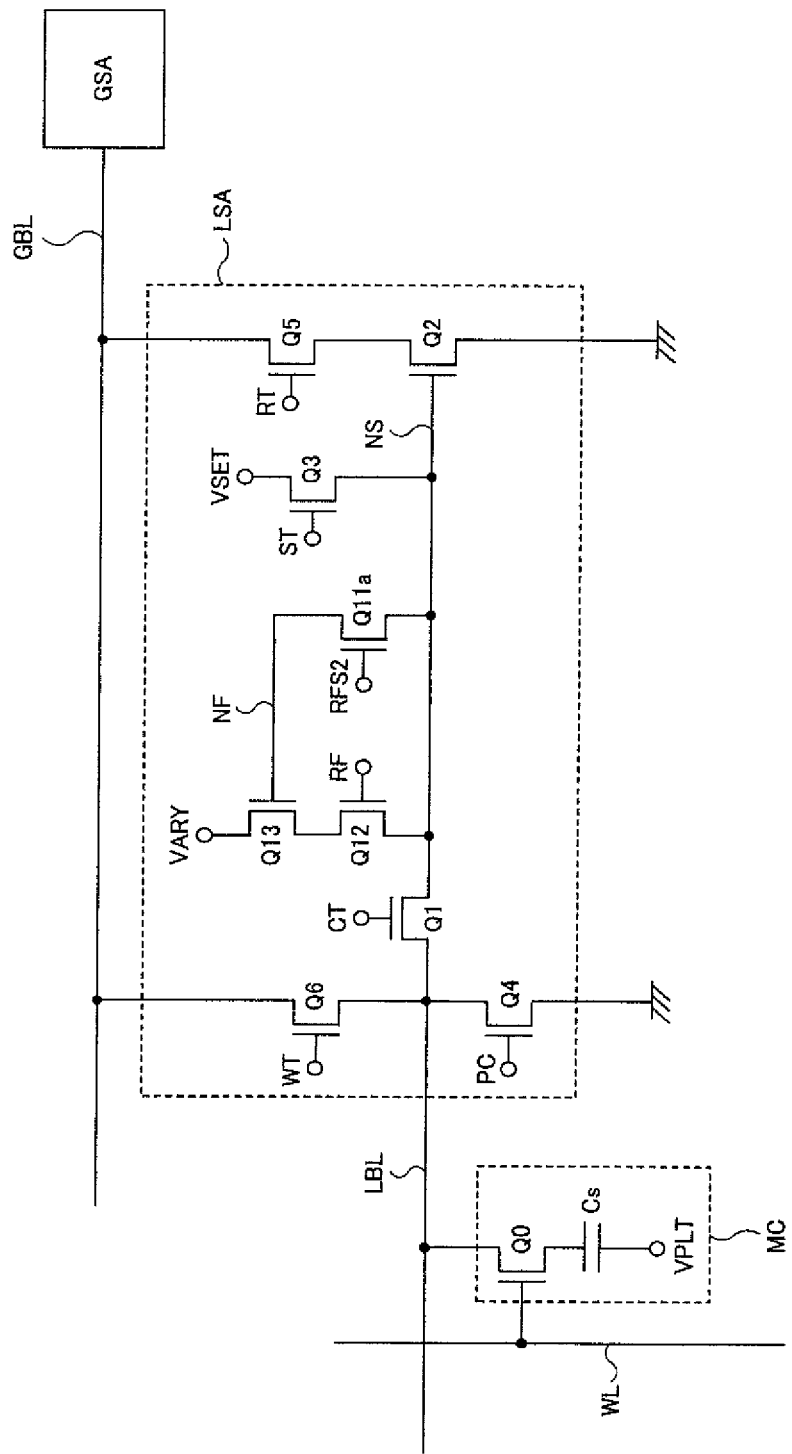
FIG. 38 is a diagram showing a circuit portion of one bit line control circuit LSA, one global sense amplifier GSA, and one memory cell MC in a circuit configuration of an embodiment.

A semiconductor device of an embodiment will be described below. FIGS. 2 and 3 described above are common to this embodiment, so description thereof will be omitted. FIG. 38 shows a circuit portion of one bit line control circuit LSA, one global sense amplifier GSA, and one memory cell MC in a configuration example. Among these, the memory cell MC is of a 1T1C type, for example, similarly as in FIG. 9, so description thereof will be omitted.

The bit line control circuit LSA includes nine NMOS transistors Q1, Q2, Q3, Q4, Q5, Q6, Q11a, Q12 and Q13. These NMOS transistors correspond to the NMOS transistors Q1R, Q2, Q3, Q4R, Q5, Q6R, Q11, Q12 and Q13, respectively, in FIG. 17. Here, FIG. 17 shows the circuit configuration in which local bit lines LBL on both sides are assumed, and in contrast, FIG. 38 shows a circuit configuration in which only a local bit line LBL on one side is assumed, for the simplicity of the description. Thus, FIG. 38 does not show NMOS transistors corresponding to the NMOS transistors Q1L, Q4L and Q6L of FIG. 17.

Among the NMOS transistors in FIG. 38, the NMOS transistors Q1, Q2, Q3, Q4, Q5, Q6, Q12 and Q13 have the same connection configuration and are supplied with the same potentials as those in FIG. 17, so description thereof will be omitted. Although the NMOS transistor Q11 in FIG. 38 has the same connection configuration as the NMOS transistor Q11a in FIG. 17, its gate voltage is controlled in a different manner. That is, the NMOS transistor Q11a controls an electrical connection between the nodes Ns and NF in response to a refresh setting signal RFS2. In FIG. 38, the refresh setting signal RFS2 is controlled by three levels including the voltage VPP, the voltage VLS and the ground potential VSS (for example, a potential relation of VPP>VLS>VSS), a specific control thereof will be described later.

Figure 39:
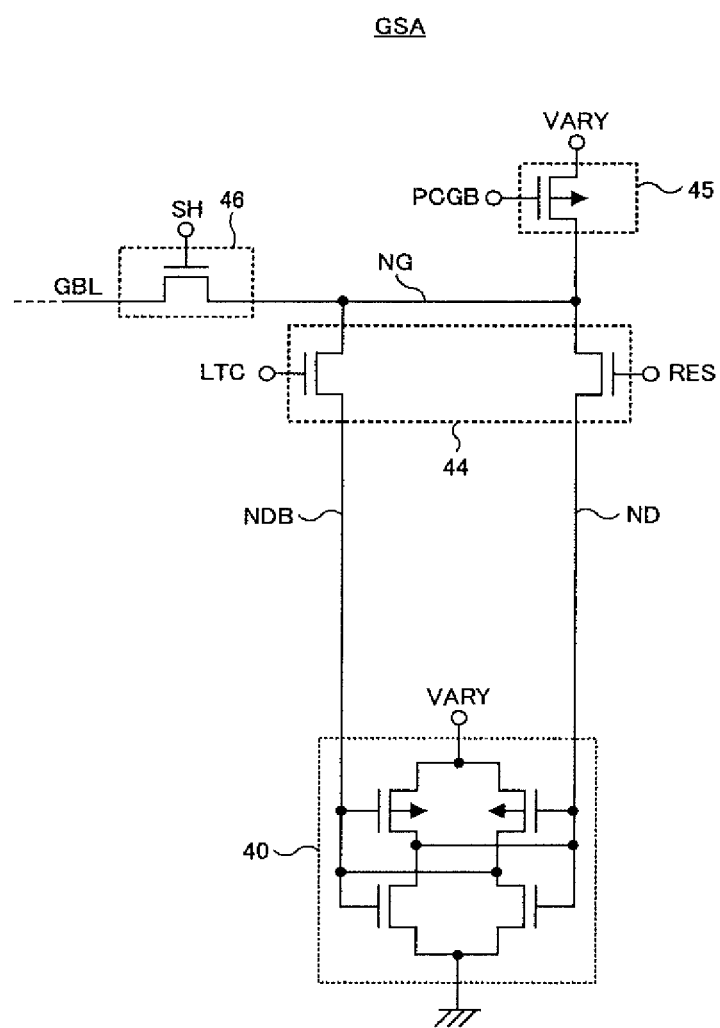
FIG. 39 is a diagram showing a circuit configuration example of the global sense amplifier GSA of FIG. 38.

FIG. 39 shows an example of a circuit configuration of the global sense amplifier GSA of FIG. 38. As shown in FIG. 39, the global sense amplifier GSA includes a cross-coupled amplifier 40, a data latch (write control) switch 44, a precharge circuit 45, a GBL select circuit 46. The global sense amplifier GSA of FIG. 39 has a basic circuit configuration common to the global sense amplifier GSA shown in FIG. 5. Here, FIG. 39 does not show the I/O switch 41, the I/O pull-down circuit 42, the write switch 43, and the pair of local I/O lines RLIOB and WLIOB in FIG. 5, for the simplicity of the description. Further, in FIG. 38, since only the global bit line GBL on one side is assumed, the GBL select circuit 46 includes only one NMOS transistor controlling an electrical connection between the global bit line GBL and the node NG in response to a GBL select signal SH. The configuration and operation of respective parts of the global sense amplifier GSA of FIG. 39 are the same as those of FIG. 5, so description thereof will be omitted.

Figure 40:
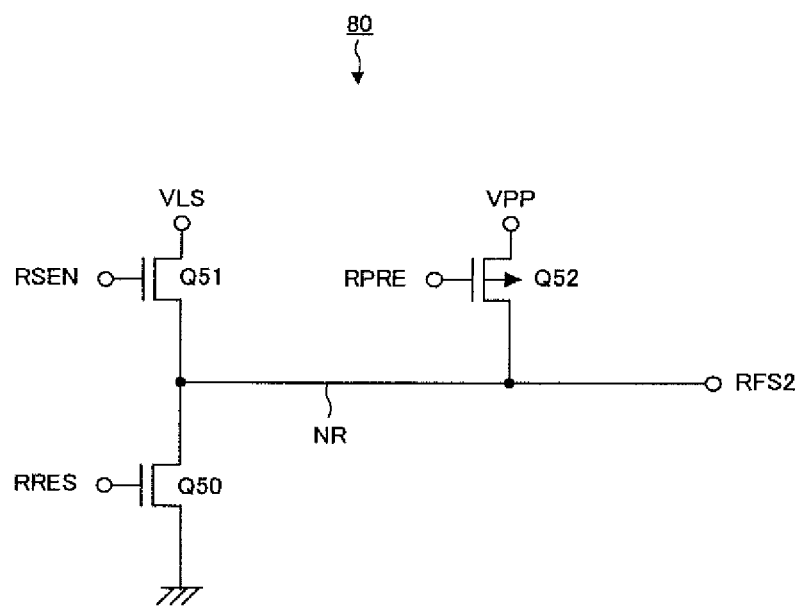
FIG. 40 is a diagram showing a configuration example of a refresh setting signal generating circuit 80 that generates a refresh setting signal RFS of FIG. 38.

Next, FIG. 40 shows a configuration example of a refresh setting signal generating circuit 80 that generates the refresh setting signal RFS. As shown in FIG. 40, the refresh setting signal generating circuit 80 includes two NMOS transistors Q50, Q51 and one PMOS transistor Q52. The two the NMOS transistors Q50 and Q51 are connected in series between the voltage VLS and the ground potential VSS, and the refresh setting signal RFS2 is outputted from a node NR therebetween. Further, one PMOS transistor Q52 is connected between the voltage VPP and the node NR. A control signal RRES controlling a later-mentioned restoring operation is applied to a gate of the NMOS transistor Q50. A control signal RSEN controlled in response to the ACT command or the REF command is applied to a gate of the NMOS transistor Q51. A control signal RPRE controlling precharging of the node NR is applied to a gate of the PMOS transistor Q52. Specific controls of the control signals RRES, RSEN and RPRE will be described below.

Figure 41:
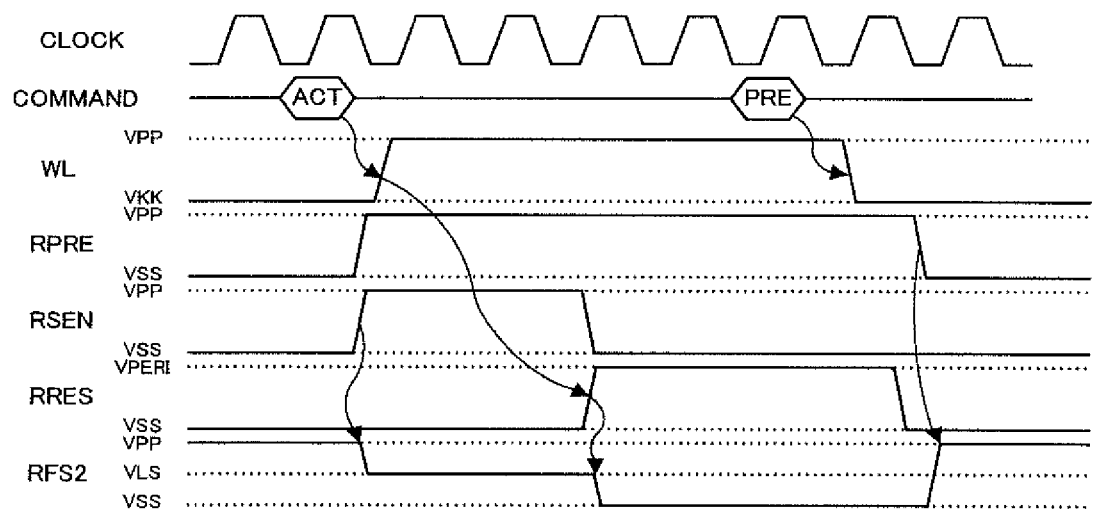
FIG. 41 is a diagram showing operation waveforms of the refresh setting signal generating circuit 80 of FIG. 40.

FIG. 41 shows operation waveforms of the refresh setting signal generating circuit 80 of FIG. 40. As shown in FIG. 41, in the standby state before driving the word line WL, all the three control signals RRES, RSEN and RPRE of the refresh setting signal generating circuit 80 are maintained at the ground potential VSS. Thus, the refresh setting signal RFS2 of the node NR is continuously precharged to the voltage VPP via the PMOS transistor Q52 of FIG. 40.

When receiving the ACT command, since both the control signals RPRE and RSEN are set to the voltage VPP, the precharging of the node NR is cancelled, and the refresh setting signal RFS2 drops to the voltage VLS via the NMOS transistor Q51. At this point, the word line WL is driven from the voltage VKK to the voltage VPP. In addition, the same operation is performed when receiving the REF command instead of the ACT command.

Thereafter, when performing the restoring operation for the memory cell MC using the bit line control circuit LSA, the control signal RSEN is set to the ground potential VSS, and subsequently the control signal RRES is set to the voltage VPERI. Therefore, the refresh setting signal RFS2 further drops to the ground potential VSS via the NMOS transistor Q50. Thereafter, when receiving the PRE command, both the control signals RPRE and RRES are set to the ground potential VSS after the word line WL returns to the voltage VKK, and thus the refresh setting signal RFS2 of the node NR is precharged to the voltage VPP again.

Figure 42:
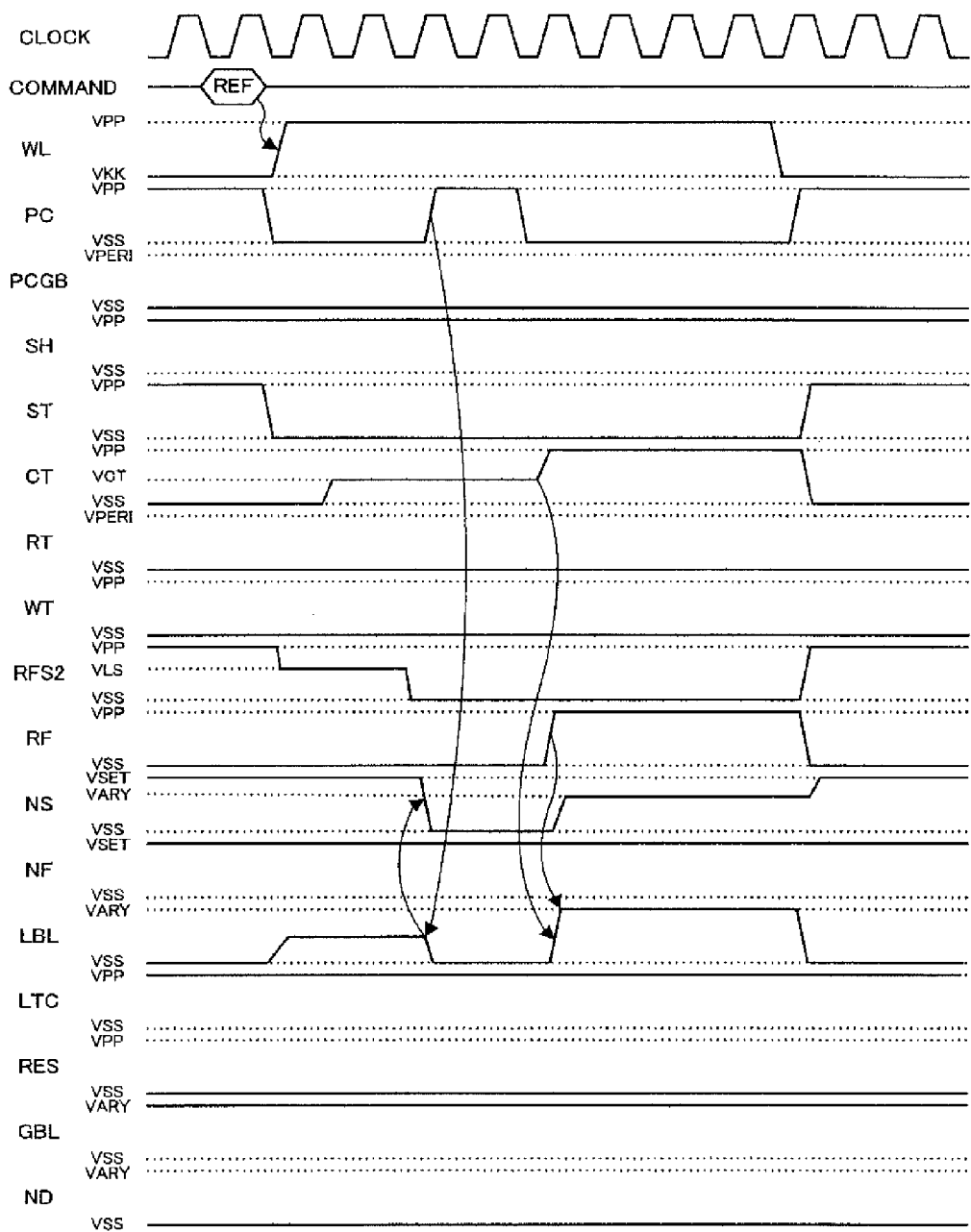
FIG. 42 is a diagram showing operation waveforms in a sensing/restoring operation performed by the bit line control circuit LSA of FIG. 38 in response to a REF command when sensing/restoring high-level data stored in the memory cell MC.
Figure 43:
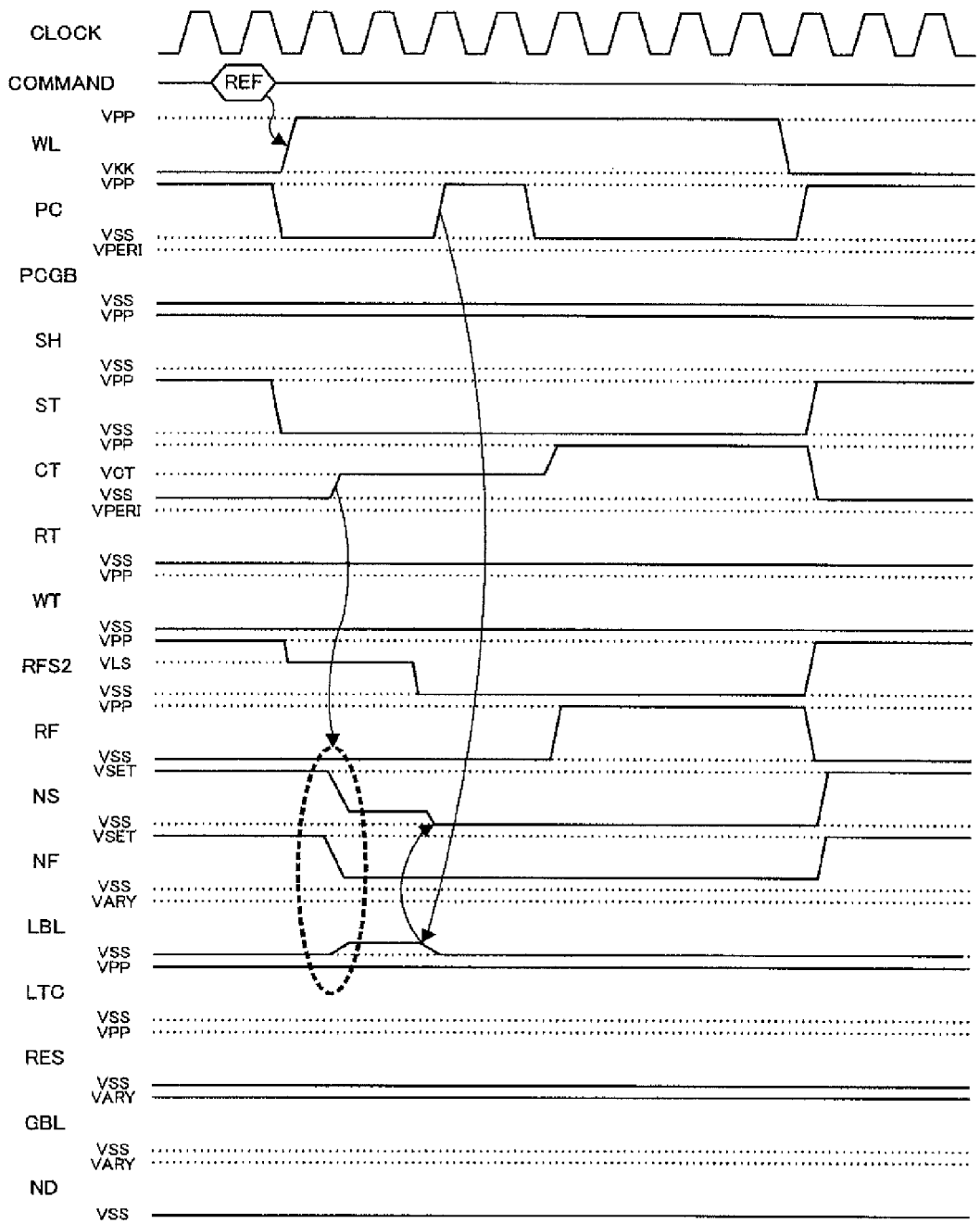
FIG. 43 is a diagram showing operation waveforms in a sensing/restoring operation performed by the bit line control circuit LSA of FIG. 38 in response to the REF command when sensing/restoring low-level data stored in the memory cell MC.

Next, sensing/restoring operation of the configuration of FIG. 38 will be described with reference to FIGS. 42 to 45. FIGS. 42 and 43 show operation waveforms in the sensing/restoring operation performed by the bit line control circuit LSA of FIG. 38 in response to the REF command. FIG. 42 shows operation waveforms when sensing/restoring high-level data stored in the memory cell MC, and FIG. 43 shows operation waveforms when sensing/restoring low-level data stored in the memory cell MC. Most of the operation waveforms shown in FIGS. 42 and 43 are common to those in the refresh operation shown in FIGS. 18 and 19, so description thereof will be arbitrarily omitted. In FIGS. 42 to 45, some symbols such as signal names are modified in expression (suffix R, L) and in sequence. As shown in FIG. 42, in the standby state of an initial period of the sensing/restoring operation of the high-level data, the potential relation being the same as in FIG. 18 is set. The potentials at this point satisfy a relation as follows:

$$VPP > VSET > VPERI > VARY > VCT > VSS(=0V) > VKK$$

Here, although the voltage VLS is assumed to be at the same potential as the voltage VPERI, in practice the voltage VLS can be set to a predetermined voltage value within a range in which the voltage value does not exceed the voltage VPP based on design parameters. Then, after receiving the REF command, the refresh setting signal RFS2 drops from the voltage VPP to the voltage VLS, as described in FIG. 41. From this point forward, operation waveforms during a period in which the refresh setting signal RFS2 is maintained at the voltage VLS are the same as those in FIG. 18.

Next, as described in FIG. 41, the refresh setting signal RFS2 further drops from the voltage VLS to the ground potential VSS. From this point forward, operation waveforms during a period in which the refresh setting signal RFS2 is maintained at the ground potential VSS are also the same as those in FIG. 18. Thereby, the high-level data is restored into the memory cell MC through the node NS and the local bit line LBL. Thereafter, as described in FIG. 41, the refresh setting signal RFS2 is returned to the voltage VPP, the precharge operation is performed in the same manner as in FIG. 18, and the refresh operation of FIG. 42 is completed.

Meanwhile, as shown in FIG. 43, in the standby state of the initial period of the sensing/restoring operation of the low-level data, the control is performed in the same manner as in FIG. 19. Then, after receiving the REF command, the refresh setting signal RFS2 drops from the voltage VPP to the voltage VLS similarly as in FIG. 42. From this point forward, operation waveforms during a period in which the refresh setting signal RFS2 is maintained at the voltage VLS are the same as those in FIG. 19.

Next, the refresh setting signal RFS2 further drops from the voltage VLS to the ground potential VSS in the same manner as in FIG. 42. From this point forward, operation waveforms during a period in which the refresh setting signal RFS2 is maintained at the ground potential VSS are also the same as those in FIG. 19. Thereby, the low-level data is restored into the memory cell MC through the node NS and the local bit line LBL. Thereafter, as described in FIG. 42, the refresh setting signal RFS2 is returned to the voltage VPP, the precharge operation is performed in the same manner as in FIG. 19, and the operation of FIG. 43 is completed.

Figure 44:
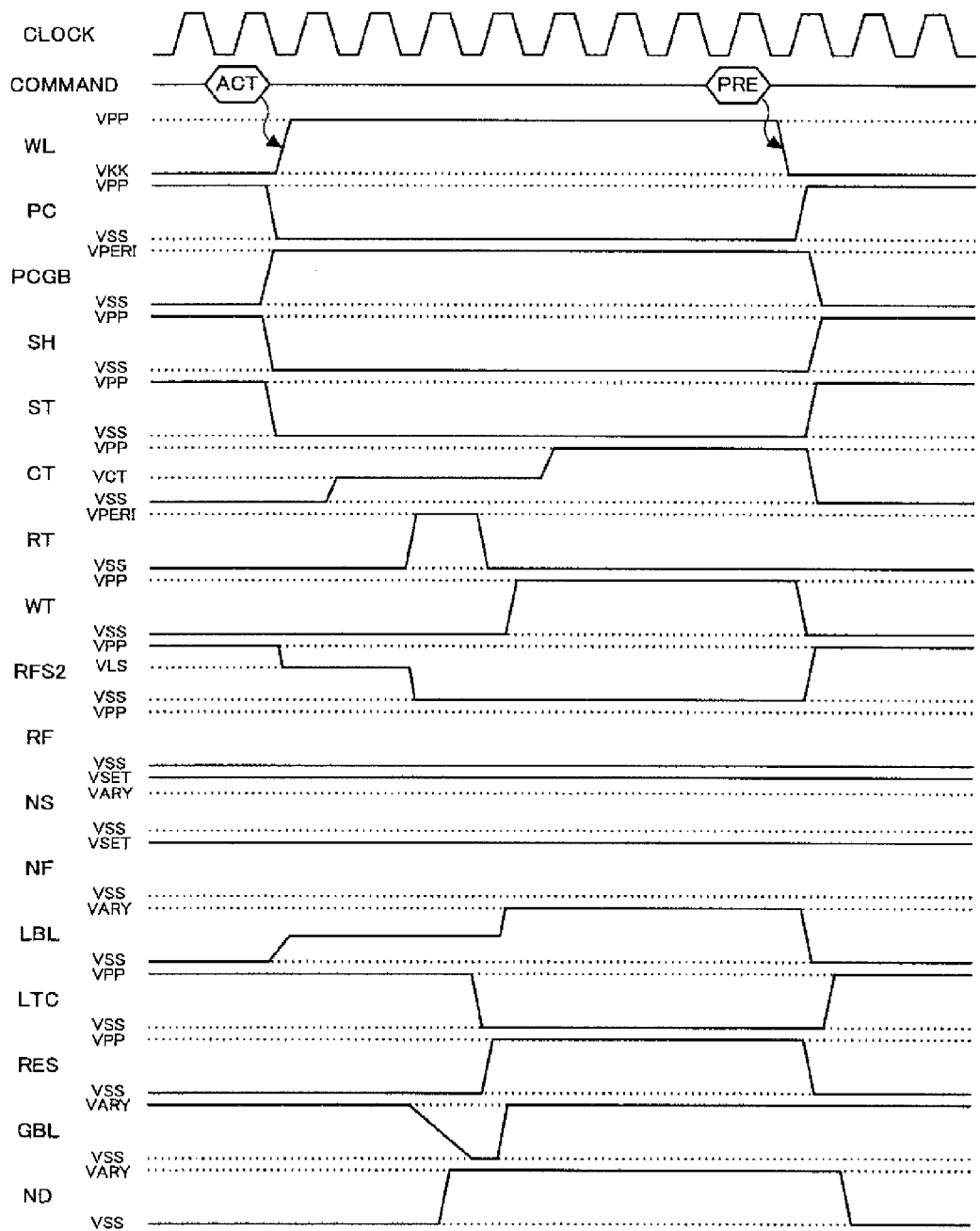
FIG. 44 is a diagram showing operation waveforms in a sensing/restoring operation performed by the global sense amplifier GSA of FIG. 38 in response to an ACT command when sensing/restoring high-level data stored in the memory cell MC.
Figure 45:
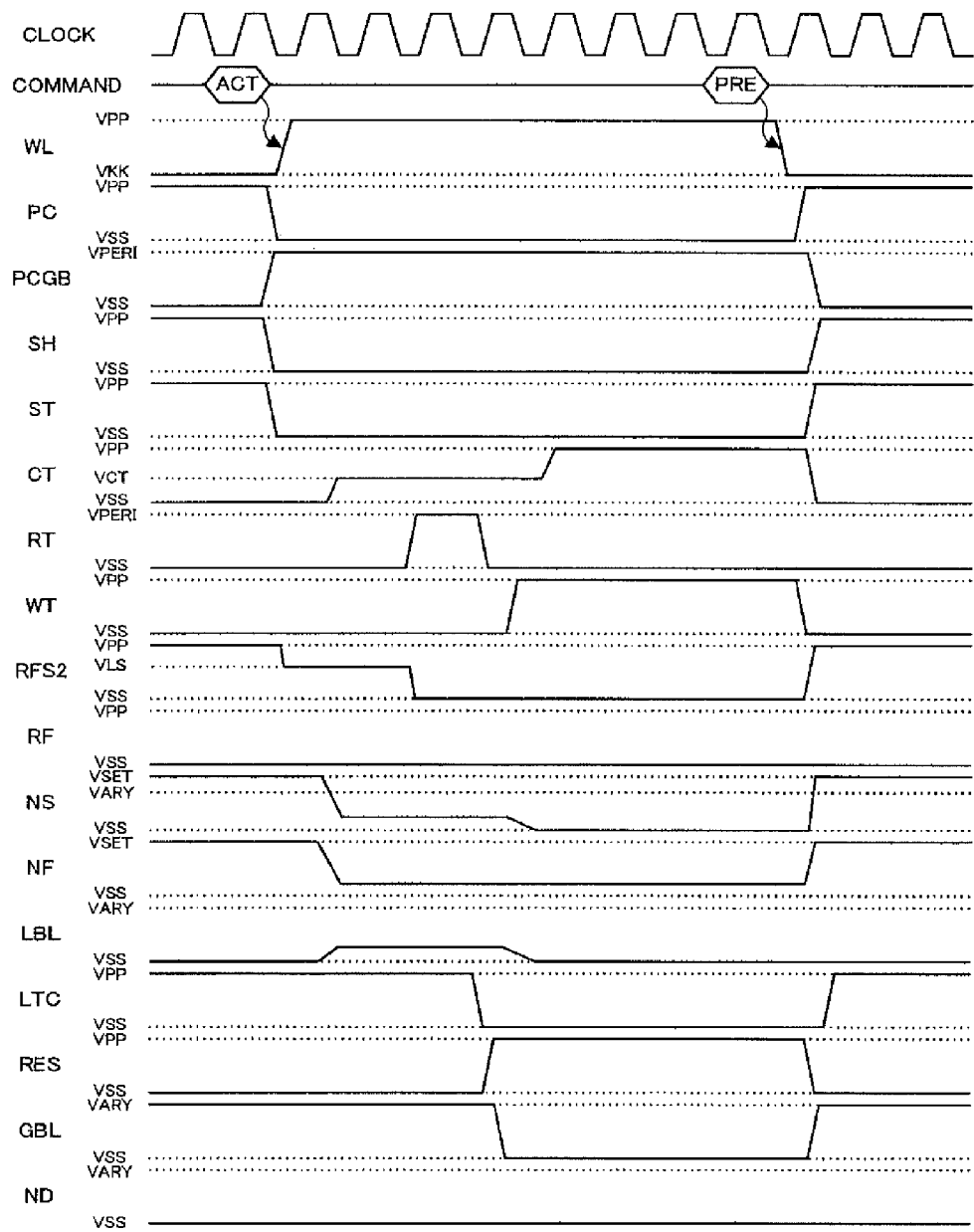
FIG. 45 is a diagram showing operation waveforms in a sensing/restoring operation performed by the global sense amplifier GSA of FIG. 38 in response to the ACT command when sensing/restoring low-level data stored in the memory cell MC.

Further, FIGS. 44 and 45 show operation waveforms in the sensing/restoring operation performed by the global sense amplifier GSA of FIG. 38 in response to the ACT command. FIG. 44 shows operation waveforms when sensing/restoring high-level data stored in the memory cell MC, and FIG. 45 shows operation waveforms when sensing/restoring low-level data stored in the memory cell MC. Most of the operation waveforms shown in FIGS. 44 and 45 other than some portions are common to those in the refresh operation shown in FIGS. 42 and 43, so description thereof will be arbitrarily omitted. Also, operation waveforms of FIGS. 44 and 45 are also common to those in the read operation of FIGS. 10 and 11 with respect to using the ACT command and partial changes in the operation waveforms.

As shown in FIG. 44, in the standby state of the initial period in the sensing/restoring operation of the high-level data, the potential relation being the same as in FIG. 42 is set first. Then, after receiving the ACT command, the refresh setting signal RFS2 drops from the voltage VPP to the voltage VLS, as described above, and thereafter further drops to the ground potential VSS. Meanwhile, after driving the word line WL, the potential of the local bit line LBL rises to a predetermined potential due to the same mechanism as in FIG. 10, and thereafter when the transfer control signal CT is driven to the voltage VCT, the potential of the node NS continues to be maintained at the potential VSET.

Subsequently, the read signal RT, the latch signal LTC, the potential of the global bit line GBL, and potential of the nodes NS and ND change due to the same mechanism as in FIG. 10, respectively. As a result, the high-level data read out from the memory cell MC can be latched in the cross-coupled amplifier 40 of the global sense amplifier GSA, thereby restoring the high-level data into the memory cell MC. Thereafter, the refresh setting signal RFS2 returns to the voltage VPP so that the precharge operation is performed similarly as in FIG. 42, and the operation of FIG. 44 is completed.

Meanwhile, as shown in FIG. 45, in the standby state of the initial period in the sensing/restoring operation of the low-level data, the potential relation being the same as in FIG. 43 is set. Then, after receiving the ACT command, the refresh setting signal RFS2 drops from the voltage VPP to the voltage VLS, and thereafter further drops to the ground potential VSS. Meanwhile, after driving the word line WL, the potential of the local bit line LBL rises to a potential slightly higher than the ground potential VSS due to the same mechanism as in FIG. 11, and thereafter the potential of the node NS drops from the potential VSET to near the ground potential VSS.

Subsequently, the read signal RT, the latch signal LTC, the potential of the global bit line GBL, and potential of the nodes NS and ND change due to the same mechanism as in FIG. 11, respectively. As a result, the low-level data read out from the memory cell MC can be latched in the cross-coupled amplifier 40 of the global sense amplifier GSA, thereby restoring the low-level data into the memory cell MC. Thereafter, the refresh setting signal RFS2 returns to the voltage VPP so that the precharge operation is performed again similarly as in FIG. 43, and the operation of FIG. 45 is completed.

In the above configuration, when the restoring operation is performed using the bit line control circuit LSA, it is determined whether the high-level data is to be restored into the memory cell MC or the low-level data continues to be stored in the memory cell MC, in accordance with a conductive state of the NMOS transistor Q13 of FIG. 38. The conductive state of the NMOS transistor Q13 depends on the potential of the node NF, and the potential of the node NF depends on a conductive state of the NMOS transistor Q11$a$. That is, the NMOS transistor Q11$a$ is turned on or off in accordance with a relation between the potential of the node NS changing depending on the data of the memory cell MC and the voltage VLS as a gate voltage of the NMOS transistor Q11$a$, thereby determining the potential of the node NF.

For example, it is assumed that the threshold voltage of the NMOS transistor Q11$a$ is 0.2V and the potential VSET is 1.5V. In this case, if the voltage VLS is set to 1.5V, the NMOS transistor Q11$a$ turns off when the potential of the node NS determined depending on the data stored in the memory cell MC is higher than 1.3V. Thus, since the node NF is maintained at the potential VSET, the restoring operation for the high-level data can be performed. Meanwhile, the NMOS transistor Q11$a$ turns on when the potential of the node NS is lower than 1.3V, and therefore electric charge of the node NF is extracted through the NMOS transistor Q11$a$. At this point, when the potential of the node NF becomes lower than the threshold voltage of the NMOS transistor Q13, the NMOS transistor Q13 turns off so as to be brought into a state where the memory cell MC stores the low-level data. On the other hand, if the voltage VLS is set to 1.0V, the NMOS transistor Q11$a$ turns off when the potential of the node NS is higher than 0.8V. Thus, since the node NF is maintained at the potential VSET, the restoring operation for the high-level data can be performed. Meanwhile, the NMOS transistor Q11$a$ turns on when the potential of the node NS is lower than 0.8V, and therefore the electric charge of the node NF is extracted through the NMOS transistor Q11$a$. At this point, when the potential of the node NF becomes lower than the threshold voltage of the NMOS transistor Q13, the NMOS transistor Q13 turns off so as to be brought into a state where the memory cell MC stores the low-level data.

In other words, when the voltage VLS is set to a high voltage value, operating margin in the sensing/restoring operation of the high-level data decreases while operating margin in the sensing/restoring operation of the low-level data increases. Further, when the voltage VLS is set to a low voltage value, the operating margin in the sensing/restoring operation of the high-level data increases while the operating margin in the sensing/restoring operation of the low-level data decreases. Furthermore, since the voltage VLS is used only in the bit line control circuit LSA, only the operating margin in the restoring operation performed in the bit line control circuit LSA can be changed depending on the voltage value of the voltage VLS. As a result, it is possible to change a ratio of respective operating margins for the high-level and low-level data.

Figure 46:
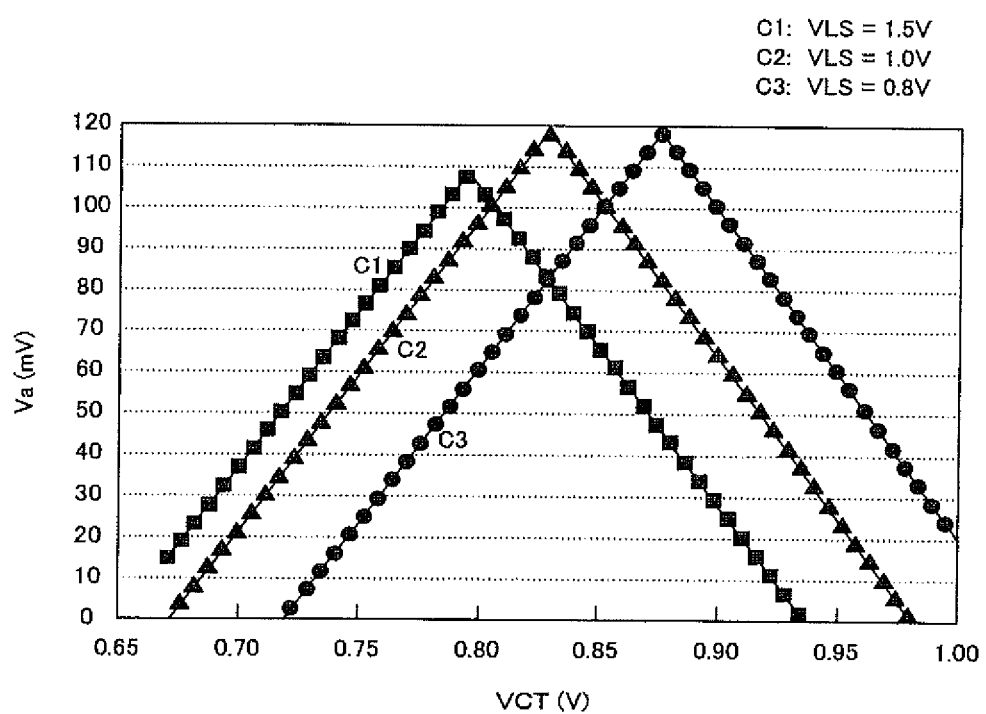
FIG. 46 is a graph concerning the restoring operation by the bit line control circuit LSA, which shows a dependence of a permissible value Va of random variation of a threshold voltage of an NMOS transistor relative to a voltage VCT.

FIG. 46 is a graph concerning the restoring operation by the bit line control circuit LSA, which shows a dependence of a permissible value Va of random variation of the threshold voltage of the NMOS transistor (hereinafter, referred to simply as "permissible value Va") relative to the voltage VCT. Here, the voltage VCT is a design parameter common to both the bit line control circuit LSA and the global sense amplifier GSA since the voltage VCT is commonly driven for the respective transfer control signals CF of FIGS. 42 to 45. The permissible value Va along a vertical axis in FIG. 46 represents a voltage value permitted when threshold voltages of the NMOS transistors Q1 and Q13 randomly vary in a direction in which it becomes increasingly difficult to perform the restoring operation of the high-level and low-level data. That is, the permissible value Va is equivalent to the operating margin of the restoring operation, and the higher the permissible value Va becomes, the larger the operating margin becomes.

In FIG. 46, voltage conditions are assumed in which the voltage VLS is set to three voltage values of 1.5V, 1.0V and 0.8V, and FIG. 46 shows three characteristics overlapping one another corresponding to the above voltage conditions, including a characteristic C1 (VLS=1.5V), a characteristic C2 (VLS=1.0V), and a characteristic C3 (VLS=0.8V). Each of the three characteristics C1, C2 and C3 has a left part in which the permissible value Va transitions upward and a right part in which the permissible value Va transitions downward, and has a peak near the center. In this case, the characteristic of the left part in which the voltage VCT is low depends on the restoring operation of the low-level data, and the characteristic of the right part in which the voltage VCT is high depends on the restoring operation of the high-level data.

For example, assuming a position of VCT=0.75V of a left area along a horizontal axis, the permissible value Va decreases when decreasing the voltage VLS. That is, the permissible value Va becomes smaller in order of the characteristics C1, C2 and C3 in the condition of VCT=0.75V. This means that when decreasing the voltage VLS, the operating margin for restoring the low-level data decreases. Further, assuming a position of VCT=0.9V of a right area along the horizontal axis, the permissible value Va increases when decreasing the voltage VLS. That is, the permissible value Va becomes larger in order of the characteristics C1, C2 and C3 in the condition of VCT=0.9V. This means that when decreasing the voltage VLS, the operating margin for restoring the high-level data increases. Accordingly, by appropriately controlling the voltage VLS, it is possible to change operating margins of the high-level and low-level data.

Figure 47:
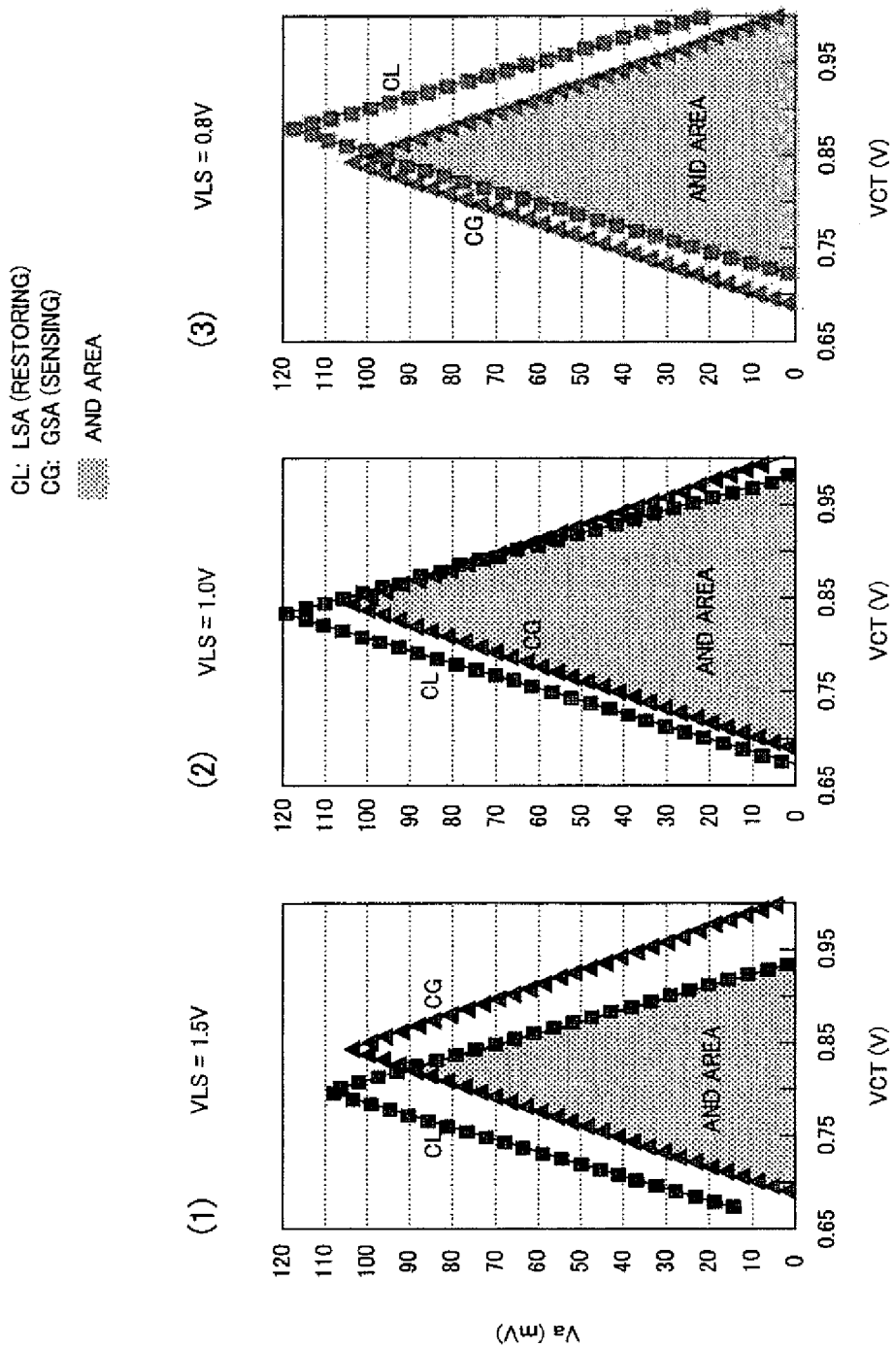
FIG. 47 is graphs concerning the restoring operation by the bit line control circuit LSA, which shows dependences of the permissible values Va for the bit line control circuit LSA and the global sense amplifier GSA relative to the voltage VCT corresponding to three settings of the voltage VLS.

FIG. 47 is graphs showing dependences of the permissible values Va for the bit line control circuit LSA and the global sense amplifier GSA relative to the voltage VCT corresponding to the three settings of the voltage VLS. In FIG. 47, a graph(1) shows a transition of the permissible value Va when VLS=1.5V, a graph(2) shows a transition of the permissible value Va when VLS=1.0V, and a graph(3) shows a transition of the permissible value Va when VLS=0.8V. Further, in each of the graphs of FIG. 47, two kinds of characteristics CL and CG are shown, overlapping each other. The characteristic CL corresponds to the permissible value Va in the restoring operation using the bit line control circuit LSA, and the characteristic CG corresponds to the permissible value Va in the sensing operation using the global sense amplifier GSA.

The characteristic CL corresponding to the bit line control circuit LSA matches the characteristics C1, C2 and C3 corresponding to the three conditions of the voltage VLS shown in FIG. 46, and the characteristics C1, C2 and C3 correspond, in this order, to the characteristics CL of the graph(1), graph(2) and graph(3) in FIG. 47. Meanwhile, the three graphs shown in FIG. 47 have the same characteristic CG corresponding to the global sense amplifier GSA, in which the permissible value Va does not change depending on the voltage VLS. This is because that the voltage VLS is not used in the global sense amplifier GSA.

Each graph in FIG. 47 shows an overlapped area between a range permitted by the characteristic CL and a range permitted by the characteristic CG (hereinafter, referred to as "AND area"). This AND area means the operating margin for the voltage VCT when driving the transfer control voltage VCT in the hierarchal memory cell array including the bit line control circuit LSA and the global sense amplifier GSA. As shown in FIG. 47, the AND area changes depending on the voltage VLS, and, for example, it can be found that the AND area corresponding to VLS=1.0V in the graph(2) is the largest one. In this manner, by appropriately setting the voltage value of the voltage VLS, the AND area can be maximized so as to enlarge the operating margin.

As described above, according to the semiconductor device described using FIGS. 38 to 47, a memory cell array is configured using two types of sense amplifiers capable of the sensing operation and the restoring operation, and it is possible to maximize the AND area of operating margins of the respective sense amplifiers by setting the voltage VLS to an optimum voltage for design parameters such as various voltages commonly used in the respective sense amplifier. By enlarging the operating margin in this manner, it is possible to achieve operations of the sense amplifiers capable of suppressing affection of variation in the design parameters such as the voltage VCT and improving noise immunity. Further, it is possible to obtain effects of improving tolerance for the random variation of threshold voltages of MOS transistors, improving manufacturing yield, and reducing manufacturing cost.

Various modifications can be applied to the configuration and operation disclosed in FIGS. 38 to 47. One of the various modifications will be described below. In the modification, the configuration of the global sense amplifier GSA of FIG. 39 is modified, and correspondingly the characteristics in FIGS. 46 and 47 are modified. Thus, FIG. 38 and FIGS. 40 to 45 are common to the modification, so description thereof will be omitted.

Figure 48:
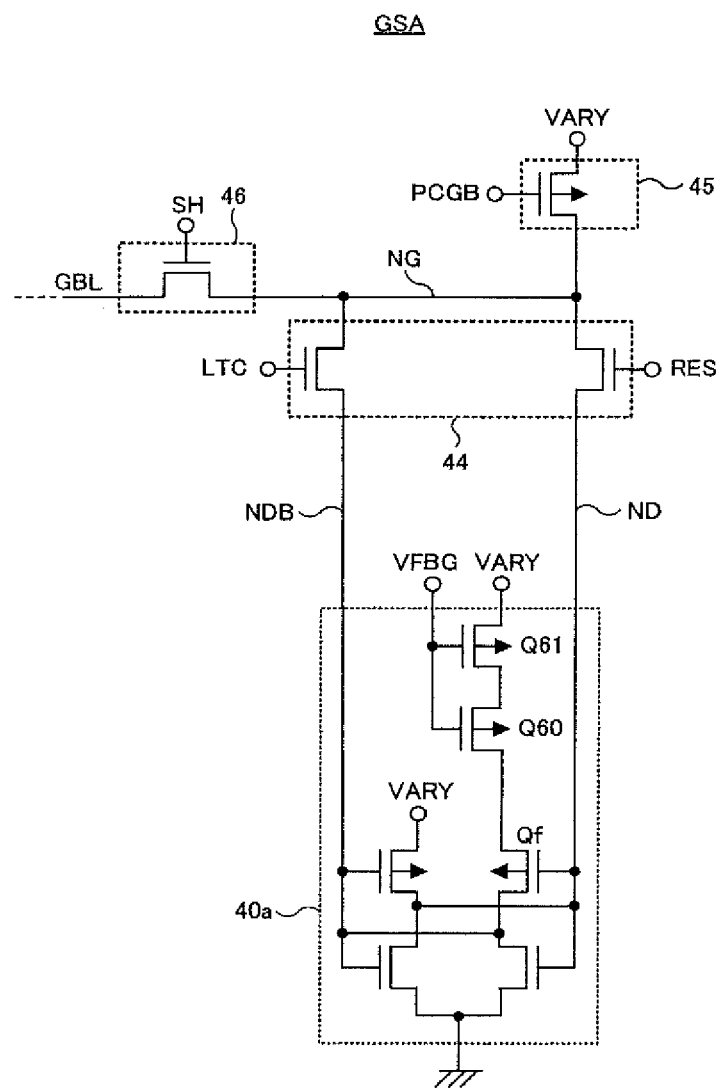
FIG. 48 is a diagram showing an example of a circuit configuration of the global sense amplifier GSA in a modification of FIG. 38.

FIG. 48 shows an example of a circuit configuration of the global sense amplifier GSA in the modification. Although the basic configuration of the global sense amplifier GSA shown in FIG. 48 is common to that in FIG. 39, additionally a cross-coupled amplifier 40a obtained by modifying the cross-coupled amplifier 40 is provided therein. That is, in the global sense amplifier GSA of FIG. 48, there is provided a current control circuit including two PMOS transistors Q60 and Q61 connected in series between a PMOS transistor Qf on the feed-back side (side of the node ND) of the cross-coupled amplifier 40a and the array voltage VARY. A voltage VFBG is applied to gates of the two PMOS transistors Q60 and Q61. Then, setting the voltage VFBG allows a current flowing through the PMOS transistor Qf to vary in the sensing operation of the global sense amplifier GSA. Thereby, it is possible to freely control the speed of extracting electric charge of the global bit line GBL and the node NDB in the sensing operation of the high-level data in the global sense amplifier GSA. Further, it is possible to control the ability to maintain the array voltage VARY at the global bit line GBL and the node NDB in the sensing operation of the low-level data.

For example, when the voltage VFBG is set to a voltage value higher than 0V that is capable of turning on the PMOS transistors Q60 and Q61, the current flowing through the PMOS transistor Qf can be suppressed. Thus, it is possible to increase the speed of extracting electric charge of the global bit line GBL and the node NDB, thereby facilitating the sensing operation of the high-level data. Meanwhile, since the ability to maintain the array voltage VARY at the global bit line GBL and the node NDB is reduced, the sensing operation of the low-level data becomes more difficult.

Further, when the voltage VFBG is set to a voltage value lower than 0V, the current flowing through the PMOS transistor Qf increases, compared to the voltage higher than 0V. Thus, the speed of extracting electric charge of the global bit line GBL and the node NDB is decreased, and thereby the sensing operation of the high-level data becomes more difficult. Meanwhile, since the ability to maintain the array voltage VARY at the global bit line GBL and the node NDB is increased, it is possible to facilitate the sensing operation of the low-level data.

Since the voltage VFBG is used only in the global sense amplifier GSA, only the operating margin in the sensing/restoring operation performed in the global sense amplifier GSA can be changed depending on the setting of the voltage value of the voltage VFBG. Therefore, it is possible to change a ratio of operating margins of the high-level and low-level data.

Figure 49:
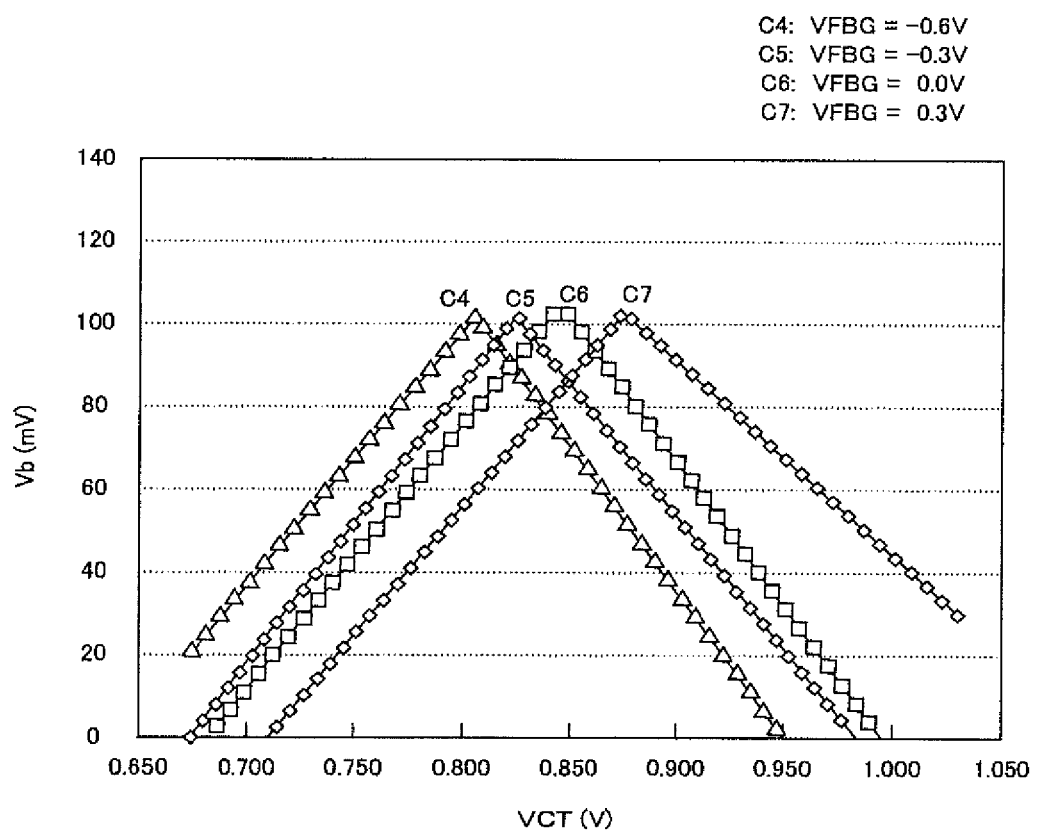
FIG. 49 is a graph showing a dependence of a permissible value Vb relative to the voltage VCT similarly as in FIG. 46 in the modification in FIG. 48.

FIG. 49 is a graph concerning the sensing operation by the global sense amplifier GSA, which shows a dependence of a permissible value Vb of random variation of the threshold voltage of the NMOS transistor (hereinafter, referred to simply as "permissible value Vb") relative to the voltage VCT. The meaning of the permissible value Vb in FIG. 49 is the same as the permissible value Va in FIG. 46, and the higher the permissible value Vb becomes, the larger the operating margin in the sensing operation becomes.

In FIG. 49, voltage conditions are assumed in which the voltage VFBG is set to four voltage values of −0.6V, −0.3V, 0V and 0.3V, and FIG. 49 shows four characteristics overlapping one another corresponding to the above voltage conditions, including a characteristic C4 (VFBG=−0.6V), a characteristic C5 (VFBG=−0.3V), a characteristic C6 (VFBG=0V), and a characteristic C7 (VFBG=0.3V). In the four characteristics C4 to C7, meanings of parts in which the permissible value Vb transitions upward/downward are the same as in FIG. 46.

For example, assuming the position of VCT=0.75V of the left area along the horizontal axis, the permissible value Vb increases when decreasing the voltage VFBG, while assuming the position of VCT=0.9V of the right area along the horizontal axis, the permissible value Vb decreases when decreasing the voltage VFBG. This trend is similar to that in FIG. 46, which means that in the condition of VCT=0.75V, the operating margin for sensing the low-level data increases when decreasing the voltage VFBG, and in the condition of VCT=0.9V, the operating margin for sensing the high-level data decreases when decreasing the voltage VFBG Accordingly, by appropriately controlling the voltage VFBG, it is possible to change operating margins of the high-level and low-level data.

Figure 50:
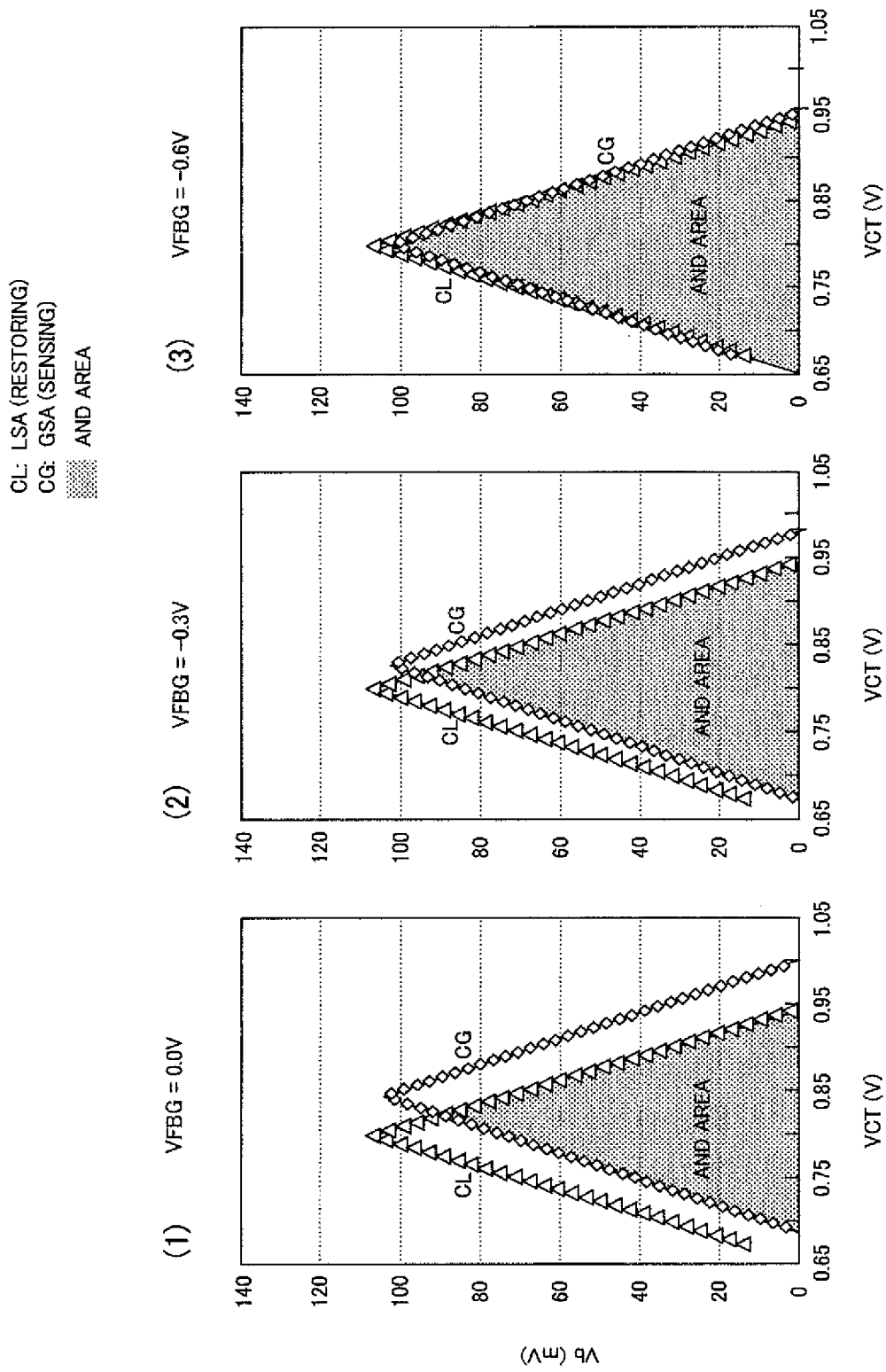
FIG. 50 is graphs showing dependences of the permissible values Vb or the bit line control circuit LSA and the global sense amplifier GSA relative to the voltage VCT corresponding to three settings of a voltage VFBG in the modification in FIG. 48.

FIG. 50 is graphs showing dependences of the permissible values Vb for the bit line control circuit LSA and the global sense amplifier GSA relative to the voltage VCT corresponding to three settings of the voltage VFBG including 0V, −0.3V and −0.6V. In FIG. 50, a graph(1) shows a transition of the permissible value Vb when VFBG=0V, a graph(2) shows a transition of the permissible value Vb when VFBG=−0.3V, and a graph(3) shows a transition of the permissible value Vb when VFBG=−0.6V. Further, in each of the graphs of FIG. 50, the two kinds of characteristics CL and CG corresponding to the bit line control circuit LSA and the global sense amplifier GSA are shown, overlapping each other, in the same manner as in FIG. 47.

In FIG. 50, contrary to FIG. 47, the characteristic CL corresponding to the bit line control circuit LSA does not change in the respective graphs, and the characteristic CG corresponding to the global sense amplifier GSA changes in the respective graphs. As a result, the above-mentioned AND area changes depending on the voltage VFBG and, for example, it can be found that the AND area corresponding to VFBG=−0.6V in the graph(3) is the largest one. In this manner, by appropriately setting the voltage value of the voltage VFBG the AND area can be maximized so as to enlarge the operating margin.

In the foregoing, the preferred embodiments have been described. However, the invention is not limited to the above embodiments and can variously be modified without departing the essentials of the invention. The invention can be applied to a semiconductor device having a hierarchical bit line structure in relation to volatile memory cells. Further, various circuit configurations can be employed in circuits included in the semiconductor device of the invention without being limited to the circuit configurations disclosed in the embodiments.

The invention can be applied to various semiconductor devices such as CPU (Central Processing Unit), MCU (Micro Control Unit), DSP (Digital Signal Processor), ASIC (Application Specific Integrated Circuit), ASSP (Application Specific Standard Product) and the like. Further, the invention can be applied to various devices such as SOC (System on Chip), MCP (Multi Chip Package) and POP (Package on Package) and the like.

Further, transistors of the invention are field-effect transistors (FETs) including various transistors such as not only MOS (Metal Oxide Semiconductor) transistors but also MIS (Metal-Insulator Semiconductor) transistors, TFT (Thin Film Transistor) and the like. Further, the device of the invention may include bipolar transistors. Furthermore, an N-channel type transistor (NMOS transistors) is a typical example of a first conductive type transistor, and a P-channel type transistor (PMOS transistor) is a typical example of a second conductive type transistor. Note that, in the embodiments, if the first conductive type transistor is replaced with the second conductive type transistor, the potential relation thereof needs to be reversed in level.

The invention can be applied to devices based on various combinations or selections of the disclosure of the embodiments. That is, the invention covers various modifications which those skilled in the art can carry out in accordance with all disclosures including claims and technical ideas.

What is claimed is:

1. A device comprising:
a plurality of local bit lines;
at least one word line;
a plurality of memory cells each connected to an associated one of the local bit lines and the word line;
at least one global bit line;
a plurality of switch transistors, a selected one of the switch transistors being turned ON to form an electrical path between the global bit line and a selected one of the local bit lines;
a global sense amplifier coupled to the global bit line, the global sense amplifier being configured to receive, through the global bit line, data that is read out from the memory cell connected to the selected one of the local bit lines, and restore, through the global bit line, the data into the memory cell connected to the selected one of the local bit lines; and
a plurality of restoring circuits each provided for an associated one of the local bit lines, remaining one or ones of the restoring circuits other than the restoring circuit provided for the selected one of the local bit lines being configured to receive, through remaining one or ones of the local bit lines, data that is or are read out from the memory cell or cells connected to the remaining one or ones of the local bit lines, and restore, through the remaining one or ones of the local bit lines, the data into the memory cell or cells connected to the remaining one or ones of the local bit lines.

2. The device as claimed in claim 1, wherein the restoring circuit provided for the selected one of the local bit lines is deactivated while the global sense amplifier is restoring, through the global bit line, the data into the memory cell connected to the selected one of the local bit lines.

3. The device as claimed in claim 1, wherein the local bit lines are arranged in parallel to each other in a first direction, each of the local bit lines extending in a second direction crossing the first direction and the global bit line being disposed between adjacent ones of the local bit lines and extending in the second direction.

4. The device as claimed in claim 3, wherein the global bit line is longer than each of the local bit lines, the global sense amplifier is disposed at one end of the global bit line, and the restoring circuits are disposed at respective one ends of the local bit lines.

5. The device as claimed in claim 1, wherein each of the switch elements is connected between the global bit line and an associated one of the local bit lines.

6. The device as claimed in claim 5, wherein each of the restoring circuits comprises first and second transistors connected in series between an associated one of the local bit lines and a first power supply line, a third transistor connected between the associated one of the local bit lines and a second power line, a fourth transistor connected between the associated one of the local bit line and a circuit node, and a fifth transistor connected between the circuit node and a third power line, the second, third, fourth and fifth transistors being supplied at respective gate electrodes with first, second, third and fourth control signals, respectively, and the first transistor including a gate electrode that is connected to the circuit node.

7. A device comprising:
a plurality of local bit lines;
a plurality of local sense amplifiers each electrically coupled to an associated one of the local bit lines;
a plurality of word lines;
a plurality of memory cells each connected to a corresponding one of the word lines and a corresponding one of the local bit lines;
at least one global bit line;
a global sense amplifier electrically coupled to the global bit line; and
a control circuit configured to activate one of the word lines to select the memory cells that are connected to an activated one of the word lines, selected memory cells thereby outputting data stored therein onto the local bit lines, respectively, the control circuit being further configured to assign one of the local sense amplifiers to a designated local sense amplifier;

each of the local sense amplifiers being configured to sense the data outputted onto an associated one of the local bit lines from an associated one of the selected memory cells;

the designated local sense amplifier being further configured to convey the data to the global sense amplifier through the global bit line;

the global sense amplifier being configured in a data read mode to sense the data conveyed from the designated local sense amplifier and restore the data into one of the selected memory cells through the designated local sense amplifier; and remaining one or ones of the local sense amplifiers other than the designated local sense amplifier being further configured to restore the data into remaining one or ones of the selected memory cells that are connected to the local bit line or lines belonging to the remaining one or ones of the local sense amplifiers while being electrically disconnected from the global bit line.

8. The device as claimed in claim 7, wherein the global sense amplifier is configured in a data write mode to write a new data into the one of the selected memory cells through the designated local sense amplifier.

9. The device as claimed in claim 7, wherein the global sense amplifier is configured in a data refresh mode to be deactivated, and the designated local sense amplifier restores in the data refresh mode the data into the one of the selected memory cell electrically connected to the designated local sense amplifier.

10. The device as claimed in claim in claim 9, wherein each of the local sense amplifiers comprises:

a first transistor that forms, when activated, a first electrical path to convey data, that is stored in a selected one of the memory cells belonging to an associated one of the local bit lines, to the global bit line; and a second transistor that forms, when activated, a second electrical path between the global bit line and an associated one of the local bit lines.

11. The device as claimed in claim 10, wherein the first transistor in the designated local sense amplifier is rendered conductive and the first transistor in each of the remaining one or ones of the local sense amplifiers is rendered non-conductive; and wherein the second transistor in the designated local sense amplifier is rendered conductive and the second transistor in each of the remaining one or ones of the local sense amplifiers is rendered non-conductive.

12. The device as claimed in claim 10, wherein each of the local sense amplifiers further comprises a third transistor coupled between an associated one of the local bit lines and a first node and a fourth transistor coupled in series with the first transistor between the global bit line and a voltage line, the fourth transistor including a gate coupled to the first node, the second transistor being coupled between the global line and the associated one of the local bit lines.

13. The device as claimed in claim 12, wherein each of the local sense amplifiers further comprises a restoring circuit coupled to the first node.

14. The device as claimed in claim 13, wherein each of the local sense amplifiers further comprises a first precharge transistor coupled to an associated one of the local bit lines to precharge the associated one of the local bit lines to a first precharge level, and a second precharge transistor coupled to the first node to precharge the first node to a second precharge level that is different from the first precharge level.

15. The device as claimed in claim 7, wherein each of the local sense amplifiers comprises a switch element connected between the global bit line and an associated one of the local bit lines, first and second transistors connected in series between the associated one of the local bit lines and a first power supply line, a third transistor connected between the associated one of the local bit lines and a second power line, a fourth transistor connected between the associated one of the local bit line and a circuit node, and a fifth transistor connected between the circuit node and a third power line, the second, third, fourth and fifth transistors being supplied at respective gate electrodes with first, second, third and fourth control signals, respectively, and the first transistor including a gate electrode that is connected to the circuit node.

16. A device comprising:
a plurality of local bit lines;
a plurality of local sense amplifiers each electrically coupled to an associated one of the local bit lines, each of the local sense amplifier including a restoring circuit;
a plurality of word lines;
a plurality of memory cells each connected to a corresponding one of the word lines and a corresponding one of the local bit lines;
at least one global bit line; and
a global sense amplifier electrically coupled to the global bit line; and
a control circuit configured to, in a data read mode, designate one of the local sense amplifiers with deactivating the restoring circuit in the one of the local sense amplifiers and to allow the global sense amplifier to restore data into one of the memory cells belonging to the one of the local sense amplifiers, the control circuit being further configured to, in the data read mode, activate the restoring circuit in each of remaining ones of the local sense amplifiers so that one of the memory cells belonging to each of the remaining ones of the local sense amplifiers is restored with data by the remaining ones of the local sense amplifiers.

17. The device as claimed in claim 16, wherein the control circuit is further configured to, in a data refresh mode, activate the restoring circuit in each of the local sense amplifiers so that each of the memory cells being refreshed by an associated one of the local sense amplifiers with an electrical isolation from the global sense amplifier.

18. The device as claimed in claim 16, each of the local sense amplifiers comprises a switch element connected between the global bit line and an associated one of the local bit lines, and each of the restoring circuit included in each of the local sense amplifiers comprises first and second transistors connected in series between the associated one of the local bit lines and a first power supply line, a third transistor connected between the associated one of the local bit lines and a second power line, a fourth transistor connected between the associated one of the local bit line and a circuit node, and a fifth transistor connected between the circuit node and a third power line, the second, third, fourth and fifth transistors being supplied at respective gate electrodes with first, second, third and fourth control signals, respectively, and the first transistor including a gate electrode that is connected to the circuit node.

* * * * *